(12) United States Patent
Meyer et al.

(10) Patent No.: US 9,773,933 B2
(45) Date of Patent: Sep. 26, 2017

(54) SPACE AND ENERGY EFFICIENT PHOTOVOLTAIC ARRAY

(71) Applicant: TENKSOLAR, INC., Minneapolis, MN (US)

(72) Inventors: Dallas W. Meyer, Prior Lake, MN (US); Lowell J. Berg, Eden Prairie, MN (US); Kurt Korkowski, Carver, MN (US); Lance E. Stover, Eden Prairie, MN (US); Thomas L. Murnan, Bloomington, MN (US); Orville Dodd, Minneapolis, MN (US)

(73) Assignee: TENKSOLAR, INC., Minneapolis, MN (US)

( * ) Notice: Subject to any disclaimer, the term of this patent is extended or adjusted under 35 U.S.C. 154(b) by 192 days.

(21) Appl. No.: 13/957,227

(22) Filed: Aug. 1, 2013

(65) Prior Publication Data

US 2013/0312812 A1 Nov. 28, 2013

Related U.S. Application Data

(63) Continuation-in-part of application No. 13/207,164, filed on Aug. 10, 2011, now Pat. No. 8,829,330, and
(Continued)

(51) Int. Cl.
*H01L 31/00* (2006.01)
*H01L 31/042* (2014.01)
(Continued)

(52) U.S. Cl.
CPC ............ *H01L 31/0422* (2013.01); *F24J 2/16* (2013.01); *F24J 2/4636* (2013.01); *F24J 2/526* (2013.01);
(Continued)

(58) Field of Classification Search
CPC .... H02S 40/22; H02S 20/00; F24J 2/16; F24J 2/4636; F24J 2/5207; F24J 2/5209;
(Continued)

(56) References Cited

U.S. PATENT DOCUMENTS 3,094,439 A 6/1963 Mann et al.
3,350,234 A 10/1967 Ule
(Continued)

FOREIGN PATENT DOCUMENTS

CN 1388636 1/2003
CN 1628390 6/2005
(Continued)

OTHER PUBLICATIONS

Chinese Office Action in Chinese Application No. 201080017252.5, dated May 26, 2015, 7 pgs.
(Continued)

*Primary Examiner* — Matthew Martin
(74) *Attorney, Agent, or Firm* — Maschoff Brennan

(57) ABSTRACT

In an embodiment, a solar energy system includes multiple photovoltaic modules, each oriented substantially at a same angle relative to horizontal. The angle is independent of a latitude of an installation site of the solar energy system and is greater than or equal to 15 degrees. The solar energy system defines a continuous area within a perimeter of the solar energy system. The solar energy system is configured to capture at the photovoltaic modules substantially all light incoming towards the continuous area over an entire season.

29 Claims, 29 Drawing Sheets

Related U.S. Application Data a continuation-in-part of application No. 12/711,040, filed on Feb. 23, 2010.

(60) Provisional application No. 61/710,132, filed on Oct. 5, 2012, provisional application No. 61/720,606, filed on Oct. 31, 2012, provisional application No. 61/753,360, filed on Jan. 16, 2013, provisional application No. 61/753,363, filed on Jan. 16, 2013, provisional application No. 61/769,525, filed on Feb. 26, 2013, provisional application No. 61/832,667, filed on Jun. 7, 2013.

(51) Int. Cl.

| | |
|---|---|
| *F24J 2/16* | (2006.01) |
| *F24J 2/46* | (2006.01) |
| *F24J 2/52* | (2006.01) |
| *G02B 7/183* | (2006.01) |
| *H02S 20/00* | (2014.01) |
| *H01L 31/054* | (2014.01) |
| *H02S 40/22* | (2014.01) |
| *H02S 20/30* | (2014.01) |
| *F24J 2/00* | (2014.01) |
| *F24J 2/54* | (2006.01) |

(52) U.S. Cl.
CPC ........... *F24J 2/5207* (2013.01); *F24J 2/5209* (2013.01); *F24J 2/5233* (2013.01); *F24J 2/5239* (2013.01); *F24J 2/5241* (2013.01); *F24J 2/5254* (2013.01); *F24J 2/5264* (2013.01); *G02B 7/183* (2013.01); *H01L 31/0549* (2014.12); *H02S 20/00* (2013.01); *H02S 20/30* (2014.12); *H02S 40/22* (2014.12); *F24J 2/4638* (2013.01); *F24J 2002/0084* (2013.01); *F24J 2002/5218* (2013.01); *F24J 2002/5226* (2013.01); *F24J 2002/5279* (2013.01); *F24J 2002/5486* (2013.01); *Y02E 10/47* (2013.01); *Y02E 10/52* (2013.01)

(58) Field of Classification Search
CPC .......... F24J 2/5239; F24J 2/5254; F24J 2/526; F24J 2/5264; F24J 2/5233; F24J 2/5241; F24J 2/4638; H01L 31/0422; H01L 31/0549; Y02E 10/52
See application file for complete search history.

(56) References Cited

U.S. PATENT DOCUMENTS

| | | |
|---|---|---|
| 3,419,434 A | 12/1968 | Colehower |
| 3,833,426 A | 9/1974 | Mesch |
| 4,002,160 A | 1/1977 | Mather |
| 4,020,827 A | 5/1977 | Broberg |
| 4,033,327 A | 7/1977 | Pei |
| 4,120,282 A | 10/1978 | Espy |
| 4,154,998 A | 5/1979 | Luft et al. |
| 4,158,768 A | 6/1979 | Lavelli |
| 4,212,293 A | 7/1980 | Nugent |
| 4,227,298 A | 10/1980 | Keeling |
| 4,309,334 A | 1/1982 | Valitsky |
| 4,316,448 A | 2/1982 | Dodge |
| 4,321,416 A | 3/1982 | Tennant |
| 4,369,498 A | 1/1983 | Schulte |
| 4,410,757 A | 10/1983 | Stamminger et al. |
| 4,461,922 A | 7/1984 | Gay et al. |
| 4,481,378 A | 11/1984 | Lesk |
| 4,514,579 A | 4/1985 | Hanak |
| 4,604,494 A | 8/1986 | Shepard, Jr. |
| 4,611,090 A | 9/1986 | Catella |
| 4,617,421 A | 10/1986 | Nath |
| 4,695,788 A | 9/1987 | Marshall |
| 4,716,258 A | 12/1987 | Murtha |
| 4,747,699 A | 5/1988 | Kobayashi et al. |
| 4,755,921 A | 7/1988 | Nelson |
| 4,773,944 A | 9/1988 | Nath |
| 4,854,974 A | 8/1989 | Carlson |
| 4,933,022 A | 6/1990 | Swanson |
| 4,964,713 A | 10/1990 | Goetzberger |
| 4,966,631 A | 10/1990 | Matlin |
| 5,013,141 A | 5/1991 | Sakata |
| 5,021,099 A | 6/1991 | Kim |
| 5,048,194 A | 9/1991 | McMurtry |
| 5,096,505 A | 3/1992 | Fraas et al. |
| 5,205,739 A | 4/1993 | Malo |
| 5,246,782 A | 9/1993 | Kennedy |
| 5,268,037 A | 12/1993 | Glatfelter |
| 5,270,636 A | 12/1993 | Lafferty |
| 5,288,337 A | 2/1994 | Mitchell |
| 5,344,497 A | 9/1994 | Fraas |
| 5,374,317 A | 12/1994 | Lamb |
| 5,457,057 A | 10/1995 | Nath |
| 5,468,988 A | 11/1995 | Glatfelter |
| 5,478,402 A | 12/1995 | Hanoka |
| 5,491,040 A | 2/1996 | Chaloner-Gill |
| 5,493,096 A | 2/1996 | Koh |
| 5,505,789 A | 4/1996 | Fraas |
| 5,513,075 A | 4/1996 | Capper |
| 5,538,563 A | 7/1996 | Finkl |
| 5,571,338 A | 11/1996 | Kadonome |
| 5,593,901 A | 1/1997 | Oswald |
| 5,719,758 A | 2/1998 | Nakata |
| 5,735,966 A | 4/1998 | Luch |
| 5,745,355 A | 4/1998 | Tracy et al. |
| 5,801,519 A | 9/1998 | Midya |
| 5,896,281 A | 4/1999 | Bingley |
| 5,910,738 A | 6/1999 | Shinohe |
| 5,982,157 A | 11/1999 | Wattenhoffer |
| 5,990,413 A | 11/1999 | Ortabasi |
| 5,994,641 A | 11/1999 | Kardauskas |
| 6,011,215 A | 1/2000 | Glatfelter |
| 6,017,002 A | 1/2000 | Burke et al. |
| 6,043,425 A | 3/2000 | Assad |
| 6,077,722 A | 6/2000 | Jansen |
| 6,111,189 A | 8/2000 | Garvison |
| 6,111,454 A | 8/2000 | Shinohe |
| 6,111,767 A | 8/2000 | Handleman |
| 6,134,784 A | 10/2000 | Carrie |
| 6,177,627 B1 | 1/2001 | Murphy |
| 6,188,012 B1 | 2/2001 | Ralph |
| 6,201,180 B1 | 3/2001 | Meyer |
| 6,281,485 B1 | 8/2001 | Siri |
| 6,288,325 B1 | 9/2001 | Jansen |
| 6,294,723 B2 | 9/2001 | Uematsu |
| 6,331,208 B1 | 12/2001 | Nishida |
| 6,337,436 B1 | 1/2002 | Ganz |
| 6,339,538 B1 | 1/2002 | Handleman |
| 6,351,130 B1 | 2/2002 | Preiser |
| 6,462,265 B1 | 10/2002 | Sasaoka et al. |
| 6,465,724 B1 | 10/2002 | Garvison |
| 6,479,744 B1 | 11/2002 | Tsuzuki et al. |
| 6,515,215 B1 | 2/2003 | Mimura |
| 6,528,716 B2 | 3/2003 | Collette |
| 6,706,963 B2 | 3/2004 | Gaudiana |
| 6,739,692 B2 | 5/2004 | Unosawa |
| 6,750,391 B2 | 6/2004 | Bower |
| 6,753,692 B2 | 6/2004 | Toyomura |
| 6,803,513 B2 | 10/2004 | Beernink |
| 6,858,461 B2 | 2/2005 | Oswald |
| 6,870,087 B1 | 3/2005 | Gallagher |
| 6,882,063 B2 | 4/2005 | Droppo |
| 6,903,261 B2 | 6/2005 | Habraken |
| 6,966,184 B2 | 11/2005 | Toyomura |
| 6,992,256 B1 | 1/2006 | Wiley |
| 7,009,412 B2 | 3/2006 | Chong |
| 7,094,441 B2 | 8/2006 | Chittibabu |
| 7,099,169 B2 | 8/2006 | West et al. |
| 7,138,730 B2 | 11/2006 | Lai |
| 7,205,626 B1 | 4/2007 | Nakata |
| 7,259,322 B2 | 8/2007 | Gronet |
| 7,276,724 B2 | 10/2007 | Sheats |

(56) References Cited

U.S. PATENT DOCUMENTS

| | | |
|---|---|---|
| 7,297,865 B2 | 11/2007 | Terao |
| 7,301,095 B2 | 11/2007 | Murphy |
| 7,336,004 B2 | 2/2008 | Lai |
| 7,339,108 B2 | 3/2008 | Tur |
| 7,342,171 B2 | 3/2008 | Khouri |
| 7,388,146 B2 | 6/2008 | Fraas |
| 7,432,438 B2 | 10/2008 | Rubin et al. |
| 7,498,508 B2 | 3/2009 | Rubin et al. |
| 7,997,938 B2 | 8/2011 | Costello et al. |
| 8,013,239 B2 | 9/2011 | Rubin et al. |
| 8,138,631 B2 | 3/2012 | Allen et al. |
| 8,212,139 B2 | 7/2012 | Meyer |
| 8,563,847 B2 | 10/2013 | Meyer |
| 8,748,727 B2 | 6/2014 | Meyer |
| 8,828,778 B2 | 9/2014 | Meyer |
| 8,829,330 B2 | 9/2014 | Meyer |
| 8,933,320 B2 | 1/2015 | Meyer |
| 2001/0008144 A1 | 7/2001 | Uematsu |
| 2002/0179140 A1 | 12/2002 | Toyomura |
| 2003/0047208 A1 | 3/2003 | Glenn |
| 2003/0121228 A1 | 7/2003 | Stoehr |
| 2003/0121542 A1 | 7/2003 | Harneit et al. |
| 2003/0201007 A1 | 10/2003 | Fraas |
| 2004/0007260 A1* | 1/2004 | Dinwoodie ............. F24J 2/523 136/251 |
| 2004/0016454 A1 | 1/2004 | Murphy et al. |
| 2004/0055594 A1 | 3/2004 | Hochberg |
| 2004/0089337 A1 | 5/2004 | Chou |
| 2004/0261834 A1 | 12/2004 | Basore |
| 2004/0261955 A1 | 12/2004 | Shingleton et al. |
| 2005/0000562 A1 | 1/2005 | Kataoka et al. |
| 2005/0022857 A1 | 2/2005 | Daroczi |
| 2005/0034751 A1 | 2/2005 | Gross |
| 2005/0061360 A1 | 3/2005 | Horioka et al. |
| 2005/0081909 A1 | 4/2005 | Paull |
| 2005/0115176 A1 | 6/2005 | Russell |
| 2005/0121067 A1 | 6/2005 | Toyomura et al. |
| 2005/0133081 A1 | 6/2005 | Amato |
| 2005/0158891 A1 | 7/2005 | Barth |
| 2005/0172995 A1 | 8/2005 | Rohrig |
| 2005/0194939 A1 | 9/2005 | Duff, Jr. |
| 2005/0263179 A1 | 12/2005 | Gaudiana |
| 2005/0268959 A1 | 12/2005 | Aschenbrenner |
| 2005/0278076 A1 | 12/2005 | Barbir |
| 2006/0001406 A1 | 1/2006 | Matan |
| 2006/0042681 A1 | 3/2006 | Korman |
| 2006/0054212 A1 | 3/2006 | Fraas |
| 2006/0086384 A1 | 4/2006 | Nakata |
| 2006/0092588 A1 | 5/2006 | Realmuto et al. |
| 2006/0162772 A1 | 7/2006 | Presher |
| 2006/0174931 A1 | 8/2006 | Mapes et al. |
| 2006/0174939 A1 | 8/2006 | Matan |
| 2006/0180197 A1 | 8/2006 | Gui |
| 2006/0185716 A1 | 8/2006 | Murozono |
| 2006/0185727 A1 | 8/2006 | Matan |
| 2006/0213548 A1 | 9/2006 | Bachrach |
| 2006/0225777 A1 | 10/2006 | Buechel |
| 2006/0235717 A1 | 10/2006 | Sharma |
| 2006/0261830 A1 | 11/2006 | Taylor |
| 2006/0266407 A1 | 11/2006 | Lichy |
| 2007/0035864 A1 | 2/2007 | Vasylyev |
| 2007/0056626 A1 | 3/2007 | Funcell |
| 2007/0068567 A1 | 3/2007 | Rubin et al. |
| 2007/0079861 A1 | 4/2007 | Morali |
| 2007/0095384 A1 | 5/2007 | Farquhar |
| 2007/0103108 A1 | 5/2007 | Capp |
| 2007/0113885 A1 | 5/2007 | Chan |
| 2007/0124619 A1 | 5/2007 | Mizukami |
| 2007/0125415 A1 | 6/2007 | Sachs |
| 2007/0144577 A1 | 6/2007 | Rubin et al. |
| 2007/0151594 A1 | 7/2007 | Mascolo et al. |
| 2007/0157964 A1 | 7/2007 | Gronet |
| 2007/0179720 A1 | 8/2007 | Becker et al. |
| 2007/0186971 A1 | 8/2007 | Lochun |
| 2007/0193620 A1 | 8/2007 | Hines |
| 2007/0199588 A1 | 8/2007 | Rubin |
| 2007/0215195 A1 | 9/2007 | Buller |
| 2007/0235077 A1 | 10/2007 | Nagata |
| 2007/0240755 A1 | 10/2007 | Lichy |
| 2007/0251569 A1 | 11/2007 | Shan |
| 2007/0261731 A1 | 11/2007 | Abe |
| 2007/0266672 A1 | 11/2007 | Bateman |
| 2007/0272295 A1 | 11/2007 | Rubin |
| 2007/0273338 A1 | 11/2007 | West |
| 2007/0295381 A1 | 12/2007 | Fujii |
| 2008/0000516 A1 | 1/2008 | Shifman |
| 2008/0029149 A1 | 2/2008 | Simon |
| 2008/0029152 A1 | 2/2008 | Milshtein |
| 2008/0037141 A1 | 2/2008 | Tom et al. |
| 2008/0047003 A1 | 2/2008 | Wong et al. |
| 2008/0092944 A1 | 4/2008 | Rubin et al. |
| 2008/0122518 A1 | 5/2008 | Besser et al. |
| 2008/0142071 A1 | 6/2008 | Dorn et al. |
| 2008/0163922 A1 | 7/2008 | Horne et al. |
| 2008/0164766 A1 | 7/2008 | Adest et al. |
| 2008/0210286 A1 | 9/2008 | Ball |
| 2008/0236648 A1 | 10/2008 | Klein et al. |
| 2008/0290368 A1 | 11/2008 | Rubin |
| 2008/0298051 A1 | 12/2008 | Chu |
| 2009/0025778 A1 | 1/2009 | Rubin et al. |
| 2009/0121968 A1 | 5/2009 | Okamoto |
| 2009/0151775 A1 | 6/2009 | Pietrzak |
| 2009/0183760 A1 | 7/2009 | Meyer |
| 2009/0183763 A1 | 7/2009 | Meyer |
| 2009/0183764 A1 | 7/2009 | Meyer |
| 2009/0217965 A1 | 9/2009 | Dougal et al. |
| 2009/0242014 A1* | 10/2009 | Leary ..................... F24J 2/5239 136/251 |
| 2009/0242021 A1 | 10/2009 | Petkie et al. |
| 2009/0250093 A1 | 10/2009 | Chen |
| 2010/0000165 A1 | 1/2010 | Koller |
| 2010/0014738 A1 | 1/2010 | Birnholz et al. |
| 2010/0089390 A1 | 4/2010 | Miros et al. |
| 2010/0131108 A1 | 5/2010 | Meyer |
| 2010/0175337 A1* | 7/2010 | Mascolo ................ F24J 2/5205 52/173.3 |
| 2010/0212720 A1* | 8/2010 | Meyer ........................ F24J 2/16 136/246 |
| 2010/0219688 A1 | 9/2010 | Shyu et al. |
| 2010/0253151 A1 | 10/2010 | Gerhardinger et al. |
| 2010/0282293 A1 | 11/2010 | Meyer et al. |
| 2010/0313499 A1* | 12/2010 | Gangemi .................... F24J 2/52 52/173.3 |
| 2010/0313933 A1* | 12/2010 | Xu ............................. F24J 2/16 136/246 |
| 2011/0018353 A1 | 1/2011 | Yu |
| 2011/0039992 A1 | 2/2011 | Irie |
| 2011/0067748 A1 | 3/2011 | Pfeiffer |
| 2011/0241431 A1 | 10/2011 | Chen et al. |
| 2011/0301772 A1 | 12/2011 | Zuercher et al. |
| 2012/0042588 A1 | 2/2012 | Erickson, Jr. |
| 2012/0204935 A1 | 8/2012 | Meyer et al. |
| 2012/0234374 A1 | 9/2012 | Meyer |
| 2012/0319494 A1 | 12/2012 | Ecrabey et al. |
| 2013/0062956 A1 | 3/2013 | Meyer |
| 2014/0035373 A1 | 2/2014 | Meyer |
| 2014/0174535 A1 | 6/2014 | Meyer |
| 2014/0360561 A1 | 12/2014 | Meyer |
| 2015/0047689 A1 | 2/2015 | Meyer |

FOREIGN PATENT DOCUMENTS

| | | |
|---|---|---|
| CN | 101336476 | 12/2008 |
| CN | 101990712 A | 3/2011 |
| CN | 202064536 U | 12/2011 |
| CN | 102405531 A | 4/2012 |
| DE | 3708548 | 9/1988 |
| DE | 4027325 | 4/1992 |
| DE | 20314372 | 12/2003 |
| DE | 102004001248 | 1/2005 |
| DE | 202006020180 | 12/2007 |
| EP | 1724842 | 11/2006 |
| EP | 1744372 | 1/2007 |

(56) References Cited

FOREIGN PATENT DOCUMENTS

| | | |
|---|---|---|
| EP | 2172980 | 4/2010 |
| EP | 2251941 | 11/2010 |
| GB | 2331530 | 5/1999 |
| JP | 60-141152 | 9/1985 |
| JP | 02-025079 | 1/1990 |
| JP | 09-045946 | 2/1997 |
| JP | 10-69321 | 3/1998 |
| JP | 10-245935 | 9/1998 |
| JP | 10-281562 | 10/1998 |
| JP | 11-041832 | 2/1999 |
| JP | 1-103538 | 4/1999 |
| JP | 2000-114571 | 4/2000 |
| JP | 2000-213255 | 8/2000 |
| JP | 2000-357812 | 12/2000 |
| JP | 2001-268891 | 9/2001 |
| JP | 2002-073184 | 3/2002 |
| JP | 2002-305318 | 10/2002 |
| JP | 2002-314112 | 10/2002 |
| JP | 2003-026455 | 1/2003 |
| JP | 2003-282918 | 10/2003 |
| JP | 2006-040931 | 2/2006 |
| JP | 2006-302147 | 11/2006 |
| JP | 2007-234795 | 9/2007 |
| JP | 2007-294630 | 11/2007 |
| JP | 2009-503870 | 1/2009 |
| JP | 2009-032945 | 2/2009 |
| JP | 2009-545877 A | 12/2009 |
| JP | 2011-2991 | 1/2011 |
| JP | 2011-129626 A | 6/2011 |
| KR | 10-1998-087002 | 12/1998 |
| KR | 10-2007-0104300 | 10/2007 |
| KR | 10-2007-0107318 | 11/2007 |
| KR | 10-2010-0129721 | 12/2010 |
| TW | 201042770 | 12/2010 |
| TW | 201106490 | 12/2011 |
| WO | WO 02/35613 | 2/2002 |
| WO | WO 2004/021455 | 3/2004 |
| WO | WO 2007/071064 | 6/2007 |
| WO | WO 2007/095757 | 8/2007 |
| WO | WO 2007/137407 | 12/2007 |
| WO | WO 2008/016453 | 2/2008 |
| WO | WO 2008/028677 | 3/2008 |
| WO | WO 2008/042828 | 4/2008 |
| WO | WO 2008/046201 | 4/2008 |
| WO | WO 2008/141415 | 11/2008 |
| WO | WO 2009/012567 | 1/2009 |
| WO | WO 2009/076740 | 6/2009 |
| WO | 2009/092110 | 7/2009 |
| WO | 2009/092111 | 7/2009 |
| WO | 2009086238 A2 | 7/2009 |
| WO | WO 2009/009211 | 7/2009 |
| WO | WO 2010/012062 | 2/2010 |
| WO | WO 2010/037393 | 4/2010 |
| WO | 2010/068226 | 6/2010 |
| WO | WO 2010/096833 | 8/2010 |
| WO | WO 2010/148009 | 12/2010 |
| WO | WO 2011/011855 | 2/2011 |
| WO | WO 2011/109741 | 9/2011 |

OTHER PUBLICATIONS

Chinese Office Action in Chinese Application No. 201180048973.7, dated Aug. 12, 2015, 8 pgs.
European Office Action in European Application No. 15158419.0, dated Jun. 9, 2015, 7 pgs.
Korean Office Action in Korean Application No. 10-2014-7014579, dated Jun. 19, 2015, 13 pgs.
Chen, Yaow-Ming, Multiinput Converter With Power Factor Correction, Maximum Power Point Tracking, and Ripple-Free Input Currents, IEEE Transactions on Power Electronics, vol. 19, No. 3, May 204, pp. 631-639.
Sefa, Ibrahim et al., Experimental Study of Interleaved MPPT Converter for PV Systems, IECON 2009, 35th Annual Conference of IEEE Industrial Electronics, Nov. 3-5, 2009, pp. 456-461.
US Office Action in U.S. App. No. 12/711,040, dated Jun. 18, 2015, 37 pgs.
US Restriction Requirement in U.S. App. No. 13/664,885, dated Jul. 10, 2015, 5 pgs.
Chinese Office Action in Chinese Application No. 201180048973.7, dated Jan. 30, 2015, 10 pgs.
Japanese Office Action in Japanese Application No. 2014-540038, dated Mar. 17, 2015, 11 pgs.
International Search Report dated Jan. 28, 2014 as received in Application No. PCT/US2013/062747.
Written Opinion of the International Searching Authority dated Jan. 28, 2014 as received in Application No. PCT/US2013/062747.
Chinese Office Action in Chinese Application No. 200980109824.X, dated Aug. 24, 2011, 10 pgs.
Chinese Office Action in Chinese Application No. 201080017252.5, dated Aug. 13, 2013, 19 pgs.
Chinese Office Action in Chinese Application No. 201080017252.5, dated Apr. 28, 2014, 12 pgs.
Chinese Office Action in Chinese Application No. 201080017252.5, dated Nov. 14, 2014, 10 pgs.
Chinese Office Action in Chinese Application No. 201080036349.0, dated Jan. 6, 2014, 15 pgs.
Chinese Office Action in Chinese Application No. 201080036349.0, dated Jun. 6, 2014, 9 pgs.
European Search Report in European Application No. 10744485.3, dated Jan. 17, 2014, 4 pgs.
European Office Action in European Application No. 10790069.8, dated Sep. 9, 2014, 5 pgs.
European Search Report in European Application No. 12846494.8, dated Dec. 18, 2014, 7 pgs.
Japanese Office Action in Japanese Application No. 2012-516209, dated Dec. 17, 2013, 5 pgs.
Japanese Office Action in Japanese Application No. 2012-516209, dated Jun. 24, 2014, 12 pgs.
Japanese Office Action in Japanese Application No. 2012-516209, dated Oct. 28, 2014, 8 pgs.
International Search Report and Written Opinion, as issued in connection with International Patent Application No. PCT/US2009/031594, mailed Jun. 25, 2009, 7 pgs.
International Search Report and Written Opinion, as issued in connection with International Patent Application No. PCT/US2009/031596, mailed Sep. 8, 2009, 8 pgs.
International Search Report and Written Opinion, as issued in connection with International Patent Application No. PCT/US2010/038702, mailed Jan. 5, 2011, 7 pgs.
International Search Report and Written Opinion, as issued in connection with International Patent Application No. PCT/US2012/062784, mailed Mar. 19, 2013, 13 pgs.
International Search Report and Written Opinion, as issued in connection with International Patent Application No. PCT/US2014/052166, mailed Nov. 26, 2014, 12 pgs.
US Notice of Allowance in U.S. Appl. No. 12/357,268, dated Mar. 11, 2014, 12 pgs.
US Restriction Requirement in U.S. Appl. No. 13/485,210, dated Jan. 15, 2014, 5 pgs.
US Notice of Allowance in U.S. Appl. No. 13/485,210, dated May 29, 2014, 13 pgs.
US Office Action in U.S. Appl. No. 12/357,260, dated Apr. 22, 2014, 26 pgs.
US Notice of Allowance in U.S. Appl. No. 12/357,260, dated Sep. 4, 2014, 8 pgs.
US Restriction Requirement in U.S. Appl. No. 12/357,277, dated Nov. 10, 2011, 7 pgs.
US Notice of Allowance in U.S. Appl. No. 12/815,913, dated Sep. 3, 2013, 11 pgs.
US Restriction Requirement in U.S. Appl. No. 13/207,164, dated Sep. 28, 2012, 7 pgs.
US Office Action in U.S. Appl. No. 13/207,164, dated Aug. 29, 2013, 34 pgs.
US Notice of Allowance in U.S. Appl. No. 13/207,164, dated Nov. 27, 2013, 12 pgs.

(56) References Cited

OTHER PUBLICATIONS

International Search Report and Written Opinion, mailed Sep. 27, 2010, as issued in connection with International Patent Application No. PCT/US2010/025108.
International Search Report and Written Opinion, mailed Sep. 29, 2009, as issued in connection with International Patent Application No. PCT/US2009/031597.
International Search Report and Written Opinion, mailed Aug. 31, 2011, as issued in connection with International Patent Application No. PCT/US2010/061864.
International Preliminary Report mailed Dec. 29, 2011, as issued in connection with International Patent Application No. PCT/US2010/038702.
International Search Report and Written Opinion mailed Mar. 19, 2012 as issued in connection with International Patent Application No. PCT/US2011/047291.
Supplementary European Search Report dated Jun. 13, 2013 as received in European Application No. EP 09702762.
Japanese Office Action dated Feb. 19, 2013 in Japanese Application No. 2011-551303.
Zeghbroeck, Bart V., Ellipsometer Data Table, http://ece-www.colorado.edu/~bart/book/ellipstb.htm, 1997.
Supplemental European Search Report dated May 8, 2013 as received in European Application No. 10790069.8.
Japanese Office Action dated Apr. 30, 2013 in Japanese Application No. 2012-516209.
Solatron Techonologies, Wiring Solar Modules and Batteries, <http://web.archive.org/web/20030206212224/http://partsonsale.com/learnwiring.htm>, web archived May 2008.
U.S. Appl. No. 12/357,268, filed Nov. 29, 2011, Restriction Requirement.
U.S. Appl. No. 12/357,268, filed Feb. 3, 2012, Restriction Requirement.
U.S. Appl. No. 12/357,268, filed Aug. 2, 2012, Office Action.
U.S. Appl. No. 12/357,268, filed Nov. 21, 2012, Office Action.
U.S. Appl. No. 12/684,595, filed Jan. 25, 2012, Restriction Requirement.
U.S. Appl. No. 12/684,595, filed Mar. 16, 2012, Notice of Allowance.
U.S. Appl. No. 12/357,260, filed Aug. 2, 2012, Restriction Requirement.
U.S. Appl. No. 12/357,260, filed Feb. 5, 2013, Office Action.
U.S. Appl. No. 12/357,260, filed May 23, 2013, Office Action.
U.S. Appl. No. 12/357,277, filed Jan. 26, 2012, Office Action.
U.S. Appl. No. 12/357,277, filed Jul. 19, 2012, Office Action.
U.S. Appl. No. 12/711,040, filed Jun. 18, 2012, Restriction Requirement.
U.S. Appl. No. 12/711,040, filed Nov. 26, 2012, Office Action.
U.S. Appl. No. 12/711,040, filed Jul. 5, 2013, Office Action.
U.S. Appl. No. 12/815,913, filed May 29, 2012, Restriction Requirement.
U.S. Appl. No. 12/815,913, filed Oct. 5, 2012, Office Action.
U.S. Appl. No. 13/207,164, filed Feb. 14, 2013, Office Action.
European Office Action in European Application No. 12846494.8, dated Oct. 16, 2015, 4 pgs.
Japanese Office Action in Japanese Application No. 2014-540038, dated Aug. 18, 2015, 19 pgs.
Japanese Office Action in Japanese Application No. 2015-026500, dated Oct. 20, 2015, 12 pgs.
US Office Action in U.S. Appl. No. 12/711,040, dated Sep. 25, 2015, 37 pgs.
US Restriction Requirement in U.S. Appl. No. 14/053,482, dated Oct. 27, 2015, 20 pgs.
CN Search Report dated May 26, 2016 as received in Application No. 2013800518067 (English Translation).
CN Office Action dated Jun. 3, 2016 as received in Application No. 201380051806.7 (English Translation).
CN Office Action dated Feb. 3, 2017 as received in Application No. 201380051806.7 (English Translation).

* cited by examiner

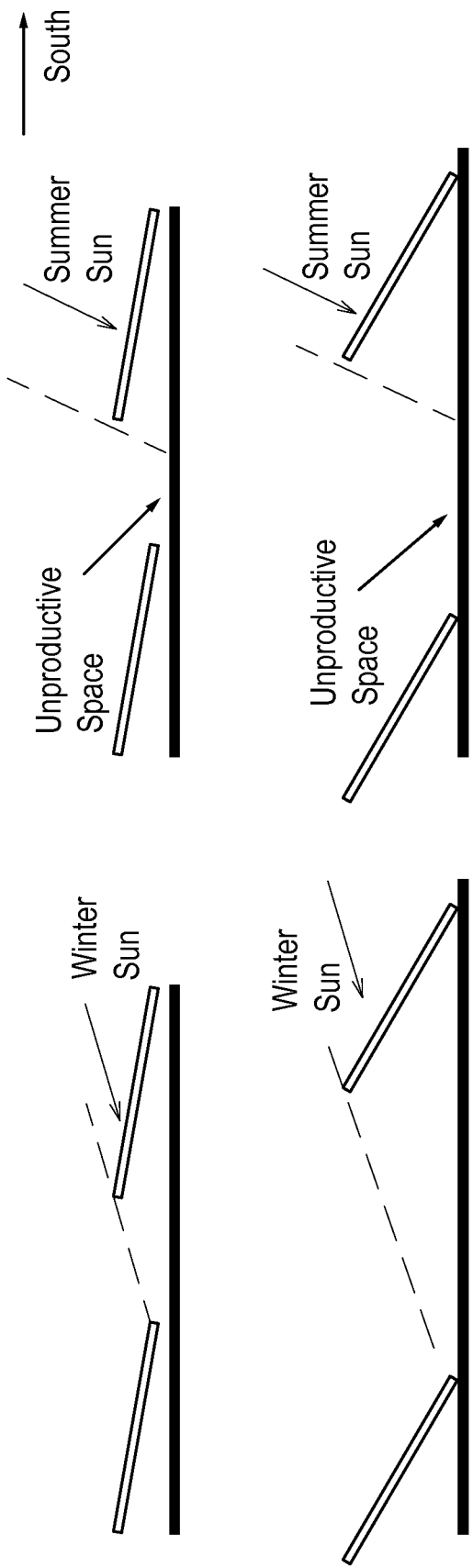

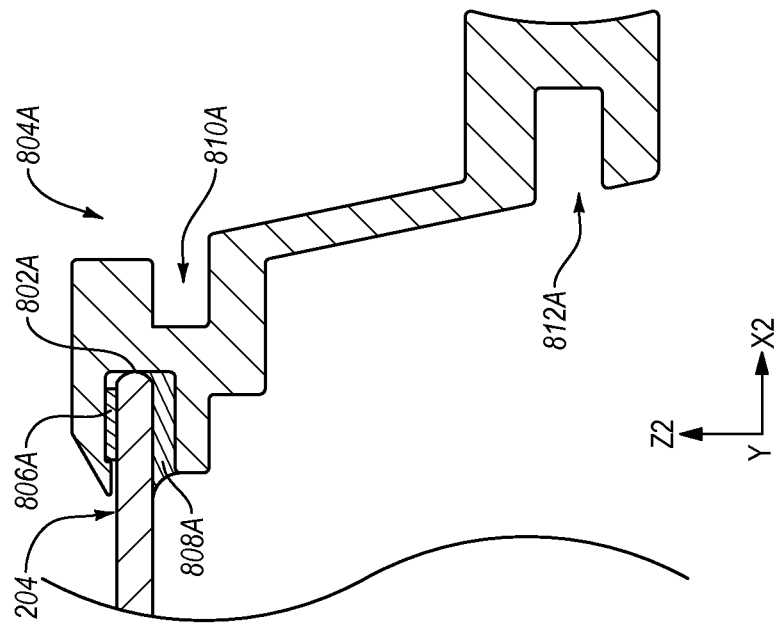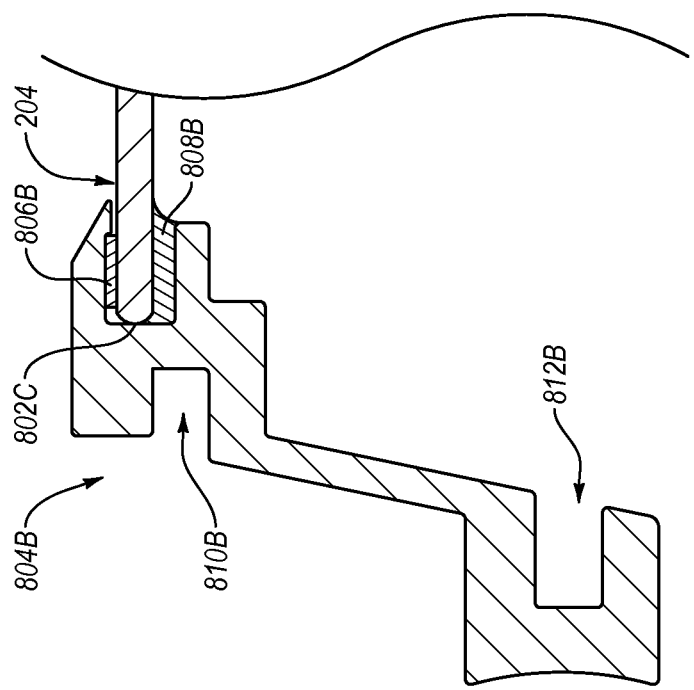
Fig. 8B

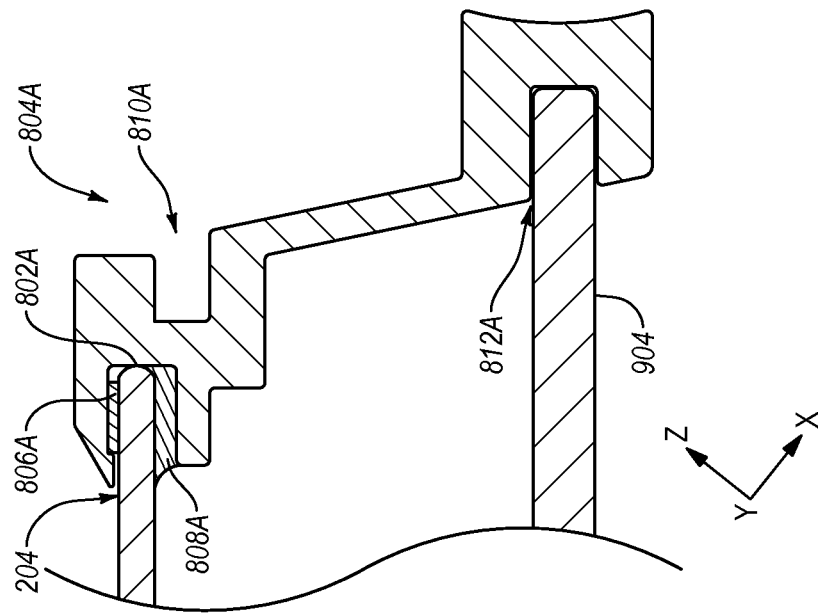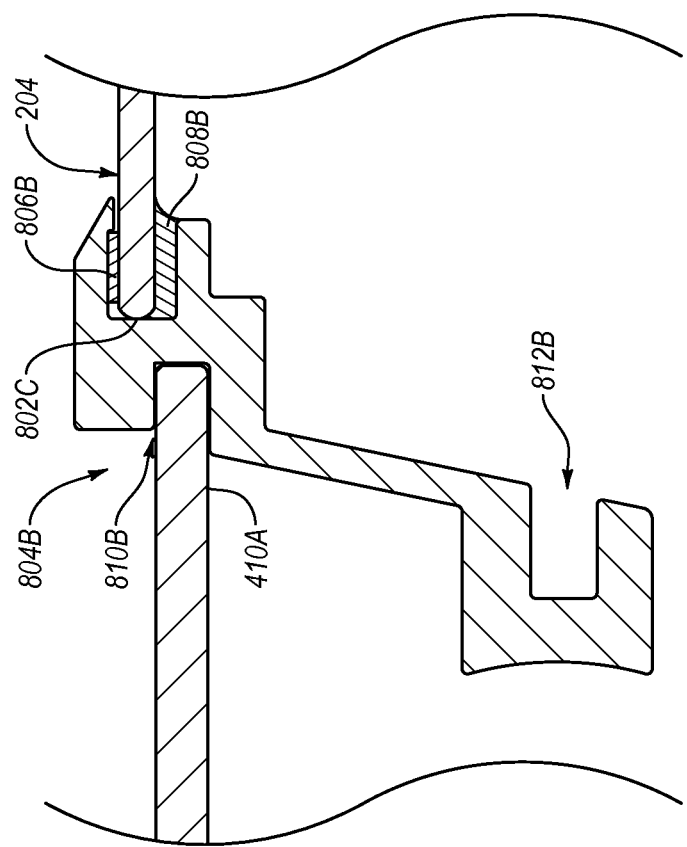
Fig. 9C

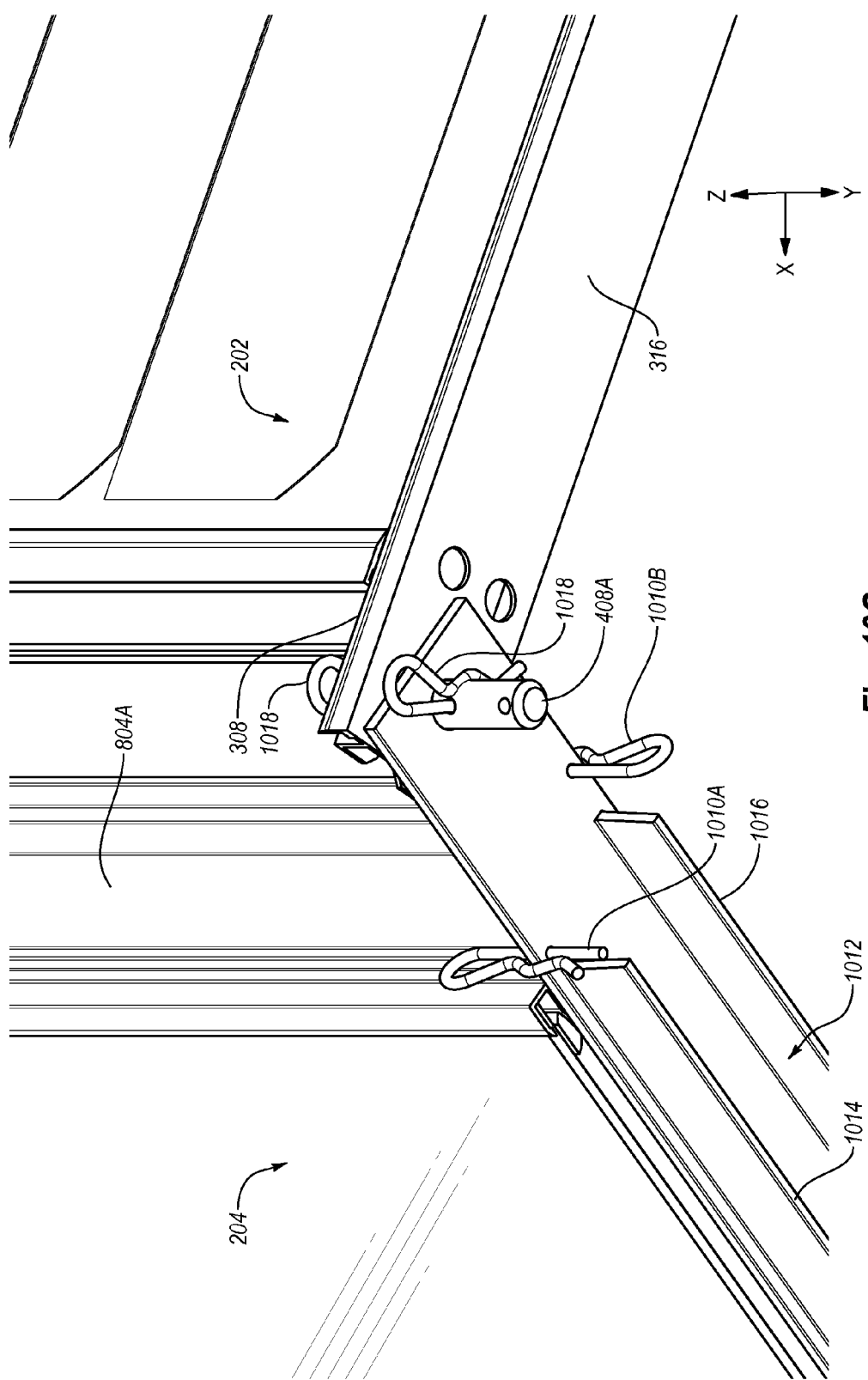

SPACE AND ENERGY EFFICIENT PHOTOVOLTAIC ARRAY

CROSS-REFERENCE TO RELATED APPLICATIONS

This application:

is a continuation-in-part of U.S. patent application Ser. No. 13/207,164, filed Aug. 10, 2011;

is a continuation-in-part of U.S. patent application Ser. No. 12/711,040, filed Feb. 23, 2010; and claims the benefit of and priority to:

U.S. Provisional Application No. 61/710,132, filed Oct. 5, 2012;

U.S. Provisional Application No. 61/720,606, filed Oct. 31, 2012;

U.S. Provisional Application No. 61/753,360, filed Jan. 16, 2013;

U.S. Provisional Application No. 61/753,363, filed Jan. 16, 2013;

U.S. Provisional Application No. 61/769,525, filed Feb. 26, 2013; and

U.S. Provisional Application No. 61/832,667, filed Jun. 7, 2013.

The foregoing applications are incorporated herein by reference in their entireties.

FIELD

Example embodiments described herein relate to solar energy systems with multiple angled photovoltaic (PV) modules that capture nearly all light illuminating the solar energy system over an entire season.

BACKGROUND

Unless otherwise indicated herein, the materials described herein are not prior art to the claims in the present application and are not admitted to be prior art by inclusion in this section.

PV modules used in solar energy systems are often installed at an inclined angle (e.g., tilt) and aligned to the sun, e.g., generally facing south in the Northern Hemisphere or generally facing north in the Southern Hemisphere. The angle and alignment improve energy output, snow performance, and cooling while reducing soiling compared to horizontal configurations. At many northern and southern latitudes, the tilt of the PV modules causes significant shading behind the modules, with the extent of the shading generally varying between the most shading on the winter solstice and the least shading on the summer solstice.

For example, FIG. 1 illustrates an example of the extent of shading for PV modules on the winter solstice (e.g., left side) versus the summer solstice (e.g., right side), arranged in accordance with at least some embodiments described herein. As illustrated in FIG. 1, the tilt angle also affects the amount of shading. In more detail, the top of FIG. 1 includes PV modules inclined at about 15 degrees from horizontal, while the bottom of FIG. 1 includes PV modules inclined at about 30 degrees from horizontal. It can be seen from FIG. 1 that the greater incline angle extends the shading a greater distance behind the PV modules.

Unfortunately, the electrical topology of some conventional PV modules results in a severe energy production penalty during any systematic shading event. In particular, such conventional PV modules have long strings of series-connected PV cells where energy production can be bottlenecked by a single shaded or underperforming PV cell. Such PV modules typically include bypass diodes, each of which allows current to bypass a different section of the string. The bypass diodes that protect each section of the string open when the voltage is back-biased due to an imbalance in photo-generated currents, causing some of the sections of the string to be shunted out of the circuit.

Accordingly, such conventional PV modules are often spaced so as to avoid any adjacent module shading at the worst-case scenario (e.g., winter solstice). As the angle of the incoming light changes throughout the year and into summer, however, much of the incoming light is then incident on unproductive space and its energy is lost from the solar energy system.

Another option is to install the PV modules without any tilt to avoid any adjacent module shading and to allow the PV modules to be installed relatively more densely. In the absence of tilt, however, dirt, debris, snow, etc. can accumulate on the PV modules and reduce their energy output. In contrast, for a tilted PV module, the effects of gravity alone and/or in combination with precipitation and/or wind can generally keep the PV modules relatively more clear of dirt, debris, snow, etc.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to solar energy systems with multiple angled PV modules that capture nearly all light illuminating the solar energy system over an entire season.

In an example embodiment, a solar energy system includes multiple photovoltaic modules, each oriented substantially at a same angle relative to horizontal. The angle is independent of a latitude of an installation site of the solar energy system and is greater than or equal to 15 degrees. The solar energy system defines a continuous area within a perimeter of the solar energy system. The solar energy system is configured to capture at the photovoltaic modules substantially all light incoming towards the continuous area over an entire season.

In another example embodiment, a method is described for assembling a solar energy system including multiple photovoltaic modules. The method includes installing the photovoltaic modules in multiple module rows having empty rows interposed therebetween. The method also includes electrically wiring the photovoltaic modules together, including accessing back sides of the photovoltaic modules from adjacent empty rows as needed. The method also includes installing multiple reflectors in the empty rows to create multiple reflector rows in place of the empty rows only after all of the photovoltaic modules have been installed and electrically wired together.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 1 illustrates an example of the extent of shading for PV modules on the winter solstice versus the summer solstice;

FIG. 8B is a cross-sectional view of the reflector of FIG. 8A at a cutting plane 8B-8B of FIG. 8A;

FIG. 9C is a cross-sectional view in a cutting plane 9C-9C of FIG. 9B;

FIG. 10C illustrates another example locker that can be implemented to prevent a reflector from being removed from the solar energy system of FIG. 2A;

DETAILED DESCRIPTION OF SOME EXAMPLE EMBODIMENTS

Embodiments of the invention generally relate to a solar energy system including multiple angled PV modules that capture nearly all light illuminating the solar energy system over an entire season. The PV modules in some embodiments are linear shading modules meaning that any loss in energy on the front or skyward surface of the PV modules results in a corresponding and linear decrease in power output of the PV modules. The solar energy system additionally includes drop-in reflectors that can be added to the solar energy system after all of the PV modules have been installed, wired, inspected, etc. and are otherwise ready to begin converting solar energy to electrical energy.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

I. Solar Energy System

Figure 2A:
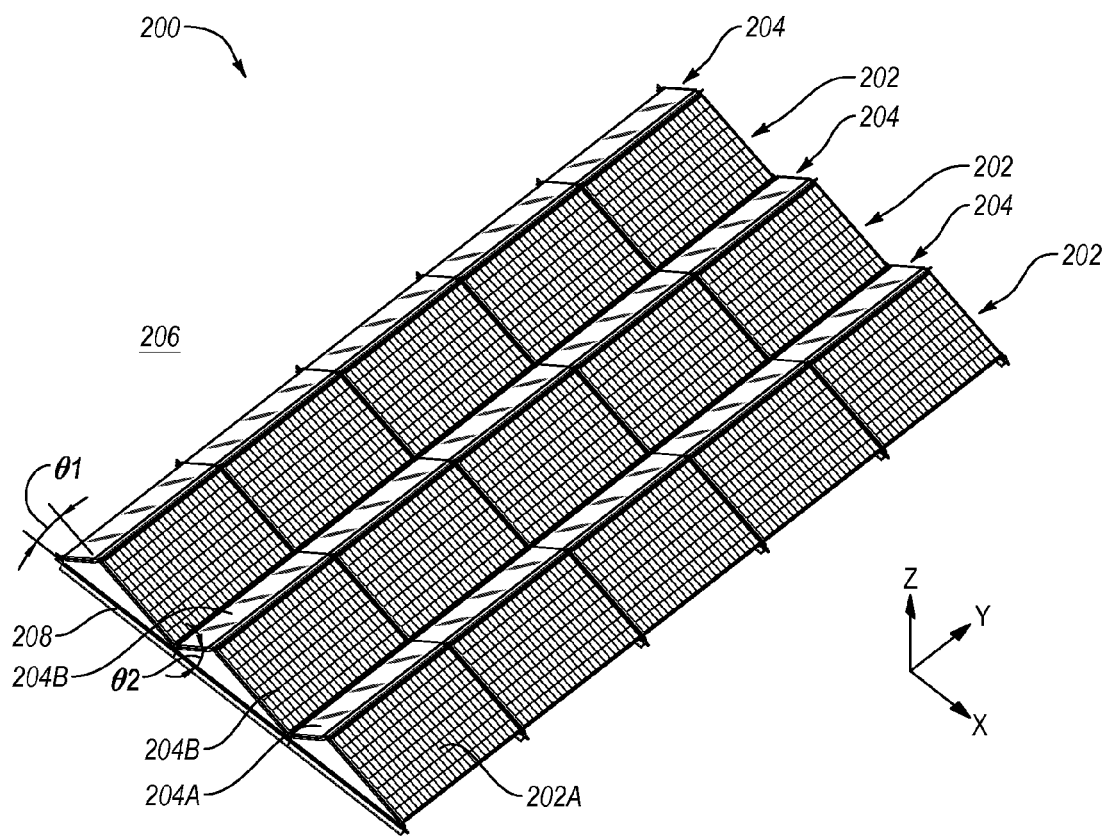
FIG. 2A is a perspective view of an example solar energy system including multiple PV modules and reflectors.

FIG. 2A is a perspective view of an example solar energy system 200, arranged in accordance with at least some embodiments described herein. The solar energy system 200 includes multiple PV modules 202, including PV modules 202A and 202B, and multiple reflectors 204, including reflector 204A. In some embodiments, the PV modules 202 and the reflectors 204 are arranged in rows of PV modules 202 and rows of reflectors 204, with the rows of reflectors 204 generally being interposed between the rows of PV modules 202. For example, the solar energy system 200 of FIG. 2A includes three rows of five PV modules 202, with three rows of five reflectors 204 interposed therebetween. More generally, solar energy systems, according to the described embodiments, may include any number of PV modules 202 and reflectors 204 arranged in more or fewer than three rows each. Further, there may be more rows of PV modules 202 than rows of reflectors 204, or vice versa.

FIG. 2A additionally illustrates arbitrarily-defined X, Y, and Z coordinate axes. The X, Y, and Z coordinate axes are used throughout many of the Figures to provide a consistent frame of reference. When the solar energy system 200 is installed on a nominally horizontal installation surface 206, the positive Z and negative Z directions generally coincide, respectively, with up and down, and the X-Y plane is generally parallel to horizontal. The PV modules 202 may be installed in the Northern Hemisphere facing south, in which case the positive X and negative X directions may respectively coincide with south and north, while the positive Y and negative Y directions may respectively coincide with east and west. Alternately or additionally, the PV modules 202 may be installed in the Southern Hemisphere facing north, in which case the positive X and negative X directions may respectively coincide with north and south, while the positive Y and negative Y directions may respectively coincide with west and east.

As illustrated, each of the PV modules 202 is oriented substantially at a same angle θ1 relative to horizontal. The angle θ1 may be greater than or equal to 15 degrees. Alternately or additionally, the angle θ1 may be less than or equal to 30 degrees. Moreover, in some embodiments, the angle θ1 is independent of a latitude of an installation site of the solar energy system 200. For instance, the same angle θ1 may be used whether the solar energy system 200 is installed at, e.g., 30 degrees north (or south) of the equator or 50 degrees north (or south) of the equator.

Additionally, each of the reflectors 204 is oriented substantially at a same angle θ2 relative to horizontal. The angle θ2 may be greater than or equal to 25 degrees. Alternately or additionally, the angle θ2 may be less than or equal to 50 degrees. Further, it is understood that when the PV modules 202 generally face south or north when installed in the Northern Hemisphere or the Southern Hemisphere, the reflectors 204 generally face north or south, respectively.

Moreover, the solar energy system 200 defines a continuous area within a perimeter of the solar energy system, e.g., a footprint on the installation surface 206. In some embodiments, the solar energy system 200 captures at the PV modules 202 substantially all light incoming towards the continuous area over an entire season. In these and other embodiments, substantially all incoming light towards the continuous area may include 80% or more, or 90% or more, or even 95% or more of all light incoming towards the continuous area over the entire season. Alternately or additionally, substantially all incoming light may include 80%-95% of all light incoming towards the continuous area over the entire season in some embodiments.

The solar energy system 200 of FIG. 2A further includes a racking assembly 208. The racking assembly 208 mechanically interconnects the PV modules 202, as well as the reflectors 204. Additional details regarding embodiments of the racking assembly 208 are provided below.

Figure 2B:
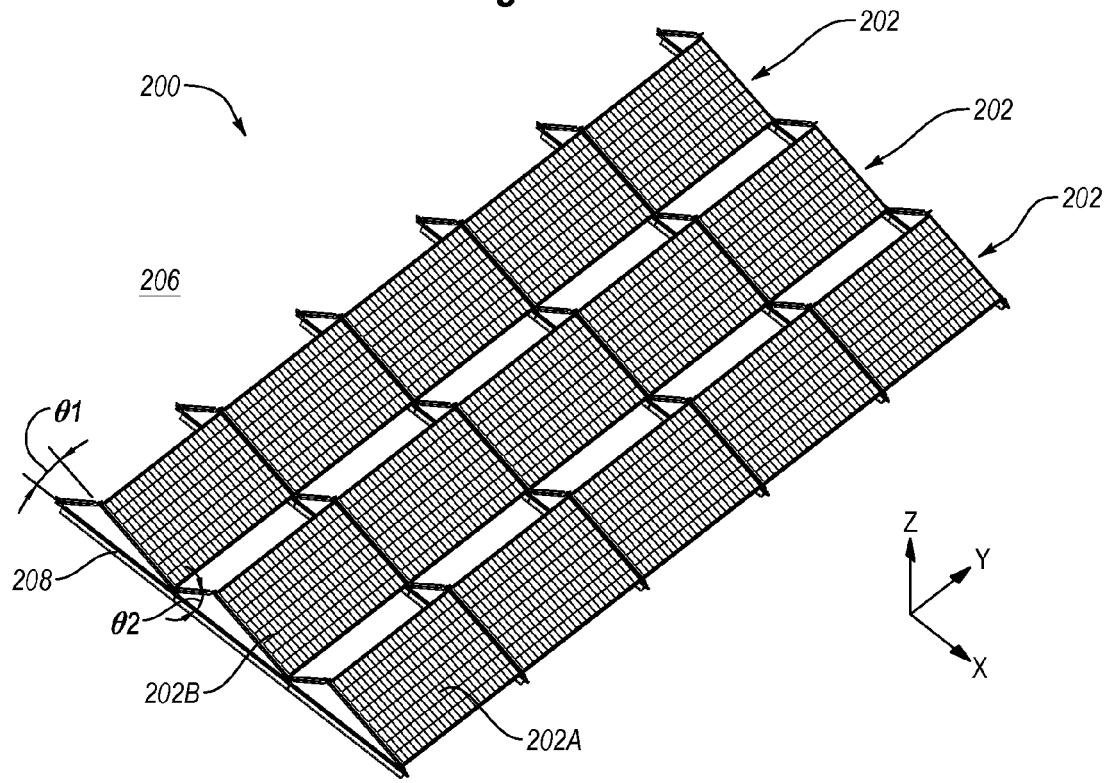
FIG. 2B is a perspective view of the solar energy system of FIG. 2A without the reflectors.

FIG. 2B is a perspective view of the solar energy system 200 of FIG. 2A without the reflectors 204, arranged in accordance with at least some embodiments described herein. In some embodiments, the solar energy system 200 is fully assembled except for the reflectors 204 prior to adding the reflectors 204. In particular, the PV modules 202 may be installed in rows of PV modules 202 having empty rows interposed therebetween, as illustrated in FIG. 2B, using the racking assembly 208. Additionally, the PV modules 202 may be electrically wired together prior to installing the reflectors 204. In some embodiments, electrical connections for the PV modules 202 are on the back sides (e.g., the generally downward-facing sides) of the PV modules 202 such that electrically wiring the PV modules 202 together may include accessing the back sides of the PV modules 202 as needed. The solar energy system 200 may additionally be inspected and commissioned prior to installing the reflectors 204. In some embodiments, the spacing provided by the empty rows in FIG. 2B allows the tasks of installing, electrically wiring, inspecting and otherwise commissioning the PV modules 202 for use to be completed much easier than if the reflectors 204 were in place. After the PV modules 202 have been installed, electrically wired, and otherwise completely prepared for use, the reflectors 204 can then be installed in the empty rows to create reflector rows in place of the empty rows.

Figure 2C:
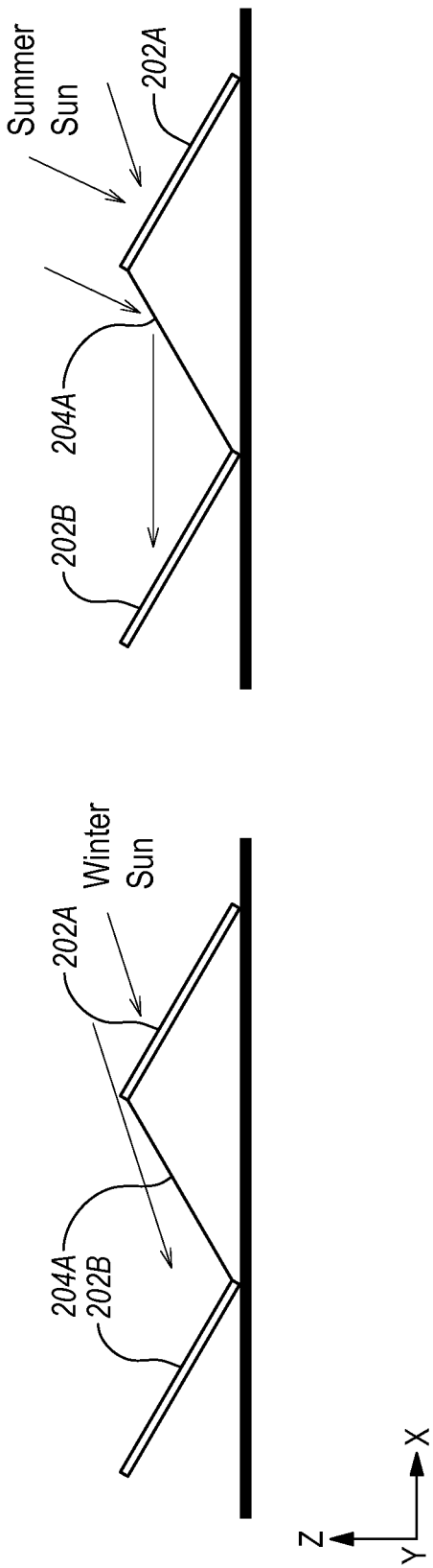
FIG. 2C is a side view of a portion of the solar energy system of FIG. 2A during winter and summer.

FIG. 2C is a side view of a portion of the solar energy system 200 of FIG. 2A during winter and summer, arranged in accordance with at least some embodiments described herein. In particular, FIG. 2C illustrates a side view of the PV modules 202A, 202B and the reflector 204A therebetween. By incorporating the reflector 204A between the PV modules 202A, 202B, the problem of unproductive space, as described with respect to FIG. 1, is eliminated since incoming light that would have landed in the unproductive space is instead reflected by the reflector 204A to the PV module 202B, as illustrated on the right side of FIG. 2C.

The left side of FIG. 2C illustrates that at some times of the year, such as in winter when the incoming light is coming in at a relatively lower angle relative to horizontal, the PV module 202B is partially shaded by the PV module 202A. In these and other embodiments, however, each of the PV modules 202 has a linear power response with respect to illumination area of the PV cells of the corresponding PV module 202. In PV modules 202 having a linear power response with respect to illumination area of the PV cells, any loss of incoming light on any PV cells of the PV module 202 results in a linear decrease in power output of the PV module 202. More generally, in PV modules 202 having a linear power response, any change in illumination intensity across any PV cells of the PV module 202 results in a linear change in power output of the PV module 202.

Figure 2D:
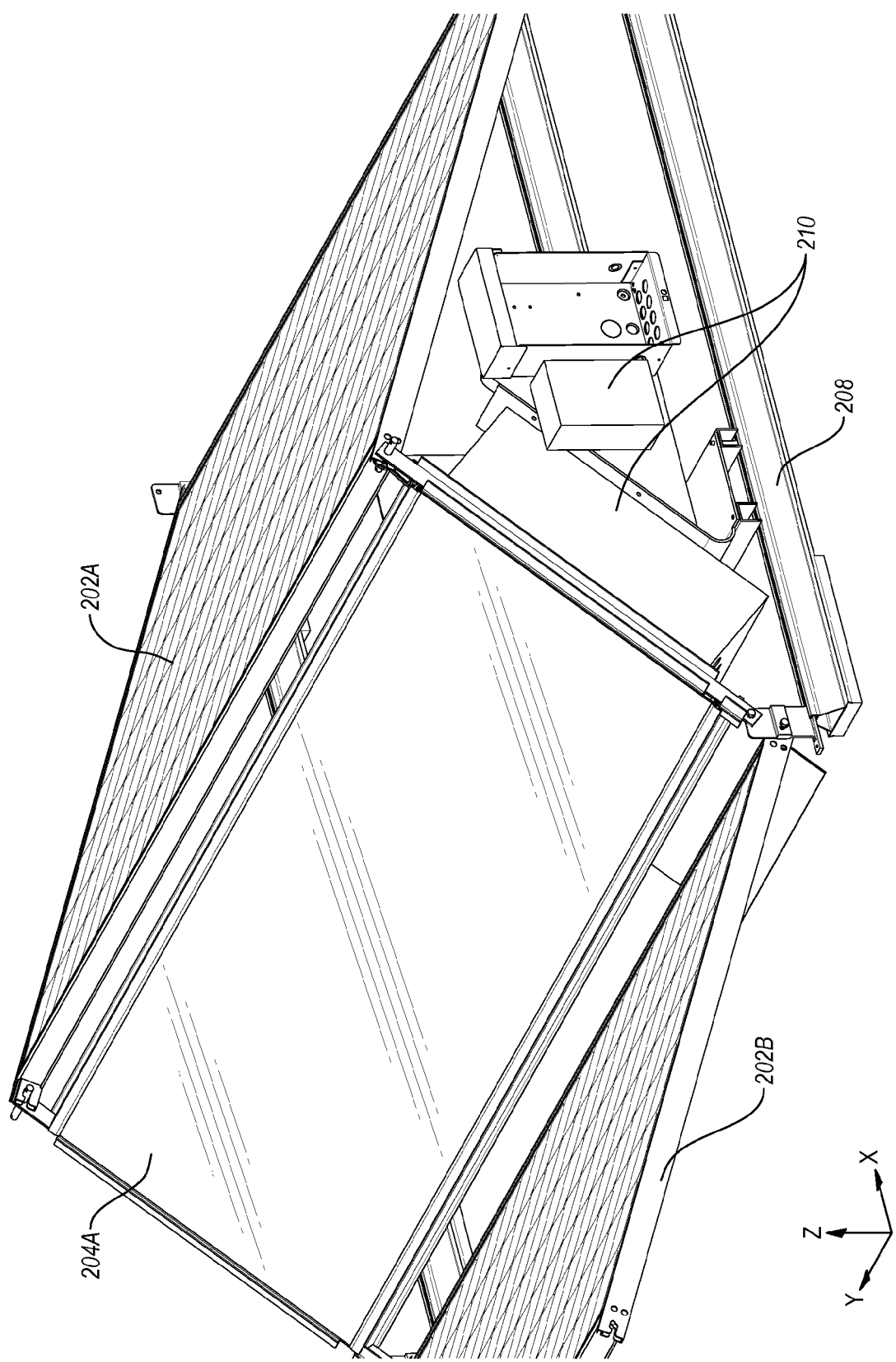
FIG. 2D is a perspective view of a portion of the solar energy system of FIG. 2A.

In some embodiments, the solar energy system 200 further includes one or more inverters or other interconnection devices. For example, FIG. 2D is a perspective view of a portion of the solar energy system 200 of FIG. 2A, arranged in accordance with at least some embodiments described herein. In FIG. 2D, only the PV modules 202A, 202B and the reflector 204A are illustrated for simplicity. FIG. 2D additionally illustrates an optional inverter and/or other interconnection devices 210 that are electrically coupled to the PV modules 202. As illustrated in FIG. 2D, the interconnection devices 210 are also mechanically coupled to the racking assembly 208 and are disposed substantially beneath the PV module 202A and the reflector 204A. In some embodiments, locating the interconnection devices 210 beneath one or more of the PV modules 202 and/or the reflectors 204 at least partially protects the interconnection devices 210 from precipitation and prolonged exposure to sunlight, which may extend the lifetime of the interconnection devices 210.

II. PV Module

Figure 3A:
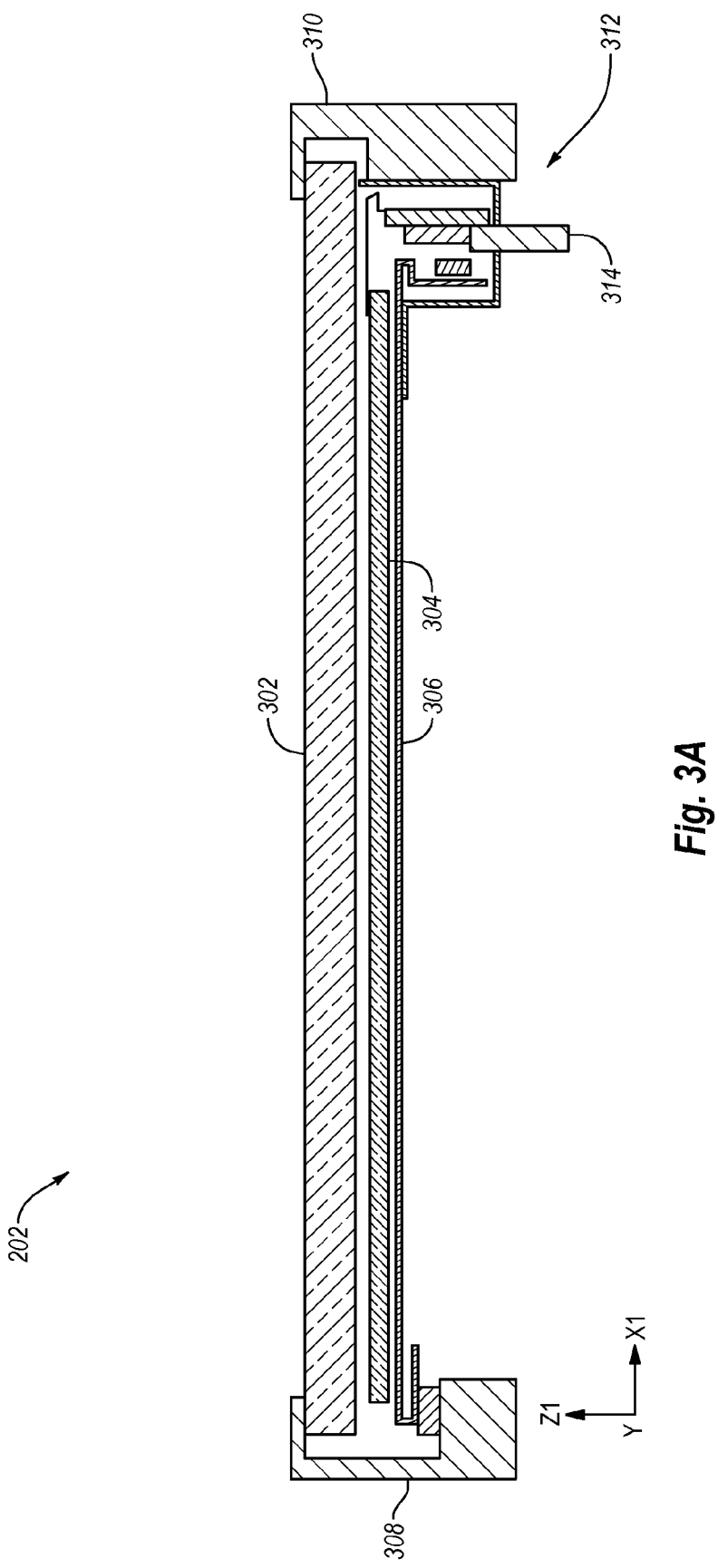
FIG. 3A is a cross-sectional side view of an embodiment of one of the PV modules of FIG. 2A.

FIG. 3A is a cross-sectional side view of an embodiment of one of the PV modules 202 of FIG. 2A, arranged in accordance with at least some embodiments described herein. All of the PV modules 202 of FIG. 2A may be similarly configured.

FIG. 3A includes the Y coordinate axis as well as local coordinate axes X1 and Z1. The X1 and Z1 coordinate axes are in the X-Z plane and are angularly offset about the Y coordinate axis from the X and Z coordinate axes by the angle $\theta 1$ where X1=X-$\theta 1$ and Z1=Z-$\theta 1$ such that a front surface of the PV module 202 is substantially parallel to the X1-Y plane and normal to the Z1 coordinate axis.

As illustrated in FIG. 3A, the PV module 202 includes a substantially transparent front plate 302 disposed in front of a cell layer 304 that includes all of the PV cells of the PV module 202 arranged in an array behind the front plate 302. In FIG. 3A, the PV cells have not been discretely illustrated within the cell layer 304 for simplicity. Other components within FIG. 3A are also illustrated in a simplified form. Accordingly, FIG. 3A illustrates some example aspects of the PV module 202 and not necessarily exact details.

In general, the PV cells within the cell layer 304 may be arranged in rows, where for each row, all of the PV cells are electrically connected in parallel, and where the rows of PV cells are electrically connected in series. In some embodiments, the foregoing configuration of the PV cells within the cell layer 304 enables the linear power response of the PV module 202. Although not required, the PV module 202 may include an array of 60 PV cells, 72 PV cells, 96 PV cells, 120 PV cells, 128 PV cells, 144 PV cells, 192 PV cells, or some other number of PV cells arranged in an array. Alternately or additionally, each of the PV cells is a 5-inch, 6-inch, or 8-inch PV cell, or a PV cell of other suitable dimension. The PV cells may include any suitable solar material.

A conductive backsheet 306 is disposed behind the cell layer 304 and forms a current return path and ground plane for the PV cells of the cell layer 304. The cell layer 304 is sealed between the front plate 302, the conductive backsheet 306, and a frame, including a top frame 308 and a bottom frame 310, all of which cooperate to enclose and protect the cell layer 304 from the environment.

The PV module 202 further includes an undermount assembly 312, which may sometimes be referred to as a "power conversion device" or an "electronics assembly." Two connectors 314 extend from the undermount assembly 312, one of which is a supply or positive line and the other of which is a negative line in some embodiments. Note that only one connector 314 is visible in FIG. 3A; the other connector 314 is spaced apart from the connector 314 visible in FIG. 3A and is positioned either behind or in front of the connector 314 visible in FIG. 3A.

In general, the undermount assembly 312 includes multiple converter circuits (or converters) that are electrically coupled to a last row of the PV cells in the cell layer 304. The converters are generally configured to provide power conditioning of the electrical power generated by the PV cells within the cell layer 304. In some embodiments, "power conditioning" includes stepping up the voltage to a predetermined output voltage; maintaining maximum peak power within the PV cells of the cell layer 304; reducing current ripple at an input and output of the undermount assembly 312; detecting, monitoring, and maintaining a programmed charge profile for one or more batteries directly connected to the output of the undermount assembly 312; and/or maintaining a constant voltage source for a battery-less grid tie inverter. By implementing an undermount assembly 312 in each of the PV modules 202 in the solar energy system 200, each of the PV modules 202 independently controls its own power conditioning to maximize efficiency of the solar energy system 200.

Additional aspects of some example PV modules that may be implemented in the solar energy system 200, including aspects regarding the PV cells, undermount assembly, etc., are disclosed in U.S. patent application Ser. No. 13/664,885, filed Oct. 31, 2012, titled CELL-TO-GRID REDUNDANT PHOTOVOLTAIC SYSTEM, which application is incorporated by reference herein. In these and other embodiments, the PV modules 202 may lack or omit bypass diodes as the electrical architecture described in the foregoing application allows current to flow around "blocked" PV cells such that bypass diodes are unnecessary.

Figure 3B:
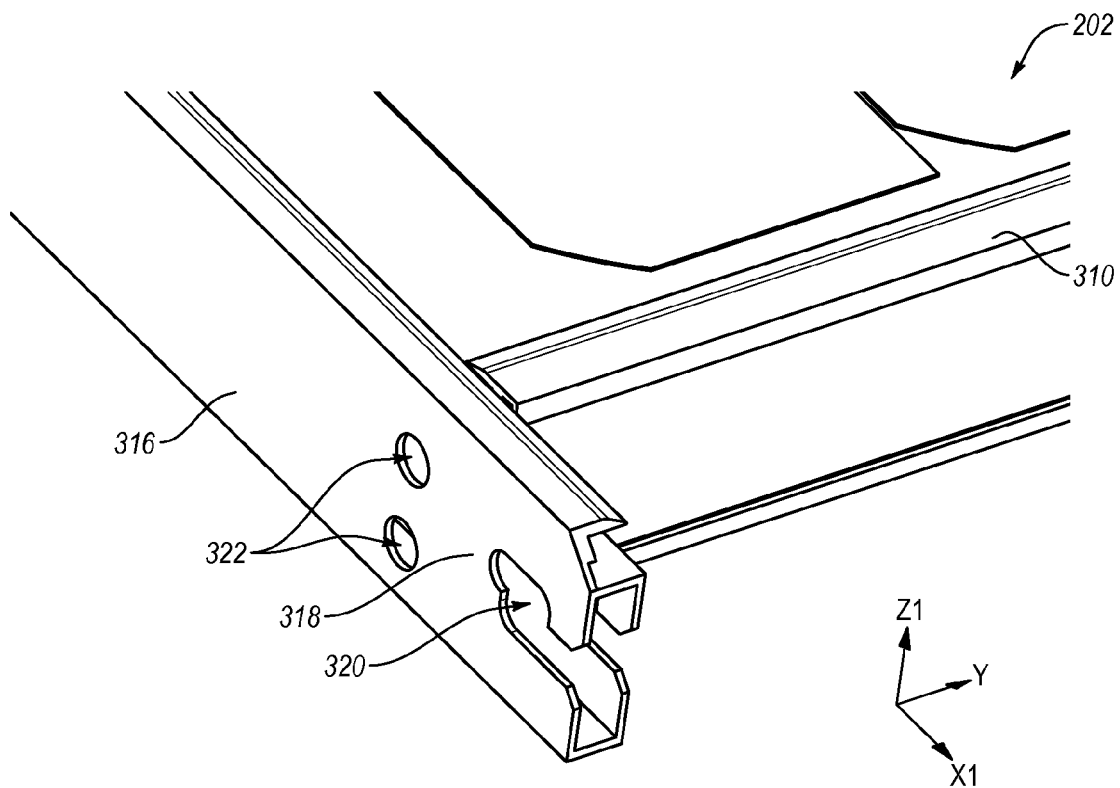
FIG. 3B is a perspective view of a lower corner of one of the PV modules of FIG. 2A.

FIG. 3B is a perspective view of a lower corner of one of the PV modules 202 of FIG. 2A, arranged in accordance with at least some embodiments described herein. With combined reference to FIGS. 3A-3B, some of the PV cells of the cell layer 304 (FIG. 3A) are visible in FIG. 3B through the transparent front plate 302 (FIG. 3A). FIG. 3B additionally illustrates the bottom frame 310 and one of two side frames 316 that are included with the top frame 308 and the bottom frame 310 as part of the complete frame for the PV module 202.

As illustrated in FIG. 3B, the side frame 316 includes an extension 318 at the illustrated lower corner of the PV module 202. The extension 318 defines a double dogleg slot 320. Similar extensions with double dogleg slots may be provided at the other lower corner and at the two upper corners of the PV module 202. In the discussion that follows, the extensions from the side frames 316 are all referred to using reference number 318, and the double dogleg slots defined in each extension 318 are all referred to using reference number 320.

At each of the four corners of the PV module 202, a fastener, such as a pin, is received through the corresponding double dogleg slot 320 to couple the corresponding corner of the PV module 202 to the racking assembly 208. A diameter of the pin inserted into each double dogleg slot 320 may be sufficiently large to prevent the pin from being removed in the X1 direction (positive or negative) from the double dogleg slot 320. A plastic insert is used in some embodiments, at least at the two lower corners, to prevent the extensions 318 at the lower corners of the PV module 202 (hereinafter "lower extensions") from being crushed and to ensure the fastener remains within the double dogleg slot 320. Details regarding an example plastic insert are disclosed in U.S. patent application Ser. No. 13/207,164 already incorporated by reference herein.

The side frame 316 illustrated in FIG. 3B additionally defines two through holes 322 at the illustrated lower corner of the PV module 202. Similar through holes may be provided in the illustrated side frame 316 at one of the upper corners of the PV module 202 and in the other side frame 316 at the other lower and upper corners of the PV module 202. In the discussion that follows, the through holes in the side frames 316 are all referred to using reference number 322. In general, a fastener such as a screw may be received through each of the though holes 322 to secure the side frame 316 to the bottom frame 310 at the lower corners, or to the top frame 308 at the upper corners.

Figure 3C:
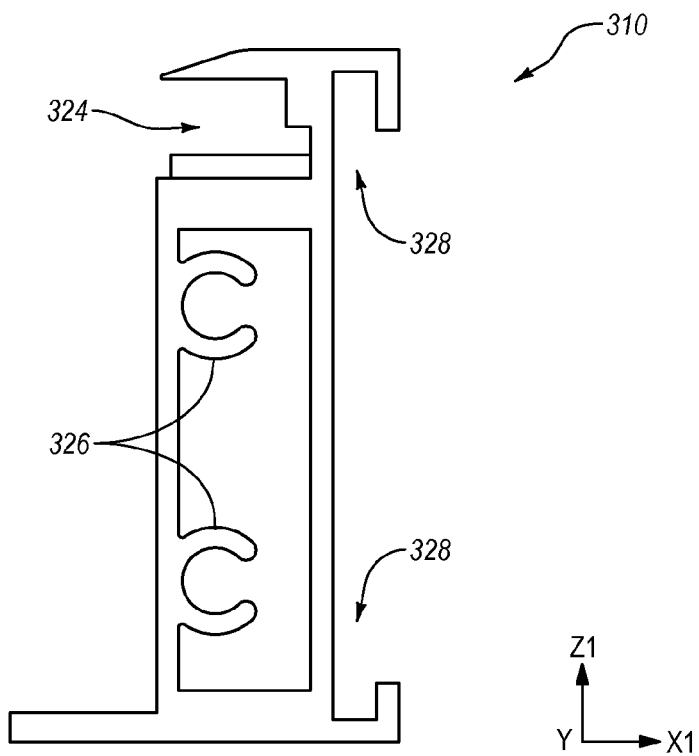
FIG. 3C is a cross-sectional view of a bottom frame of the PV module of FIGS. 3A-3B.

FIG. 3C is a cross-sectional view of the bottom frame 310 of FIGS. 3A-3B in a plane parallel to the X1-Z1 plane, arranged in accordance with at least some embodiments described herein. The top frame 308 may have a similar or different cross-sectional configuration. As illustrated, the bottom frame 310 includes a first slot 324 substantially running a length (e.g., the dimension in the Y direction) of the bottom frame 310. Edges of at least some of the layers illustrated in FIG. 3A, including the front plate 302, the cell layer 304, and/or the conductive backsheet 306, are received within the first slot 324.

The bottom frame 310 additionally includes tapped or self-tapping semi-cylinders (hereinafter "semi-cylinders") 326. The semi-cylinders 326 are configured to receive and be engaged by the fasteners inserted through the through holes 322 of the side frame 316 to secure the side frame 316 to the bottom frame 310. Thus, the semi-cylinders 326 may be provided at least at each end of the bottom frame 310.

The bottom frame 310 further defines a second slot 328. The second slot 328 may be configured to receive one or more secondary structural members that are slid into the second slot 328 partially or completely along its length to assist in supporting the PV module 202 under load.

III. Racking Assembly

Figure 4A:
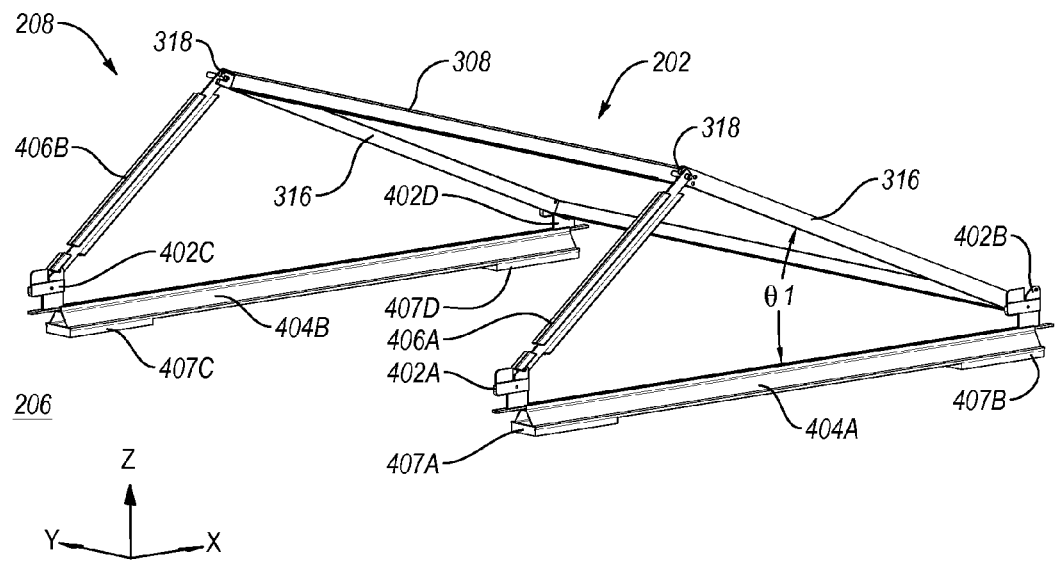
FIG. 4A is a perspective view of a portion of a racking assembly included in the solar energy system of FIG. 2A.

Turning next to FIGS. 4A-7B, additional aspects of the racking assembly 208 of FIG. 2A are disclosed. FIG. 4A is a perspective view of a portion of the racking assembly 208 of FIG. 2A, arranged in accordance with at least some embodiments. FIG. 4A additionally illustrates one of the PV modules 202 of FIG. 2A mechanically coupled to the racking assembly 208.

The racking assembly 208 includes multiple fins 402A-402D (collectively "fins 402"), multiple rails 404A-404B (collectively "rails 404"), multiple struts 406A-406B (collectively "struts 406"), and multiple pads 407A-407D (collectively "pads 407"). The rails 404 are arranged parallel to each other and generally run perpendicular to the rows of PV modules 202 and the rows of reflectors 204. For example, with combined reference to FIGS. 2A and 4A, the rails 404 are generally aligned parallel to the X coordinate axis while the rows of PV modules 202 and the rows of reflectors 204 are generally aligned parallel to the Y coordinate axis.

The fins 402 are coupled between the rails 404 and the lower extensions 318 (FIG. 3B) of the PV modules 202. For example, in FIG. 4A, the fin 402B is coupled between the rail 404A and one of the lower extensions 318 (not visible in FIG. 4A) of the PV module 202 and the fin 402D is coupled between the rail 404B and the other of the lower extensions 318 (not visible in FIG. 4A) of the PV module 202. When the PV module 202 is in a row of PV modules with another PV module 202 on either or both sides of the illustrated PV module 202, each of the fins 402B or 402D may additionally be coupled between the corresponding rail 404A or 404B and a lower extension of a corresponding one of the other PV modules 202.

The fins 402A, 402C may similarly be coupled between the rails 404A, 404B and lower extensions of one or more corresponding PV module(s) 202 in a next row of PV modules 202, although such PV module(s) 202 are not illustrated in FIG. 4A for simplicity.

The struts 406 are generally coupled between the fins 402 and upper extensions 318 of the PV modules 202, e.g., the extensions 318 described with respect to FIG. 3B, at the upper corners of the PV module 202. More particularly, and as illustrated in FIG. 4A, the strut 406A is coupled between the fin 402A and one of the upper extensions 318 of the PV module 202, and the strut 406B is coupled between the fin 402C and the other of the upper extensions 318 of the PV module 202. Each of the struts 406 supports the PV module 202 at the angle θ1. Although not illustrated in FIG. 4A, each reflector 204 is coupled to and supported by a different pair of the struts 406 at the angle θ2, as described in more detail below.

The racking assembly 208 includes a different pair of struts 406 that support each PV module 202 and reflector 204. Accordingly, in some embodiments, each strut 406 within an interior of the solar energy system 200 may support two PV modules 202 and two reflectors 204, each strut 406 located along an east or west edge of the solar energy system 200 may support a single PV module 202 and a single reflector 204, each strut 406 located along a north or south edge of the solar energy system 200 may support two PV modules 202 or two reflectors 204, and each strut 406 located at one of the four corners of the solar energy system 200 may support a single PV module 202 or a single reflector 204. For struts 406 in the interior of the solar energy system 200, for instance, the strut 406A and the strut 406B are one pair of struts that support the illustrated PV module 202. Additionally, the strut 406A may be paired with a different strut 406 to support another PV module 202 to one side of the illustrated PV module 202, while the strut 406B may be paired with yet another different strut 406 to support another PV module 202 to the other side of the illustrated PV module 202.

The pads 407 are optional. When included in the racking assembly 208, the pads 407 are intermittently located between the rails 404 and the installation surface 206. In general, the pads 407 are configured to increase a coefficient of static friction between the solar energy system 200 and the installation surface 206 compared to installing the solar energy system 200 without the pads 407. Accordingly, the pads 407 may include a compliant material(s) with a relatively high coefficient of static friction. For instance, the pads 407 may include ethafoam, recycled rubber, or other suitable material(s).

Figure 4B:
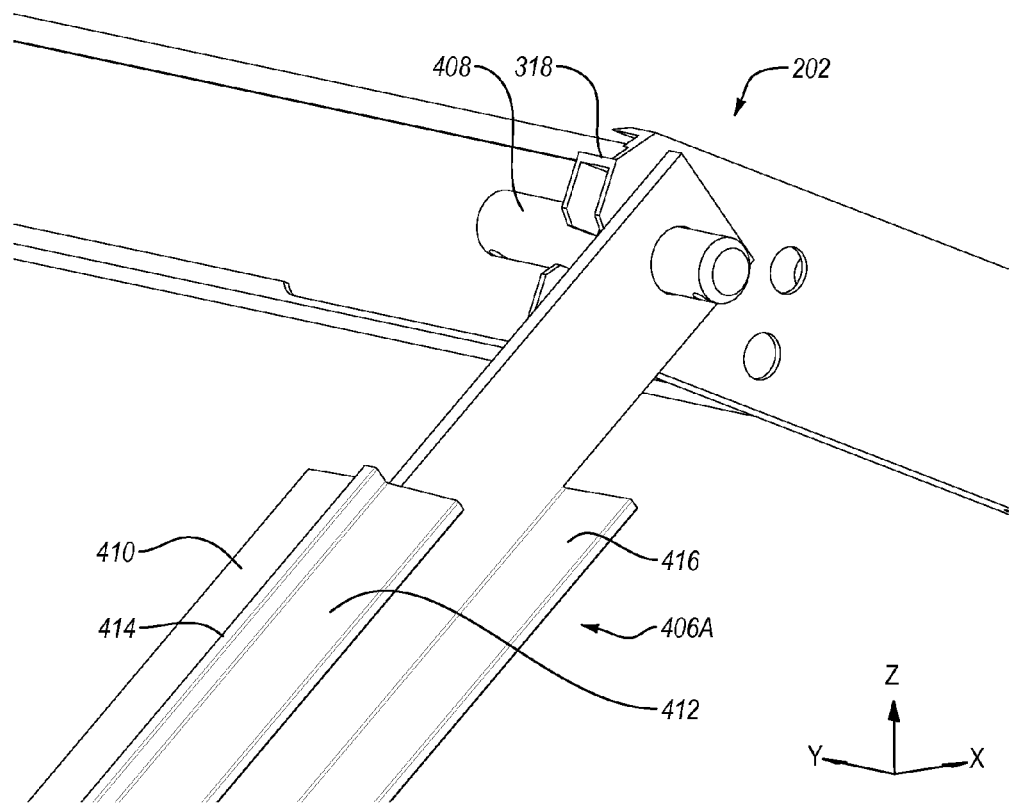
FIG. 4B is a detail perspective view of a portion of FIG. 4A.

FIG. 4B is a detail perspective view of a portion of FIG. 4A, arranged in accordance with at least some embodiments. With combined reference to FIGS. 3B and 4B, details regarding an example connection between the upper extension 318 of the PV module 202 and the strut 406A disclosed. In particular, FIG. 4B illustrates that the racking assembly 208 further includes a pin 408 or other fastener mechanically coupling an upper end of the strut 406A to the upper extension 318 of the PV module 202. Optionally, the upper extension 318 of an adjacent PV module 202 (not shown) can also be coupled to the strut 406A by the pin 408. Similar pins 408 may be provided for coupling an upper end of other struts 406 to the upper extensions 318 of other PV modules 202 and/or for coupling the lower extensions 318 of the PV modules 202 to the fins 402.

In some embodiments, one end of the pin 408 may be enlarged or oversized and/or the other end of the pin 408 may be configured to receive or be coupled to a cotter pin or other stopping element. The enlarged end of the pin 408 and the cotter pin or other stopper may confine the pin 408 in the Y direction to prevent the pin 408 from inadvertently sliding out of the double dogleg slot 320 (FIG. 3B) in the upper extension 318 and a through hole defined in the upper end of the strut 406A.

FIG. 4B additionally illustrates some aspects of the strut 406A. The other struts 406 in the racking assembly 208 may be similarly configured. As shown, the strut 406A includes a first flange 410, a second flange 412, a ridge 414, and a third flange 416. The first flange 410 and the second flange 412 are provided on opposite sides of the strut 406A at least partially along a length of the strut 406A. The ridge 414 is also provided at least partially along the length of the strut 406A where the first flange 410 and the second flange 412 extend away from the strut 406A on opposite sides of the ridge 414. The third flange 416 is paired with a fourth flange (not shown) along an edge of the strut 406A opposite the edge on which the first flange 410 and the second flange 412 are provided. Additional details regarding the foregoing and other features and aspects of the strut 406A are provided below.

With combined reference to FIGS. 2A and 4A-4B, the mechanical interconnections in the solar energy system 200 provided by the racking assembly 208 configure the solar energy system 200 with a nonlinear resistive force versus displacement profile. For example, some spacing may be provided between the PV modules 202, the reflectors 204, and/or the racking assembly 208 where the PV modules 202 (and the reflectors 204) connect to the racking assembly 208, e.g., at the extensions 318 of the side frames 316. The spacing provides the PV modules 202 with some relatively uninhibited range of motion until the spacing closes, whereupon resistance of the solar energy system 200 to displacement increases significantly, such that the resistive force versus displacement of the solar energy system 200 is nonlinear. Details regarding example aspects of a solar energy system and/or racking assembly that provide for a nonlinear resistive force versus displacement profile are disclosed in U.S. patent application Ser. No. 13/207,164 already incorporated by reference herein, which aspects are shared in some embodiments by the solar energy system 200 and/or racking assembly 208 described herein. Alternately or additionally, the solar energy system 200 may tolerate surface unevenness of the installation surface 206 up to a predetermined surface unevenness. In some embodiments, the predetermined surface unevenness is in a range from one-eighth of an inch per linear foot up to one-half of an inch per liner foot.

Figure 4C:
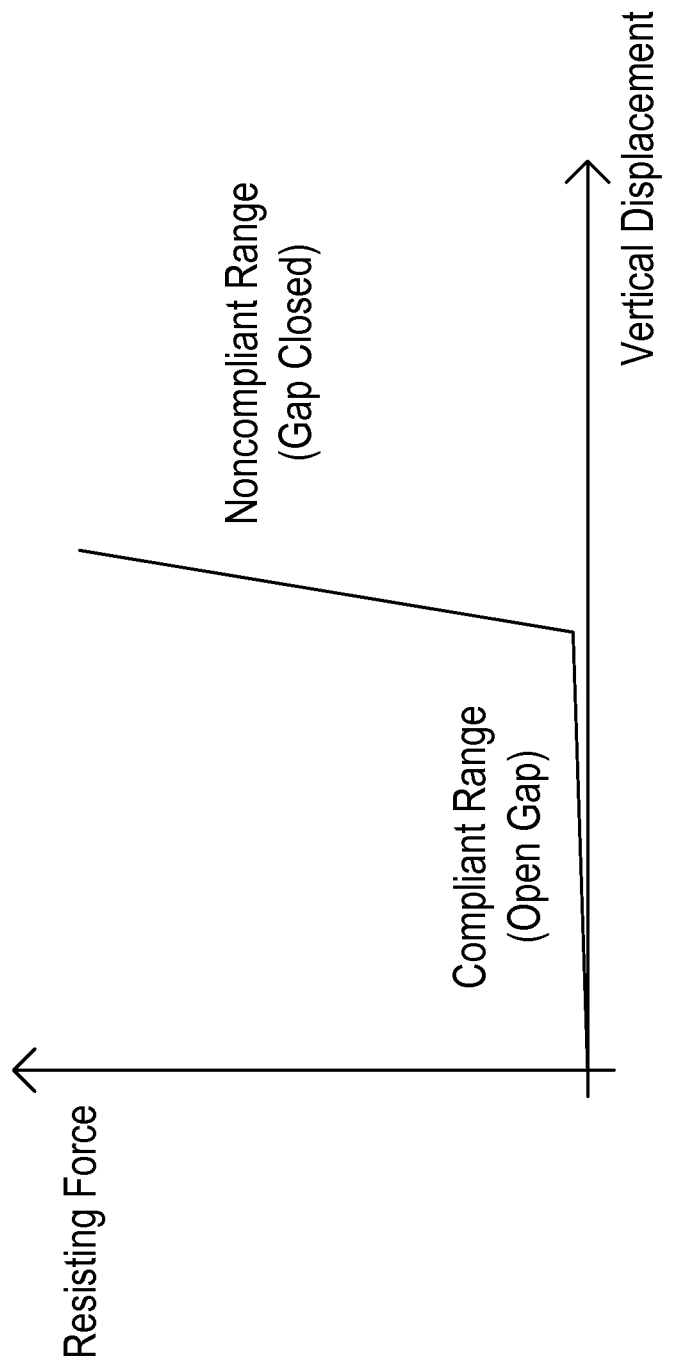
FIG. 4C is an example force versus displacement profile (hereinafter "profile") for the solar energy system of FIG. 2A.

FIG. 4C is an example force versus displacement profile (hereinafter "profile") for the solar energy system 200 of FIG. 2A, arranged in accordance with at least some embodiments described herein. In more detail, FIG. 4C illustrates an example of the resistive force of the solar energy system 200 as a function of vertical displacements, e.g., displacements in a direction normal to the installation surface 206. The slope of the profile may correspond to the stiffness of the solar energy system 200. In the illustrated embodiment, the solar energy system 200 has a compliant range with relatively low stiffness (e.g., low slope) for displacements in a direction orthogonal to the installation surface 206 up to a predetermined threshold, and a noncompliant range with sharply increasing stiffness (e.g., high slope) for displacements greater than the predetermined threshold. The predetermined threshold may correspond to a displacement of a component (or components) relative to another component (or components) that causes a gap (or gaps) to at least partially close and contact points associated with that gap (or gaps) to come in contact with each other. Until a gap has been closed, components on either side of the gap can move relative to each other with little resistance; however, after a gap has been closed and the associated contact points are in contact with each other, the stiffness of the individual components prevents, or at least significantly inhibits, further movement.

Figure 5A:
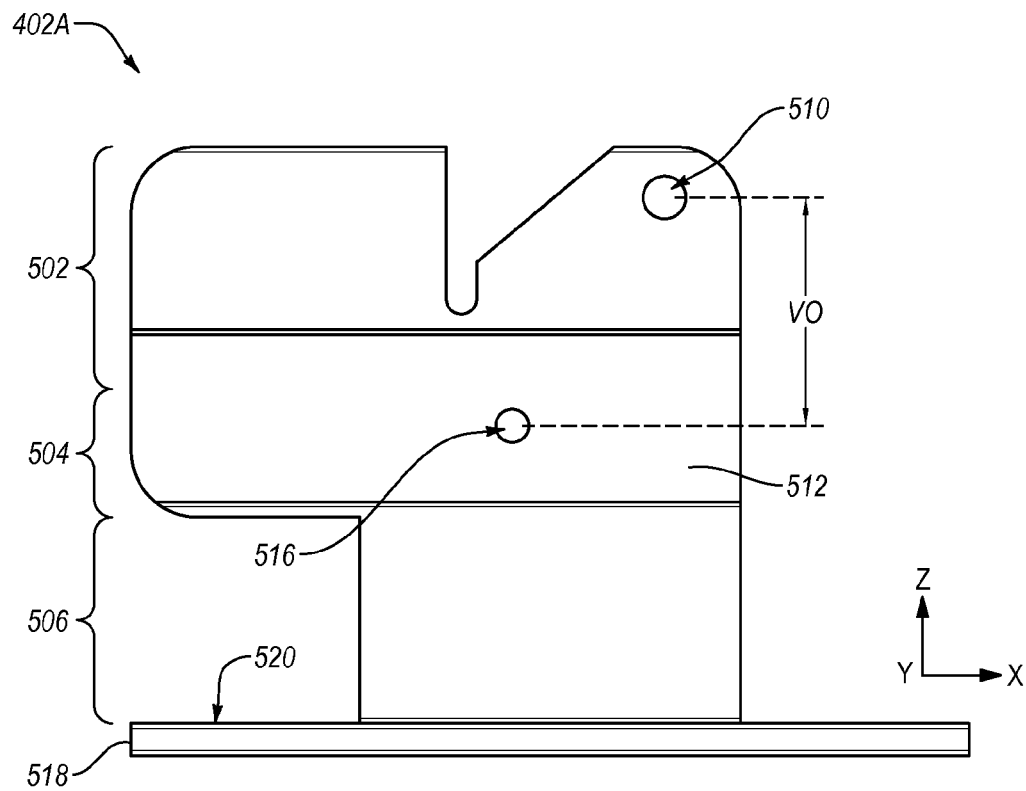
FIG. 5A is an elevation view of a fin included in the racking assembly of FIG. 2A.
Figure 5B:
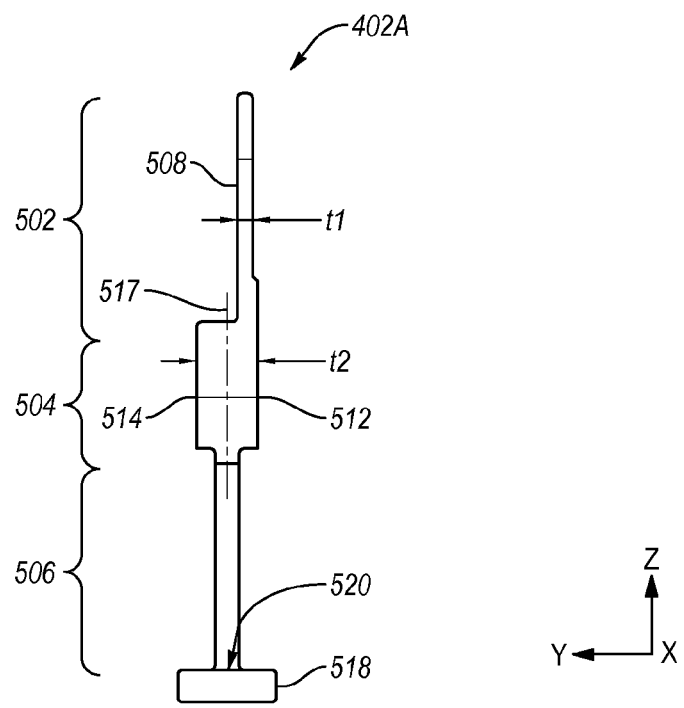
FIG. 5B is an end view of the fin of FIG. 5A.

FIG. 5A is an elevation view of the fin 402A included in the racking assembly 208 of FIG. 2A, arranged in accordance with at least some embodiments described herein. FIG. 5B is an end view of the fin 402A of FIG. 5A, arranged in accordance with at least some embodiments described herein. The other fins 402 in the racking assembly 208 may be similarly configured as the fin 402A and as now described with combined reference to FIGS. 5A-5B.

The fin 402A includes an upper section 502, a middle section 504, and a lower section 506. The upper section 502 includes a first side 508 (FIG. 5B only) and defines a first through hole 510 (FIG. 5A only). The through hole 510 receives a pin or other fastener, such as the pin 408, that secures the bottom end of the strut 406A to the fin 402A on the first side 508 of the fin 402A.

The middle section 504 includes opposing sides 512 (FIG. 5A only) and 514 and defines a second through hole 516 (FIG. 5A only). The through hole 516 receives a pin or other fastener, such as the pin 408, that secures at least one lower extension 318 of one PV module 202 to the fin 402A on one of the opposing sides 512, 514. In some embodiments, the pin or other fastener additionally secures a lower extension 318 of a different PV module 202 to the fin 402A on the other of the opposing sides 512, 514.

In some embodiments, a thickness t1 (FIG. 5B only) of the upper section 502 is less than a thickness t2 (FIG. 5B only) of the middle section 504. In this and other embodiments, the side 508 of the upper section 502 is laterally offset from a reference plane 517 centered between the opposing sides 512, 514 of the middle section 504. Accordingly, when a PV module 202 is coupled to the fin 402A on both of the opposing sides 512, 514 and a strut 406 is coupled to the fin 402A on the side 508, the lower end of the strut 406 may be nominally centered laterally between lower ends of the PV modules 202 having corresponding lower extensions coupled to the fin 402A on the opposing sides 512, 514 of the middle section 504.

The lower section 506 couples the middle section 504 to a base 518 of the fin 402A. In some embodiments, the base 518 defines a tapped or self-tapping hole generally denoted at 520 (hereinafter "tapped hole 520"). The tapped hole 520 is configured to receive a screw, bolt, or other fastener to secure the fin 402A to the rail 404A, as described in more detail with respect to FIG. 6.

As described in more detail below, the struts 506 coupled to the fins 402 via corresponding first through holes 510 support the reflectors 204. As illustrated in FIG. 5A, the first through hole 510 is vertically offset from the second through hole 516, denoted VO in FIG. 5A. The vertical offset VO in some embodiments results in a lower edge of a corresponding reflector 204 coupled to the fin 402A via the first through hole 510 being vertically offset upwards from a lower edge of a corresponding PV module 202 coupled to the fin 402A via the second through hole 516. As a result, at least some incoming illumination with a relatively low angle that would otherwise reflect off the reflector 204 near its lower edge and miss the PV module 202 entirely in the absence of the vertical offset VO is reflected onto the PV module 202 instead, e.g., near the lower edge of the PV module 202.

Figure 6:
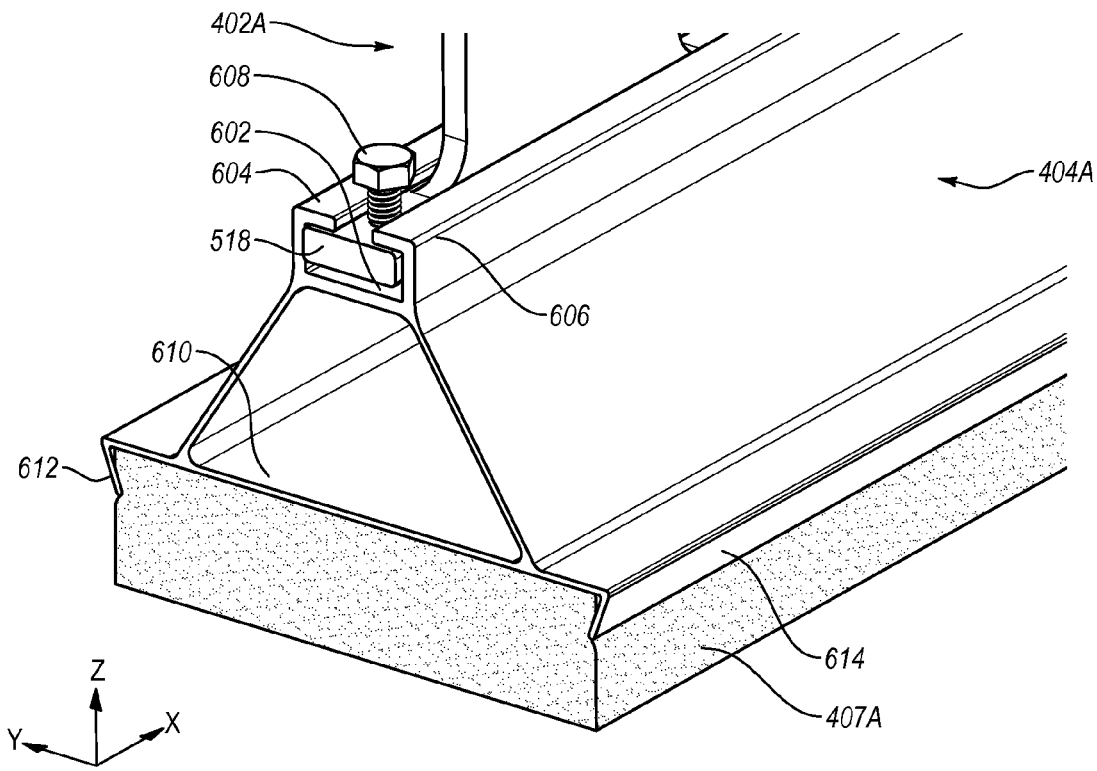
FIG. 6 is a perspective view of a rail included in the racking assembly of FIG. 2A.

FIG. 6 is a perspective view of the rail 404A included in the racking assembly 208 of FIG. 2A, arranged in accordance with at least some embodiments described herein. The other rails 404 in the racking assembly 208 may be similarly configured as the rail 404A and as now described with reference to FIG. 6. The rail 404A has a substantially triangular or trapezoidal cross-sectional shape; rails 404 having the illustrated triangular or trapezoidal cross-sectional shape may be referred to as delta rails. Delta rails may have better rotational torsion and bending stiffness than rails with some other cross-sectional shapes and/or may have lower wind drag than rails with some other cross-sectional shapes. Alternately, rails used in the racking assembly 208 may have other cross-sectional shapes, such as substantially circular cross-sectional shapes as described with respect to FIG. 7A.

The rail 404A includes an upper surface 602 and two lips 604, 606 along a length of the rail 404A. The lips 604, 606 extend upward from the upper surface 602 and partially overhang the upper surface 602. Thus, the lips 604, 606 may be referred to herein as "overhanging lips." The upper surface 602 and the overhanging lips 604, 606 define a channel (not labeled) that extends a length of the rail 404A.

FIG. 6 additionally illustrates the fin 402A. In the illustrated embodiment, the base 518 of the fin 402A has a shape that is complementary to a shape of the channel defined by the upper surface 602 and the overhanging lips 604, 606. Thus, the base 518 of the fin 402A is inserted into the channel of the rail 404A where the upper surface 602 and the overhanging lips 604, 606 of the rail 404A generally confine the fin 402A in the Z direction and the Y direction while allowing the fin 402A to move with respect to the rail 404A in the X direction. After positioning the fin 402A anywhere along the rail 404A (e.g., in the X direction) as desired, a bolt 608 threadably engages the tapped hole 520 (not shown in FIG. 6) in the base 518 of the fin 402A, e.g., by "screwing" it or otherwise advancing it into the tapped hole 520.

As the bolt 608 is advanced into and through the tapped hole 520 in the negative Z direction, it eventually contacts the upper surface 602 of the rail 404A. The upper surface 602 prevents the bolt 608 from advancing further in the negative Z direction. Thus, continued screwing of the bolt 608 within the tapped hole 520 with the bolt 608 confined in the negative Z direction causes the base 518, and thus the fin 402A, to move in the positive Z direction until the base 518 is biased by the bolt 608 against the overhanging lips 604, 606 of the rail 404A. Friction between the bolt 608 and the upper surface 602 and between the base 518 and the overhanging lips 604, 606 secures the fin 402A to the rail 404A. Optionally, a star washer may be provided around the bolt 608 and positioned between the overhanging lips 604, 606 and a top surface of the base 518 of the fin 402A. Although described as using a single bolt 608 to secure the fin 402A to the rail 404A, in other embodiments the base 518 may include two or more tapped holes 520 where two or more bolts 608 are used to secure the fin 402A to the rail 404A.

FIG. 6 additionally illustrates the pad 407A. In the illustrated embodiment, a base 610 of the rail 404A includes opposing jaws 612, 614 or other features that engage the pad 407A and substantially prevent movement of the rail 404A with respect to the pad 407A, at least in the Y and Z directions. Optionally, one or more detaining members may be disposed between the rail 404A and the pad 407A to prevent translational movement of the rail 404A with respect to the pad 407A in the X direction. The detaining members may include, but are not limited to, compliant rubber or plastic bump-ons with silicone or acrylic adhesive for attachment which penetrate the pad 407A and prevent movement of the rail 404A with respect to the pad 407A in the X direction.

Figure 7A:
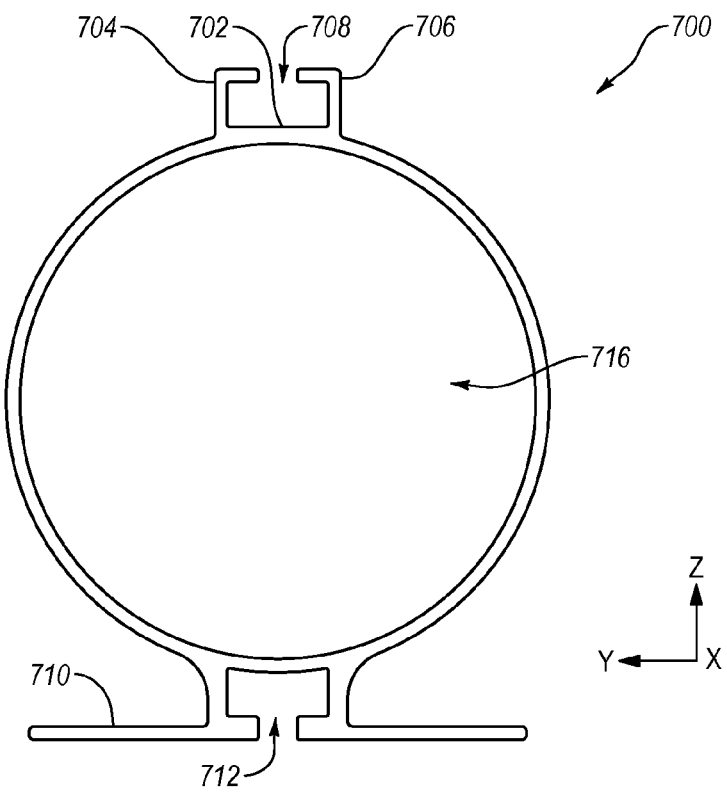
FIG. 7A is a cross-sectional view of a rail that may be used in the racking assembly of FIG. 2A.

FIG. 7A is a cross-sectional view of a rail 700 that may be used in the racking assembly 208 of FIG. 2A, arranged in accordance with at least some embodiments described herein. For example, the racking assembly 208 may include multiple rails 700 rather than or in addition to the rails 404A described above. As illustrated in FIG. 7A, the rail 700 has a substantially circular cross-sectional shape.

The rail 700 further includes an upper surface 702 and overhanging lips 704, 706 that are analogous to the upper surface 602 and the overhanging lips 604, 606, respectively, of FIG. 6. In particular, the upper surface 702 and the overhanging lips 704, 706 define a channel 708 configured to receive a base of a corresponding fin, such as the base 518 of the fin 402A, to secure the fin to the rail 700. Additionally, the rail 700 includes a base 710 configured to support the rail 700 on an installation surface or structure. Optionally, the base 710 defines a bottom channel 712 configured to receive complementary components of an installation structure as described with respect to FIG. 7B to mechanically couple the rail 700 to the installation structure.

Figure 7B:
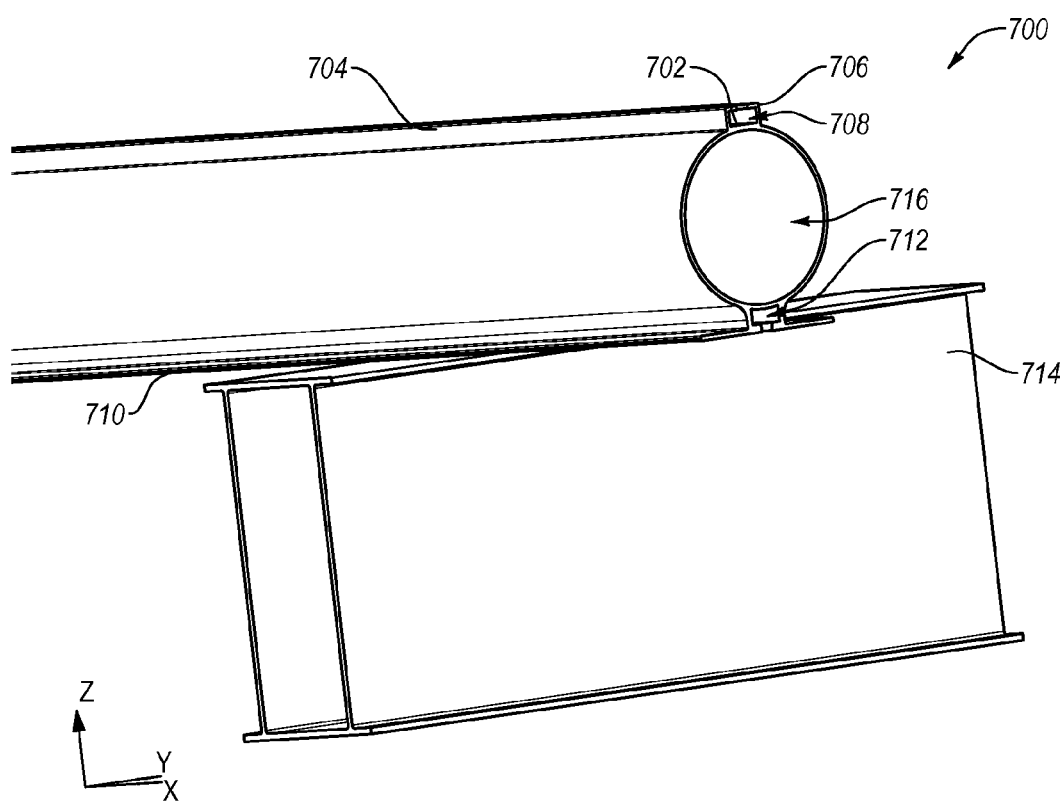
FIG. 7B is a perspective view of the rail of FIG. 7A mechanically coupled to a support of an installation structure.

FIG. 7B is a perspective view of the rail 700 of FIG. 7A mechanically coupled to a support 714 of an installation structure, arranged in accordance with at least some embodiments described herein. Although not visible in FIG. 7B, the support 714 may include, in some embodiments, one or more protrusions or other components with a cross-sectional shape that is complementary to the cross-sectional shape of the bottom channel 712 such that the one or more protrusions or other components can be received into the bottom channel 712 to mechanically couple the rail 700 to the support 714. In other embodiments, the base 710 of the rail 700 supports the rail 700 on the support 714 without any protrusions or other components of the support 714 being received in the bottom channel 712.

As illustrated in FIGS. 7A-7B, the rail 700 defines a substantially cylindrical cavity 716 that extends a length of the rail 700. In some embodiments, a diameter of the cylindrical cavity 716 is consistent with or complementary to an external diameter of some conventional extrusions used in the pipe fitting and tubing industries. As an example, the cavity 716 may be sized to receive a 4" Schedule 10 aluminum pipe. Each conventional extrusion may be installed to extend from the cylindrical cavity 716 of one rail 700 into the cylindrical cavity 716 of a another longitudinally aligned rail 700 such that the conventional extrusion functions as a slide-in connector between the two aligned rails 700. Thus, bending moments may be passed through the slide-in connector.

IV. Reflector

Figure 8A:
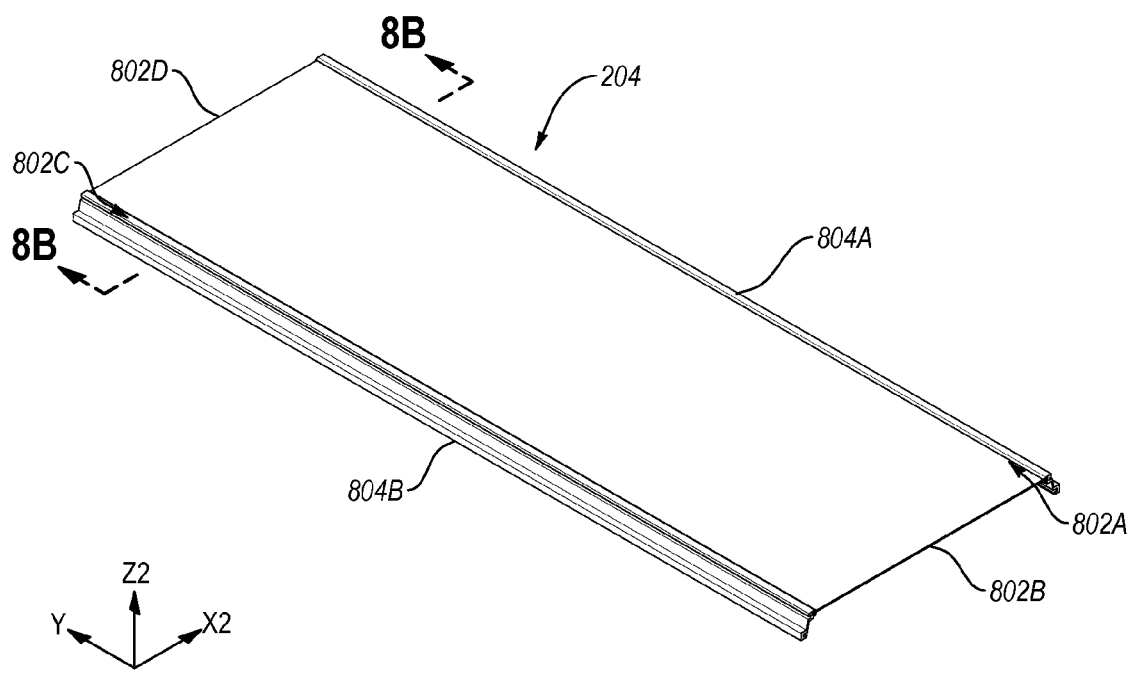
FIG. 8A is a perspective view of an embodiment of one of the reflectors of FIG. 2A.

FIG. 8A is a perspective view of an embodiment of one of the reflectors 204 of FIG. 2A, arranged in accordance with at least some embodiments described herein. FIG. 8B is a cross-sectional view of the reflector 204 at a cutting plane 8B-8B of FIG. 8A, arranged in accordance with at least some embodiments described herein. All of the reflectors 204 described herein may be similarly configured.

FIGS. 8A and 8B include the Y coordinate axis as well as local coordinate axes X2 and Z2. The X2 and Z2 coordinate axes are in the X-Z plane and are angularly offset about the Y coordinate axis from the X and Z coordinate axes by the angle θ2, e.g., X2=X+θ2 and Z2=Z+θ2, such that a front surface of the reflector 204 is substantially parallel to the X2-Y plane and normal to the Z2 coordinate axis.

With combined reference to FIGS. 8A-8B, the reflector 204 includes an upper edge 802A, a first side edge 802B (FIG. 8A), a lower edge 802C, and a second side edge 802D (FIG. 8A) that collectively define a perimeter of the reflector 204. Although not required, in some embodiments, the length of the reflector 204, e.g., its dimension in the Y direction, is in a range from about 4 feet to about 7 feet, and the width of the reflector 204, e.g., its dimension in the X2 direction, is in a range from about 1.5 feet to about 5 feet.

The reflector 204 is supported by an upper stiffener 804A and a lower stiffener 804B (collectively "stiffeners 804"). The reflector 204 and stiffeners 804 may be referred to herein as an "assembly 204/804." The upper stiffener 804A supports the upper edge 802A of the reflector 204. The lower stiffener 804B supports the lower edge 802C of the reflector 204. The stiffeners 804 may be mechanically coupled to the reflector 204 using, e.g., screws, bolts, butyl rubber, acrylic adhesive tape, silicone, or other dispensed adhesive, or the like or any combination thereof. In some embodiments, the stiffeners 804 support the reflector 204 to prevent excessive sagging of the reflector 204 and/or protect its upper and lower edges 802A, 802C from hail and/or other flying debris. In general, the stiffeners 804 are coupled between a corresponding pair of struts 406 (FIG. 4A) to support the reflector 204 at the angle θ2 (FIG. 2A).

As best illustrated in FIG. 8B, each of the stiffeners 804 has a same cross-sectional shape, whether implemented as the upper stiffener 804A or the lower stiffener 804B. Indeed, all stiffeners 804 in the solar energy system 200 described herein may be substantially identical such that they may be used interchangeably as an upper stiffener 804A or a lower stiffener 804B depending on whether installed on an upper edge 802A or lower edge 802C of a corresponding reflector 204. In other embodiments, the upper stiffener 804A is different than the lower stiffener 804B.

With continued reference to FIG. 8B, each of the stiffeners 804 includes a reflector slot (not labeled) extending the length of the stiffener 804 and within which the corresponding upper edge 802A or lower edge 802C of the reflector 204 is received. The stiffeners 804 are coupled to the corresponding upper edge 802A or lower edge 802C of the reflector 204 using one or more of tape 806A, 806B, silicone adhesive 808A, 808B, pins, clips, screws, bolts, or other suitable adhesives or fasteners.

Each of the stiffeners 804 further defines an upper slot 810A, 810B (collectively "upper slots 810") and a lower slot 812A, 812B (collectively "lower slots 812"). In the illustrated embodiment, the upper slots 810 and lower slots 812 extend the entire length of the stiffeners 804. In other embodiments, the upper slots 810 and lower slots 812 are provided only at some locations along the length of the stiffeners 804, such as near the ends. Alternately or additionally, the lower slot 812B may be omitted from the lower stiffener 804B, and/or the upper slot 810A may be omitted from the upper stiffener 804A.

The upper slot 810B of the lower stiffener 804B is configured to receive therein at least a portion of the corresponding first flange 410 (FIG. 4B) or second flange 412 (FIG. 4B) of each strut 406 in a pair of struts 406 to couple the lower stiffener 804B between the pair of struts 406. The lower slot 812A of the upper stiffener 804A is configured to receive therein at least a portion of the corresponding third flange 416 (FIG. 4B) or fourth flange (not shown) of each strut 406 in the pair of struts 406 to couple the upper stiffener 804A between the pair of struts 406. Further details regarding the foregoing are provided with respect to FIGS. 9A-9C.

Figure 9A:
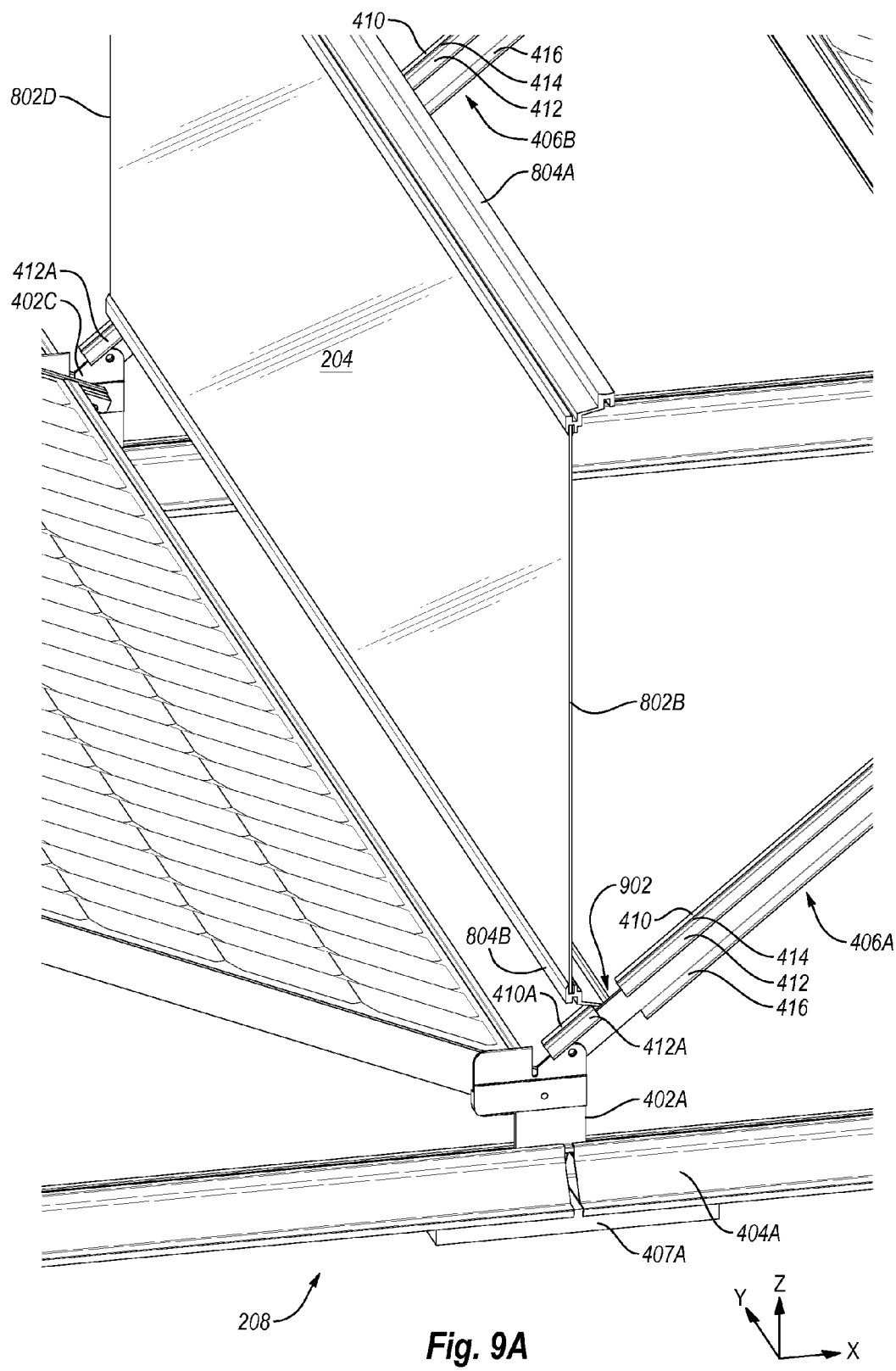
FIG. 9A illustrates how the reflector of FIG. 8A is coupled to the racking assembly of FIG. 2A.

FIG. 9A illustrates how the reflector 204 of FIG. 8A is coupled to the racking assembly 208 of FIG. 2A, arranged in accordance with at least some embodiments described herein. In these and other embodiments, the first flange 410 and the second flange 412 of the strut 406A, and more generally of all the struts 406, are discontinuous along the length of the strut 406A. For example, the first flange 410 includes a lower first flange 410A that is separated from the rest of the first flange 410 by a flange gap 902. Similarly, the second flange 412 includes a lower second flange 412A that is separated from the rest of the second flange 412 by the flange gap 902.

Accordingly, after the racking assembly 208 has otherwise been assembled and is supporting the PV modules 202 (FIG. 2A), the reflector 204 is placed as shown so the lower stiffener 804B generally spans the distance between the strut 406A and the strut 406B. The lower stiffener 804B is sufficiently long to engage the lower first flange 410A of the strut 406A on one side, and to engage the lower second flange 412A of the strut 406B on the other side. Moreover, the flange gap 902 allows the lower stiffener 804B to clear both the first flange 410 of the strut 406A and the second flange 412 of the strut 406B to engage both the lower first flange 410A of the strut 406A and the lower second flange 412A of the strut 406B.

After positioning the reflector 204 as illustrated in FIG. 9A, the upper edge 802A (FIGS. 8A-8B) of the reflector 204 is lowered until the first side edge 802B of the reflector 204 is supported by the first flange 410 of the strut 406A, and the second side edge 802D of the reflector 204 is supported by the second flange 412 of the strut 406B. With combined reference to FIGS. 8B-9A, in some embodiments, after being lowered, the reflector 204 is slid generally downward along the struts 406A, 406B until (1) at least a portion of the lower first flange 410A of the strut 406A and at least a portion of the lower second flange 412A of the strut 406B are both received in the upper slot 810B of the lower stiffener 804B and (2) at least a portion of the fourth flange (904 in FIG. 9C) of the strut 406A and at least a portion of the third flange 416 of the strut 406B are both received in the lower slot 812A of the upper stiffener 804A. The respective portions of the first through fourth flanges within the upper slot 810B of the lower stiffener 804B and the lower slot 812A of the upper stiffener 804A couples the reflector 204 to the racking assembly 208.

Figure 9B:
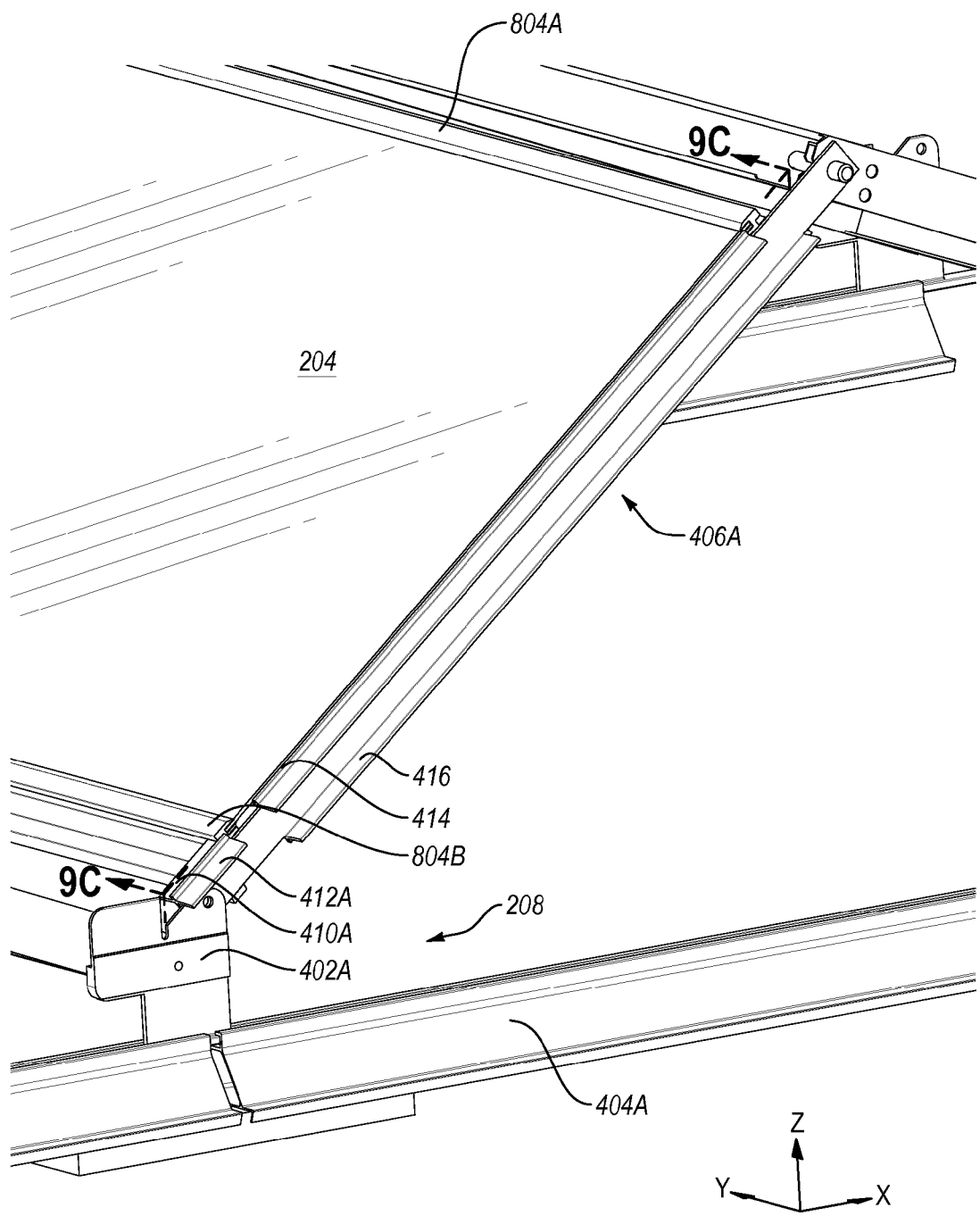
FIG. 9B illustrates the reflector of FIG. 9A after being coupled to the racking assembly of FIG. 2A.

FIG. 9B illustrates the reflector 204 after being coupled to the racking assembly 208, arranged in accordance with at least some embodiments described herein. Although not required, a compliant material is optionally disposed between a back surface of the first side edge 802B and the first flange 410 of the strut 406A, and/or between a back surface of the second side edge 802D and the second flange 412 of the strut 406B. The compliant material may reduce any concentrated loading transmitted to the first and second side edges 802B, 802D of the reflector 204 and/or may further secure the reflector 204 to the struts 406A, 406B. The compliant material may include adhesive, tape, glue, or the like or any combination thereof.

FIG. 9C is a cross-sectional view in a cutting plane 9C-9C of FIG. 9B, arranged in accordance with at least some embodiments described herein. With combined reference to FIGS. 9B and 9C, after the reflector 204 is coupled to the racking assembly 208, a portion of the lower first flange 410A is disposed within the upper slot 810B of the lower stiffener 804B. Additionally, a portion of the fourth flange 904 extending opposite the third flange 416 is disposed within the lower slot 812A of the upper stiffener 804A.

Figure 9D:
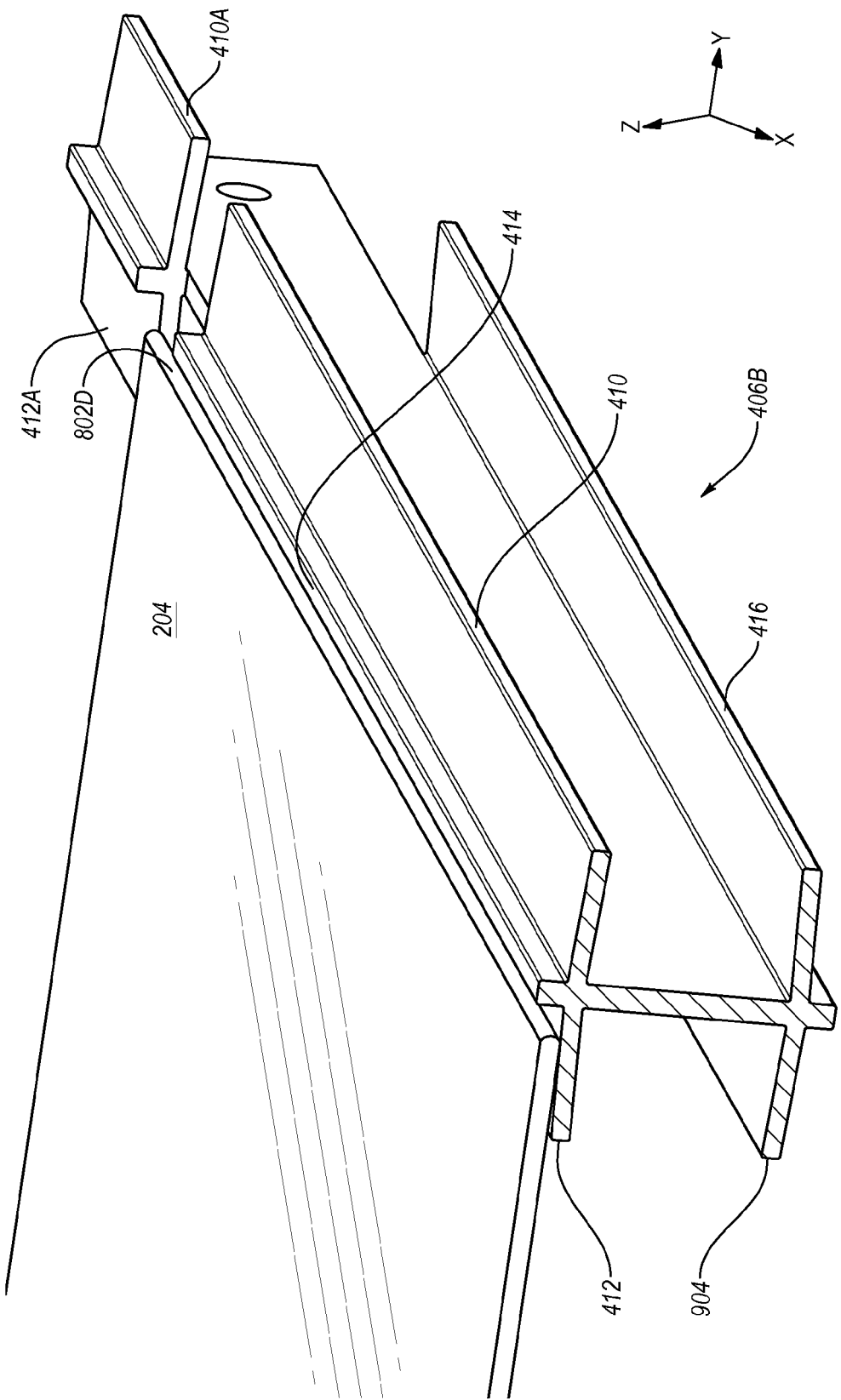
FIG. 9D is a cross-sectional view of a strut included in the racking assembly of FIG. 2A and a reflector supported thereon as in FIG. 9B.

FIG. 9D is a cross-sectional view of the strut 406B and the reflector 204 supported thereon as in FIG. 9B, arranged in accordance with at least some embodiments described herein. As illustrated in FIG. 9D, the second flange 412 has a slight downward curvature away from the reflector 204. The slight downward curvature ensures that if and when the reflector 204 sags under load, such as snow or wind, the interface between the reflector 204 and the second flange 412 remains between the second side edge 802D of the reflector 204 and the flat of the second flange 412, rather than between an edge of the second flange 412 and the flat of the reflector 204. The first flange 410 is similarly configured.

FIG. 9D additionally illustrates the disposition of the ridge 414 with respect to the reflector 204. The ridge 414 prevents the second side edge 802D of the reflector 204 from contacting the corresponding first side edge 802B of an adjacent reflector 204 supported by the first flange 410.

Alternately or additionally, and with combined reference to FIGS. 2A, 8A, 9B, and 9D, in some embodiments, each of the stiffeners 804 extends beyond both the first side edge 802B and the second side edge 802D by about 0.5 millimeters (mm) to about 3 mm before coupling to a corresponding strut 406. In these and other embodiments, the relatively greater length of the stiffeners 804 prevents the first side edge 802B and the second side edge 802D from contacting the corresponding ridge 414 on the corresponding strut 406 when the solar energy system 200 is compressed or sheared.

Figure 10A:
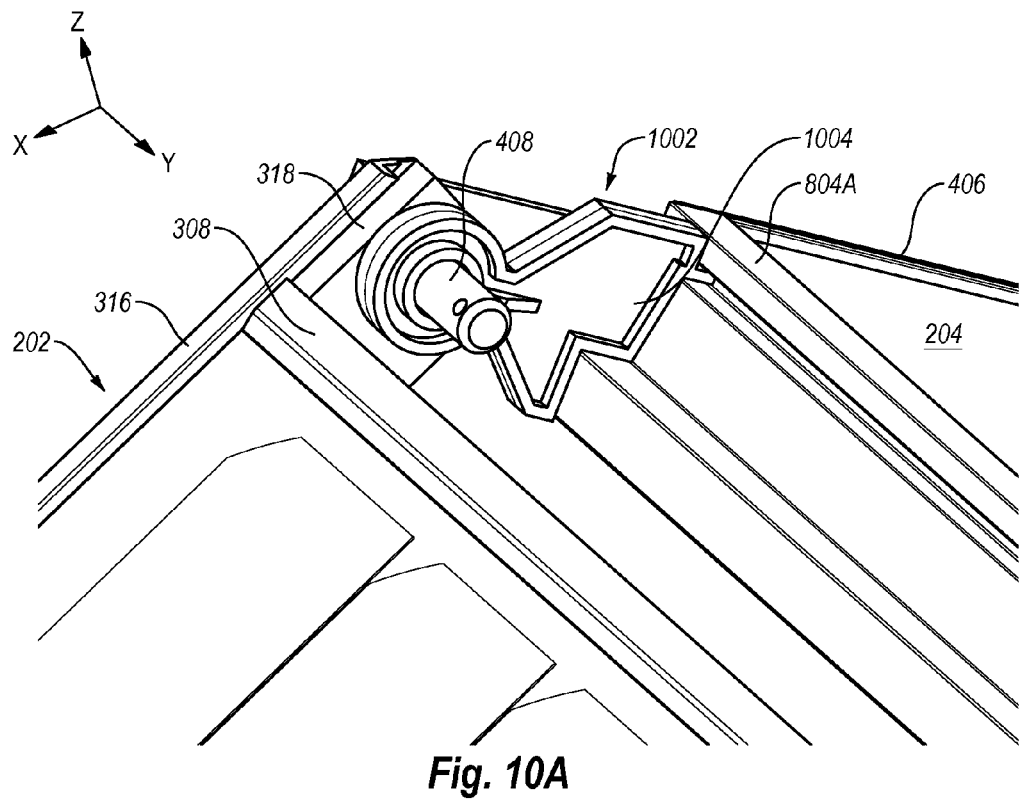
FIG. 10A illustrates an example locker that can be implemented to prevent a reflector from being removed from the solar energy system of FIG. 2A.

In some embodiments, the solar energy system 200 described herein includes lockers that are configured to lock the reflectors into the solar energy system 200. For example, FIG. 10A illustrates an example locker 1002 that can be implemented to prevent a reflector 204 from being removed from the solar energy system 200, arranged in accordance with at least some embodiments described herein. Each reflector 204 may be locked in place within the solar energy system 200 by one or more of the same or similar lockers 1002.

The locker 1002 is coupled to the pin 408 and has a profile along its bottom end 1004 that is complementary to a profile of the upper stiffener 804A. As previously mentioned, a cotter pin may be used to keep the pin 408 from being removed, and the cotter pin may also ensure the locker 1002 stays in place on the pin 408. With the locker 1002 in place, the reflector 204 is prevented from moving upwards towards the pin 408 and disengaging from the corresponding flanges 410, 412 of the corresponding struts 406.

Alternately or additionally, a locker or secondary structural member may be coupled to the bottom frame 310 of an adjacent PV module 202 to prevent the corresponding reflector 204 from being removed from the solar energy system 200 and/or to assist in supporting the reflector 204 under load. For example, FIG. 10B illustrates two example secondary structural members 1006, 1008 that can be implemented to assist in supporting a reflector 204 under load, arranged in accordance with at least some embodiments described herein.

Figure 10B:
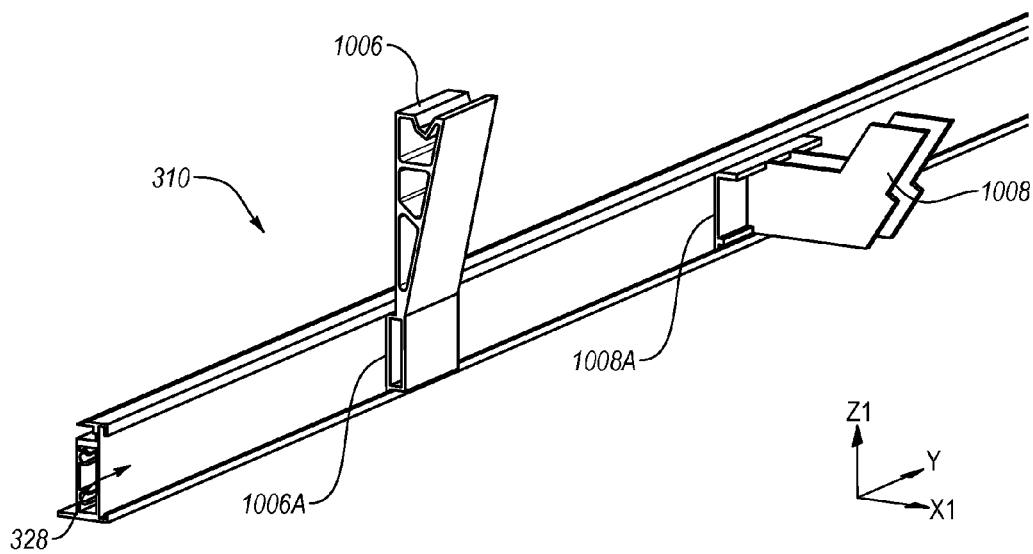
FIG. 10B illustrates two example secondary structural members that can be implemented to assist in supporting a reflector under load.

In particular, and with combined reference to FIGS. 3B and 10B, the secondary structural members 1006, 1008 are attached to the bottom frame 310 of the PV module 202. Each of the secondary structural members 1006, 1008 includes a base 1006A, 1008A that is complementary to the second slot 328 defined in the bottom frame 310. Thus, the secondary structural members 1006, 1008 may be slid and/or snapped into the second slot 328 to secure the secondary structural members 1006, 1008 to the bottom frame 310. Although two different secondary structural members 1006, 1008 are illustrated in FIG. 10B, embodiments described herein may more generally use one or more secondary structural members 1006, 1008 which may be the same or different, without restriction.

In some embodiments, the secondary structural members 1006, 1008 assist in supporting the PV module 202 under load. Alternately or additionally, the secondary structural members 1006, 1008 may extend to a lower edge 802C of an adjacent reflector 204 to assist in supporting the PV module 202 under load. Alternately or additionally, the lower stiffener 804B (FIGS. 8A-8B) may have one or more secondary structural members 1006, 1008 attached thereto to assist in supporting the reflector 204 under load and/or to ensure the reflector 204 does not lift upward and escape from the solar energy system 200.

The embodiments illustrated in FIGS. 10A and 10B are not intended to be limiting. For example, FIG. 10C illustrates another example locker 1010A and/or 1010B (hereinafter "lockers 1010") that can be implemented to prevent a reflector 204 from being removed from the solar energy system 200, arranged in accordance with at least some embodiments described herein. Each reflector 204 may be locked in place within the solar energy system 200 by using one or more of the same or similar lockers 1010. The lockers 1010 may be implemented with any of the embodiments described herein.

FIG. 10C additionally illustrates an example embodiment of a strut 1012 that may be implemented in the solar energy system 200 instead of or in addition to the struts 406A, 406B described herein. The strut 1012 may be implemented with any of the embodiments described herein. The strut 1012 may be configured similarly to the struts 406A, 406B, and may include flanges 1014 and 1016 that correspond, respectively, to the flanges 410 and 416 described herein. Although not shown, the strut 1012 may additionally include a flange similar to the flange 412 described herein. Accordingly, the reflector 204 may be installed to engage one or more of the flanges 1014, 1016, etc. of the strut 1012, analogous to the engagement by the reflector 204 of the flanges 410, 412 as described herein.

Moreover, FIG. 10C illustrates a pin 408A that is an example embodiment of the pin 408 described herein. The pin 408A mechanically couples the upper end of the strut 1012 to the upper extension 318 of the PV module 202. Cotter pins 1018 or other stopping elements received through holes formed in the pin 408A confine the pin 408A in the Y direction and keep the upper end of the strut 1012 and the upper extension 318 mechanically coupled together. As illustrated, the pin 408A is long enough to accommodate an upper extension 318 of another PV module 202 to mechanically couple the upper end of the strut 1012 to the upper extension 318 of two adjacent PV modules 202.

In the illustrated embodiment, each of the lockers 1010 includes a cotter pin or other stopping element that may be received within a hole (not labeled) formed near the upper or lower edge of the strut 1012. The holes are located such that when the reflector 204 has been installed, the lockers 1010 within the holes are substantially adjacent to the upper stiffener 804A, thereby preventing the reflector 204 from moving upwards towards the pin 408A a sufficient distance to disengage from the corresponding flanges of the strut 1012. Although two lockers 1010 are illustrated in FIG. 10C, a single locker 1010A or 1010B per strut 1012 may be used to lock the reflector 204 in place.

Figure 11A:
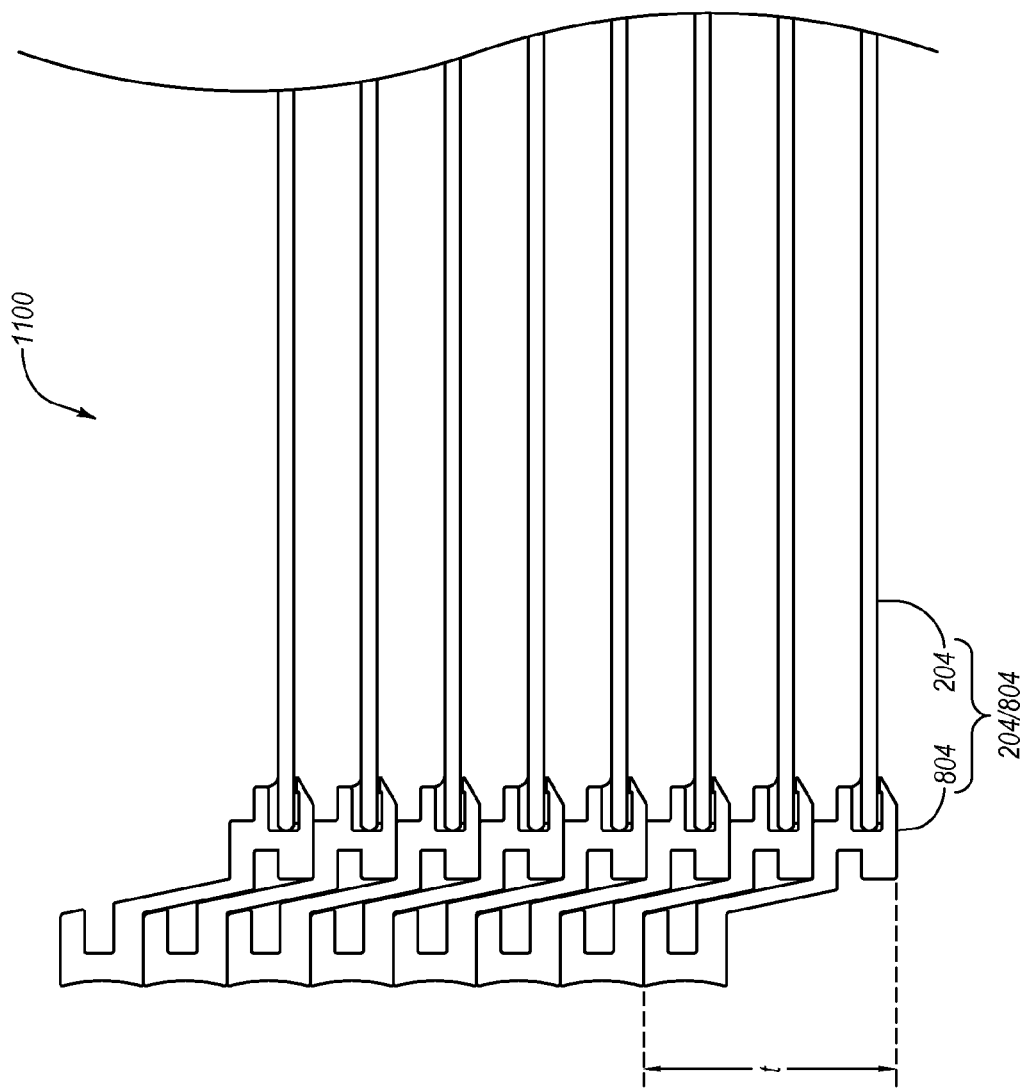
FIG. 11A illustrates multiple assemblies of reflectors in a nested stack.

As previously mentioned, the reflector 204, upper stiffener 804A and lower stiffener 804B may be referred to herein as an assembly 204/804. In general, the solar energy system 200 described herein includes multiple assemblies 204/804. The assemblies 204/804 in some embodiments have a nestable geometry to facilitate stacking and shipping of the assemblies 204/804. For example, FIG. 11A illustrates multiple assemblies 204/804 in a nested stack 1100, arranged in accordance with at least some embodiments described herein. It is appreciated that FIG. 11A only illustrates one side of the nested stack 1100 and that the other side of the nested stack 1100 may be similarly configured.

In the illustrated embodiment, the lowermost assembly 204/804 has a thickness t (e.g., the maximum thickness in the direction orthogonal to a plane defined by the lowermost reflector 204). The other assemblies 204/804 in the nested stack 1100 include a substantially same thickness t. For assemblies lacking a nestable geometry where each assembly has a thickness of t and otherwise has the same dimensions as the assemblies 204/804 in the nested stack 1100, a volume V1 occupied by a stack of N assemblies is proportional to t×N. In the illustrated embodiment, however, the assemblies 204/804 are nested such that a volume V2 occupied by the nested stack 1100 of N assemblies 204/804 is proportional to (t/3)×N+2t/3, such that V2 approaches one-third of V1 as N increases. More generally, V2 may be between about one-third to one-sixth of V1, or between about three to six times smaller than V1.

FIG. 11A additionally illustrates that each assembly 204/804 contacts each adjacent assembly 204/804 only through the stiffeners 804. In other words, the reflector 204 of each assembly 204/804 does not contact the reflector 204 of an adjacent assembly 204/804. Thus, the load of the nested stack 1100 passes directly through the stiffeners 804 rather than through the reflectors 204 and/or any adhesives or fasteners used to secure the stiffeners 804 to the reflectors 204. Accordingly, the assemblies 204/804 may be stacked in the nested stack 1100 while curing, e.g., after applying an adhesive to secure the stiffeners 804 to the reflectors 204, and/or the assemblies 204/804 may be shipped in a reduced volume compared to non-nesting assemblies with otherwise similar dimensions, without loading and potentially damaging the reflectors 204 or the mechanical couplings between the reflectors 204 and the stiffeners 804.

Figure 11B:
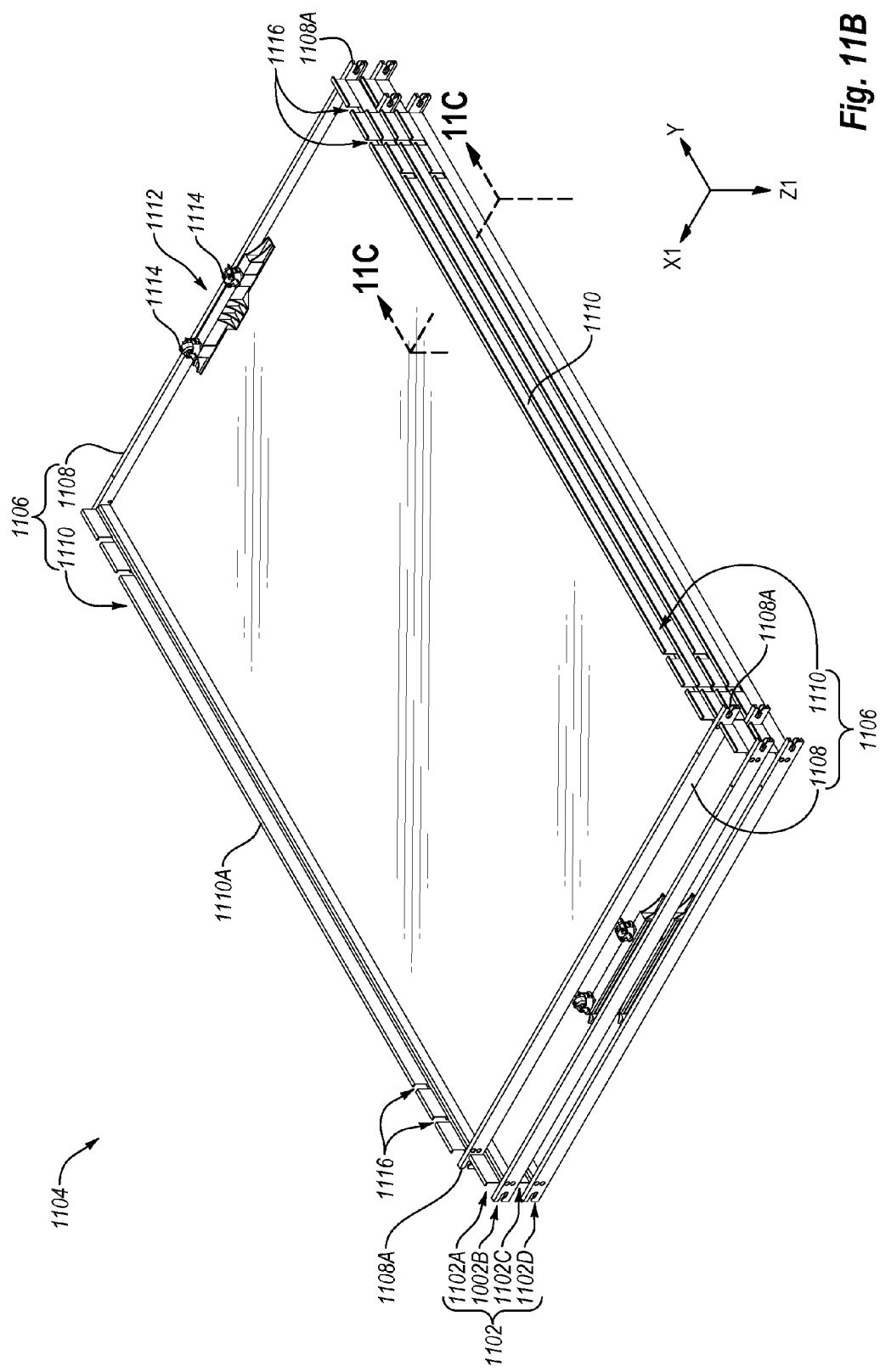
FIGS. 11B-11C illustrate multiple PV modules in a nested stack.
Figure 11C:
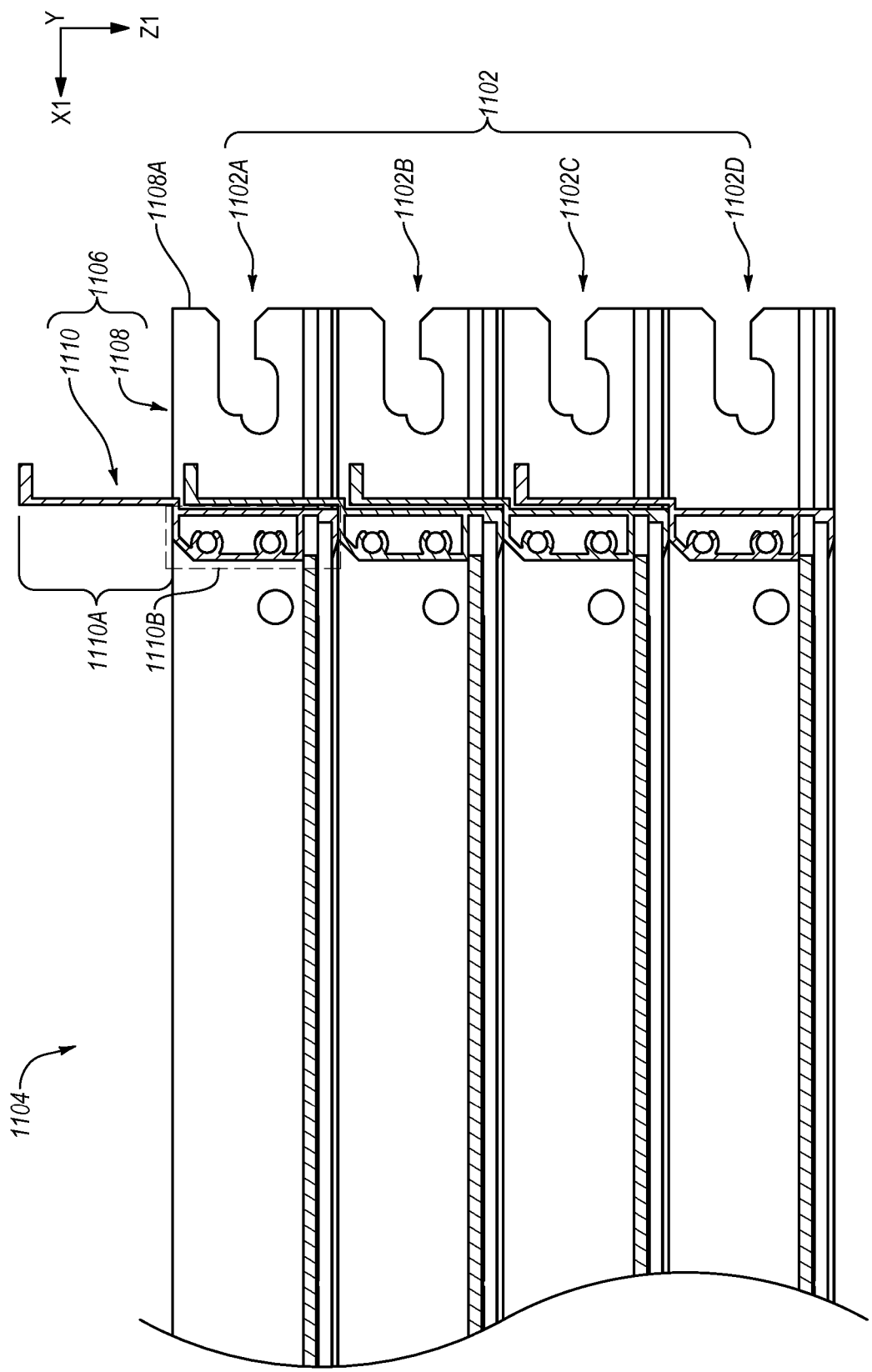

Embodiments described herein may alternately or additionally include nestable PV modules. For example, FIGS. 11B-11C illustrate multiple PV modules 1102 in a nested stack 1104, arranged in accordance with at least some embodiments described herein. In more detail, FIG. 11B is an upside-down perspective view of the nested stack 1104 and FIG. 11C is a cross-sectional view of the nested stack 1104 at a cutting plane 11C-11C of FIG. 11B. The PV modules 1102 represent one embodiment of PV modules that may be implemented in the solar energy system 200 of FIG. 2A instead of or in addition to the PV modules 202 described herein. The PV modules 1102 may generally be configured similarly to the PV modules 202 with the differences as illustrated and described herein. The features of the PV modules 202 and the PV modules 1102 are not mutually exclusive unless context dictates otherwise.

The nested stack 1104 includes four PV modules 1102 stacked one on top of the other, including a first PV module 1102A stacked on a second PV module 1102B stacked on a third PV module 1102C stacked on a fourth PV module 1102D. A description of the first PV module 1102A will now be provided with the understanding that each of the other PV modules 1102 may be similarly configured. The reference numbers used to describe features of the first PV module 1102A may be used when describing corresponding features of the other PV modules 1102 even when the corresponding features of the other PV modules 1102 are not labeled in FIGS. 11B-11C for clarity.

In the illustrated embodiment, the first PV module 1102A includes a frame 1106 made up of two side frames 1108 and two east-to-west frames 1110. The side frames 1108 may be substantially similar to the side frames 316 described herein and may be similarly configured. For instance, each of the side frames 1108 may include extensions 1108A at each end thereof that are substantially similar to the extensions 318 described herein. The east-to-west frames 1110 may generally correspond to the top and bottom frames 308, 310 described herein with differences as further described below. The east-to-west frames 1110 may be substantially identical to each other.

The first PV module 1102A additionally includes an undermount assembly 1112 including connectors 1114. The undermount assembly 1112 and connectors 1114 may be substantially similar to the undermount assembly 312 and connectors 314 described herein and may be similarly configured.

The first PV module 1102A may have a rectangular shape including two long edges and two short edges. The side frames 1108 may be provided along the two short edges and the east-to-west frames 1110 may be provided along the two long edges of the PV module 1102A and may therefore be subject to higher stress under uniform service loads than the side frames 1108. Accordingly, the east-to-west frames 1110 may each include an extension 1110A substantially along the length of the corresponding east-to-west frame 1110. The extension 1110A of each of the east-to-west frames 1110 may increase the section modulus and moment of inertia about the X1 axis of the east-to-west frames 1110 compared to the top and bottom frames 308 and 310 described herein that lack extensions 1110A.

Referring particularly to FIG. 11C, the east-to-west frames 1110 may have a cross-sectional profile that allows nested stacking. In more detail, the east-to-west frames 1110 may each include a base portion generally denoted at 1110B that is substantially similar in cross-section as the bottom frame 310 illustrated in FIG. 3C. Each extension 1110A extends from the base portion 1110B in the Z1 direction and is offset from the base portion 1110B in the X1 direction. The X1 offset of the extension 1110A with respect to the base portion 1110B allows multiple similarly configured east-to-west frames 1110 to be aligned in the X1 direction when stacked one on top of the other.

Referring to FIG. 11B, the extensions 1110A of each east-to-west-frame 1110 additionally include one or more notches 1116 defined therein. The notches 1116 are configured to accommodate the extensions 1108A of the side frames 1108 of the next PV module 1102 in the nested stack 1104 so that the next PV module 1102 in the nested stack 1104 can rest substantially within a volume defined between the extensions 1110A of the east-to-west frames 1110. For instance, some of the notches 1116 of the second PV module 1102B receive the extensions 1108A of the side frames 1108 of the first PV module 1102A so that the first PV module 1102A rests substantially within a volume defined between the extensions 1110A of the east-to-west frames 1110 of the second PV module 1102B. It is primarily the extensions 1108A and the extensions 1110A of the first PV module 1102A and a portion of the first PV module 1102A at the positive Y end that do not rest within the volume defined between the extensions 1110A of the east-to-west frames 1110 of the second PV module 1102B.

To accommodate the undermount assemblies 1112 in the nested stack 1104, the PV modules 1102 may be offset from each other in the Y direction in an alternating manner with the PV modules 1102 being oriented in the stack such that the corresponding undermount assemblies 1112 are located at the positive or negative Y end of the corresponding PV module 1102 depending on the offset. For example, the PV modules 1102A and 1102C that are offset in the positive Y direction may be oriented such that the undermount assemblies 1112 of the PV modules 1102A and 1102C are at the positive Y end of the PV modules 1102A and 1102C.

Similarly, the PV modules 1102B and 1102D that are offset in the negative Y direction may be oriented such that the undermount assemblies 1112 of the PV modules 1102B and 1102D are at the negative Y end of the PV modules 1102B and 1102D.

In some embodiments, the frames 1106 of the PV modules 1102, including the east-to-west frames 1110 and/or the side frames 1108, may be configured such that the load of the PV modules 1102 in the nested stack 1104 is transferred through the frames 1106 rather than through the undermount assemblies 1112, PV cells, and/or other components of the PV modules 1102 to avoid damaging such components when the PV modules 1102 are stacked for shipping. For example, each of the side frames 1108 and/or the base portions 1110B of the east-to-west frames 1110 may have a height, e.g., in the Z1 direction, that allows substantially all loads to be transferred through the side frames 1108 and/or the base portions 1110B of the east-to-west frames 1110 of the PV modules 1102 in the nested stack 1104 without transferring loads through the undermount assemblies 1112, PV cells, and/or other components of the PV modules 1102 that may be damaged when subjected to a load.

The locations of the notches 1116 ensure that the PV modules 1102 offset in the negative Y direction are aligned with each other in the Y direction and that the PV modules 1102 offset in the positive Y direction are also aligned with each other in the Y direction. The illustrated embodiment of FIG. 11B thus involves a two-position pattern where each PV module 1102 is stacked at one of two Y positions in an alternating matter. More complicated patterns involving three or more Y positions may be implemented, e.g., where the undermount assembly 1112 is too tall for a two-position pattern.

Accordingly, and compared to the top and/or bottom frames 308 and 310 described herein, the extensions 1110A may increase the section modulus and moment of inertia of the east-to-west frames 1110. Additionally, the nesting allows the PV modules 1102 to be densely packed for shipping, while the notches 1116 not only accommodate the extensions 1108A of the next PV module 1102 in the nested stack 1104 for dense packing, but also confine the next PV module 1102 in the nested stack 1104 in the Y direction to substantially prevent Y-direction sliding of each PV module 1102 relative to adjacent PV modules 1102 while in transit.

In some embodiments, each of the reflectors 204 has patterning that affects a direction in which incident light is reflected from the corresponding reflector 204. For example, each reflector 204 may have a one-dimensional vertical pattern, a one-dimensional horizontal pattern, or a two-dimensional pattern as described with respect to FIGS. 12A-12C.

Figure 12A:
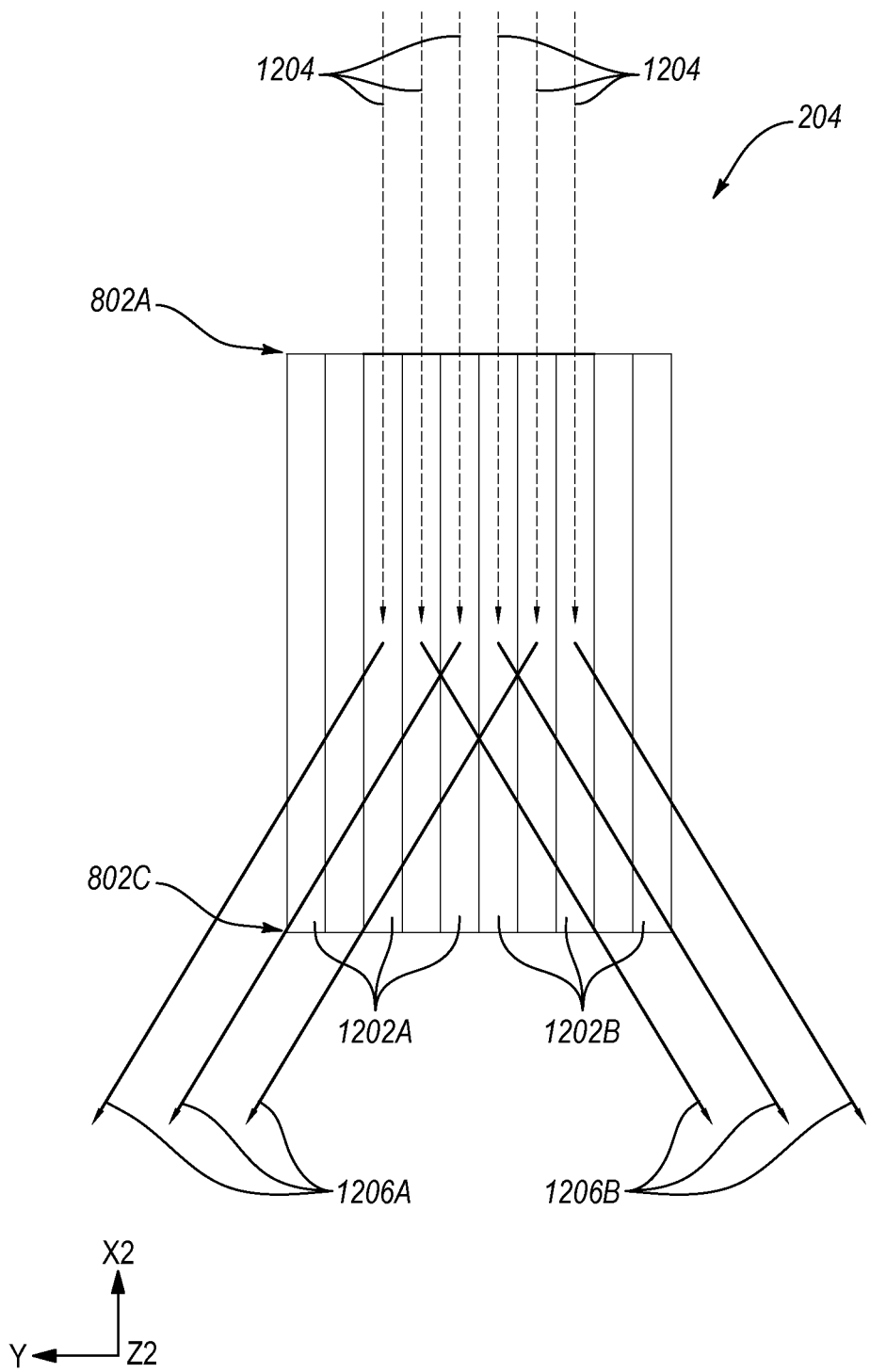
FIGS. 12A-12C depict various patterns that may be formed in the reflectors described herein to affect a direction in which incident light is reflected.
Figure 12B:
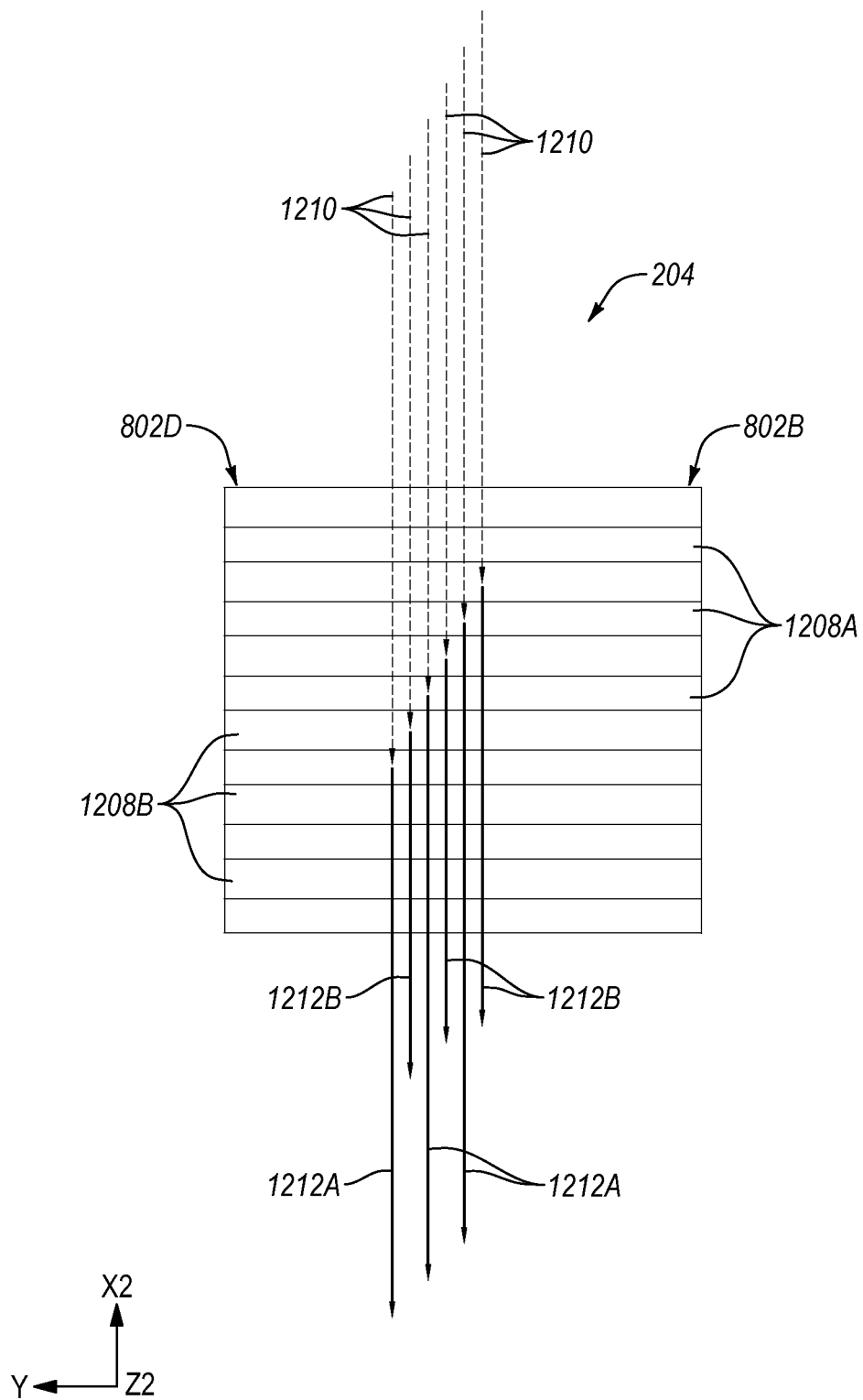
Figure 12C:
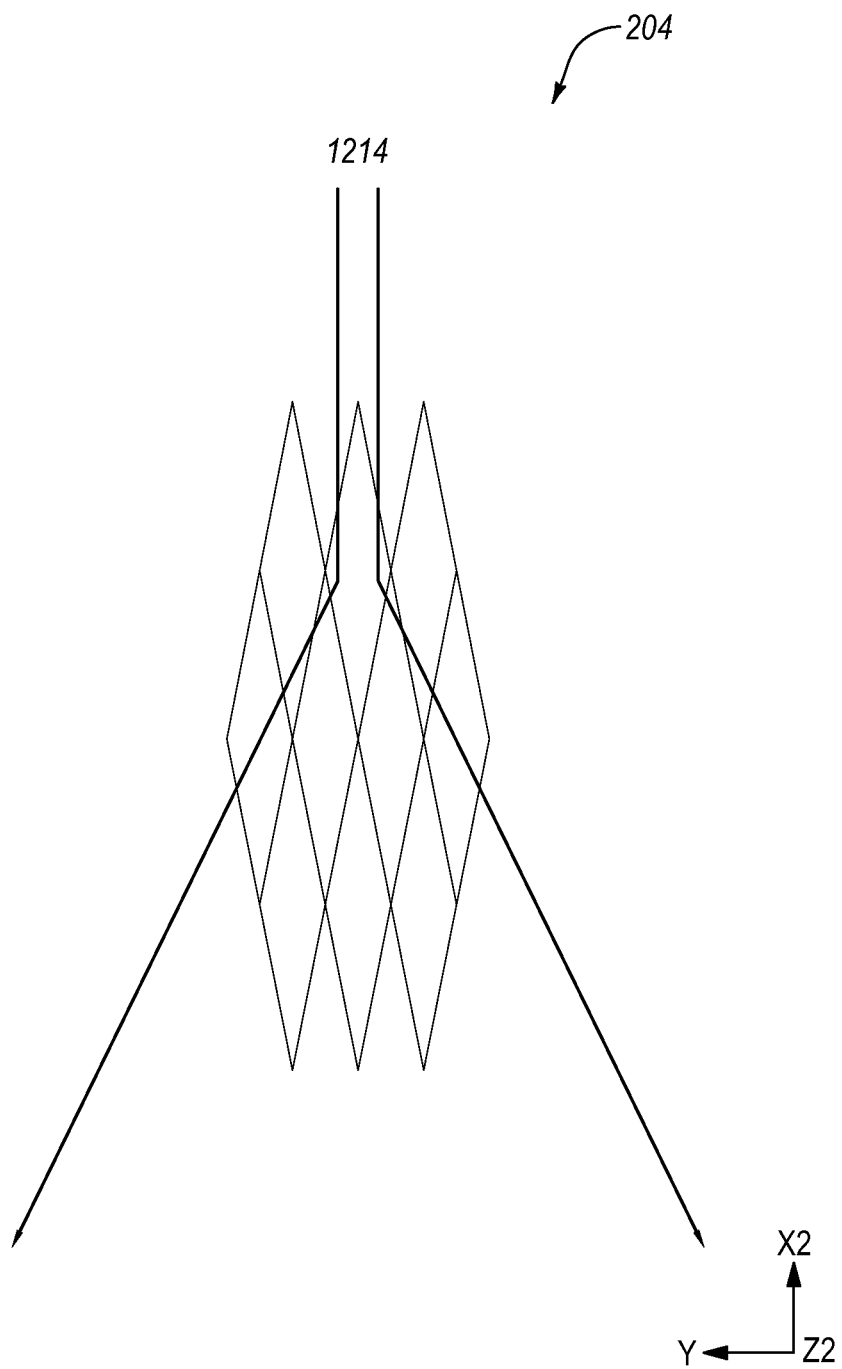

In more detail, FIGS. 12A-12C depict various patterns that may be formed in the reflectors 204 to affect a direction in which incident light is reflected, arranged in accordance with at least some embodiments described herein. With reference first to FIG. 12A, a reflector 204 with a one-dimensional vertical pattern is described. The other reflectors 204 may have the same or a different pattern.

The reflector 204 with the vertical pattern includes first surfaces 1202A facing a first direction and second surfaces 1202B facing a second direction different than the first direction. The second surfaces 1202B are interposed between the first surfaces 1202A. In some embodiments, the first surfaces 1202A and the second surfaces 1202B extend the entire width of the reflector 204, e.g., from the upper edge 802A to the lower edge 802C of the reflector 204.

FIG. 12A additionally illustrates some example incoming light rays 1204. Some of the incoming light rays 1204 are incident on the first surfaces 1202A, while others of the incoming light rays 1204 are incident on the second surfaces 1202B. The incoming light rays 1204 have a component parallel to the X2 coordinate axis as illustrated in FIG. 12A, and additionally have a component parallel to the Z2 coordinate axis. Accordingly, the incoming light rays 1204 are incident on the first surfaces 1202A or the second surfaces 1202B and are reflected at different angles relative to the X2-Z2 plane depending on whether they are incident on the first surfaces 1202A or the second surfaces 1202B. For example, incoming light rays 1204 incident on the first surfaces 1202A are reflected in a first direction as reflected light rays 1206A. Analogously, incoming light rays 1204 incident on the second surfaces 1202B are reflected in a second direction as reflected light rays 1206B. Thus, the incoming light rays 1204 are scattered laterally, e.g., in the Y direction, by the vertical pattern, while the incoming light rays 1204 are generally not scattered vertically, e.g., in the Z direction. Note that the Z2 direction is illustrated in FIG. 12A and the Z direction can be derived from the relationship Z2=Z+θ2.

As a result of the lateral scattering, an optical path length between the reflector 204 and a facing PV module 202 is effectively increased. Thus, to the extent the reflected light rays 1206A, 1206B already have a downward component (e.g., in the negative Z direction), the reflected light rays 1206A, 1206B travel further downward than reflected light rays that are not laterally scattered before being incident on the facing PV module 202.

With reference now to FIG. 12B, a reflector 204 with a one-dimensional horizontal pattern is described. The other reflectors 204 may have the same or a different pattern. Similar to FIG. 12A, in FIG. 12B the reflector 204 with the horizontal pattern includes first surfaces 1208A facing a first direction and second surfaces 1208B facing a second direction different than the first direction where the second surfaces 1208B are interposed between the first surfaces 1208A. In contrast to FIG. 12A, however, the first surfaces 1208A and the second surfaces 1208B extend the entire length of the reflector 204, e.g., from the first side edge 802B to the second side edge 802D of the reflector 204.

FIG. 12B additionally illustrates some example incoming light rays 1210. Some of the incoming light rays 1210 are incident on the first surfaces 1208A, while others of the incoming light rays 1210 are incident on the second surfaces 1208B. The incoming light rays 1210 have a component parallel to the X2 coordinate axis as illustrated in FIG. 12B, and additionally have a component parallel to the Z2 coordinate axis. Accordingly, the incoming light rays 1210 are incident on the first surfaces 1202A or the second surfaces 1202B and are reflected at different angles relative to the X2-Y plane depending on whether they are incident on the first surfaces 1208A or the second surfaces 1208B. For example, incoming light rays 1210 incident on the first surfaces 1208A are reflected in a first direction as reflected light rays 1212A. The first direction of the reflected light rays 1212A is at a relatively low angle from the X2-Y plane. Analogously, incoming light rays 1210 incident on the second surfaces 1208B are reflected in a second direction as reflected light rays 1212B. The second direction of the reflected light rays 1212B is at a relatively higher angle from the X2-Y plane than the first direction, as denoted by the reflected light rays 1212B being shorter in the X2 direction than the reflected light rays 1212A. Thus, the incoming light rays 1210 are scattered vertically, e.g., in the Z direction, by the horizontal pattern, while the incoming light rays 1210 are generally not scattered horizontally, e.g., in the Y direction. Note that the Z2 direction is illustrated in FIG. 12B and Z can be derived from the relationship Z2=Z+θ2.

With reference now to FIG. 12C, a reflector 204 with a two-dimensional pattern is described. The other reflectors 204 may have the same or a different pattern. The two-dimensional pattern is referred to as such because it includes variations in both the X2 and Y directions, whereas the vertical and horizontal patterns of FIGS. 12A and 12B have variations only in a single direction. The two-dimensional pattern of FIG. 12C is a diamond pattern where the perimeters of the "diamonds" are at about a first location in the Z2 direction and rising up in the positive Z2 direction in the open areas of each "diamond." Thus, incoming light rays 1214 incident on the reflector 204 with the two-dimensional pattern of FIG. 12C are scattered both horizontally and vertically.

Each of the reflectors 204 described herein may include various layers arranged to reflect incident light rays. The patterning described with respect to FIGS. 12A-12C and/or other patterning such as a stipple pattern may be formed in any of the various layers. The various layers making up a reflector are collectively referred to herein as a "material stack."

Figure 13:
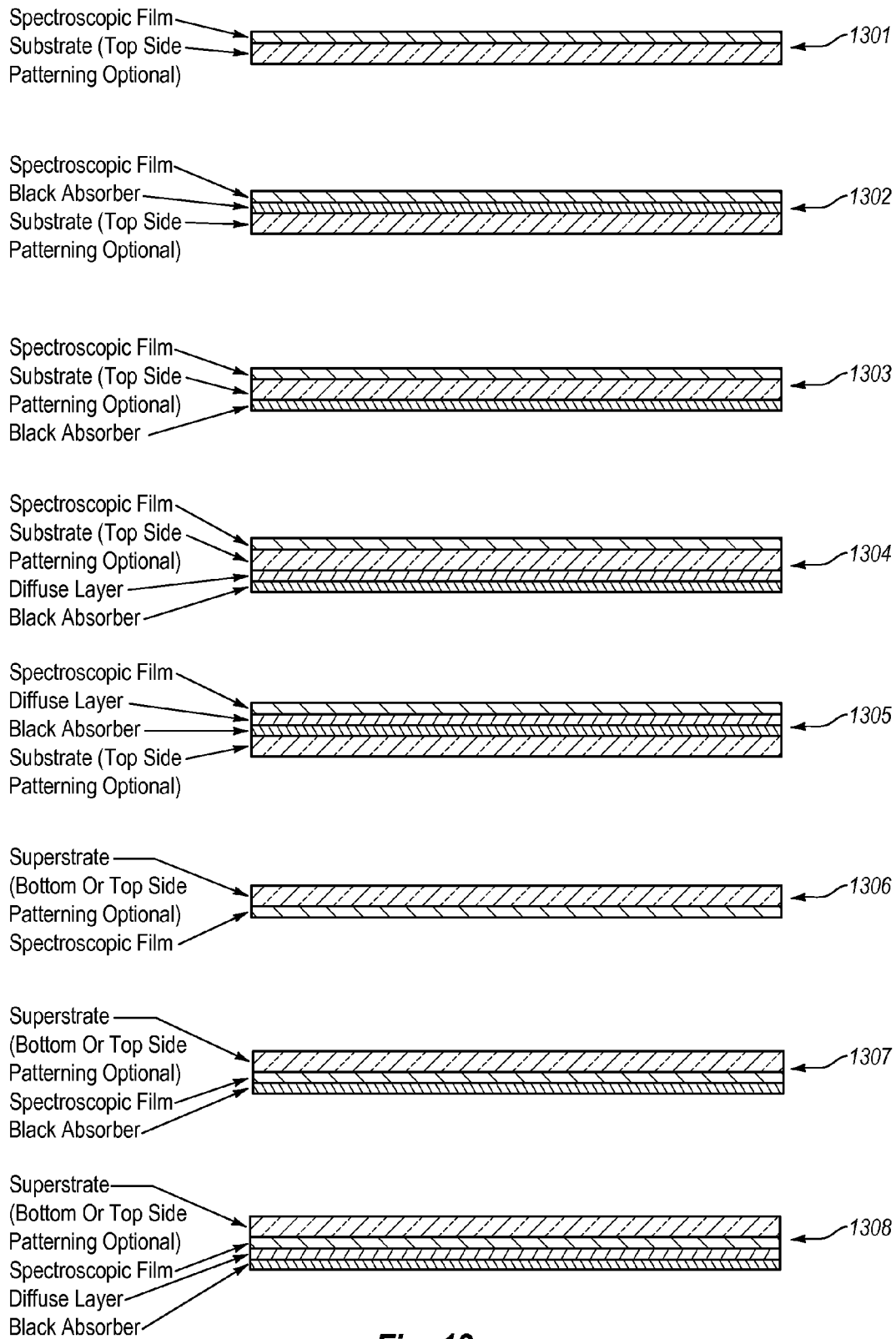
FIG. 13 illustrates a variety of different material stacks that can be implemented for the reflectors described herein.

FIG. 13 illustrates a variety of different material stacks 1301-1308 that can be implemented for the reflectors 204, arranged in accordance with at least some embodiments described herein. In general, each of the material stacks 1301-1308 includes a glass substrate, as in material stacks 1301-1305, or a glass superstrate, as in material stacks 1306-1308.

Each of the material stacks 1301-1308 additionally includes a reflective layer. The reflective layer may reflect substantially all incoming light rays, or it may be wavelength selective so that only some wavelengths are reflected while others are transmitted. Wavelengths of light that are reflected are referred to as a "reflectance spectrum" while wavelengths of light that are transmitted are referred to as a "transmittance spectrum." Wavelength selective reflective layers are sometimes referred to herein as "spectroscopic films" which have an associated reflectance spectrum and transmittance spectrum.

The reflectance and transmittance spectra of the spectroscopic films, and thus of the reflectors 204, may be selected to optimize energy production of the adjacent PV modules 202 and/or to optimize plant growth beneath the reflectors 204. For example, the roof of a greenhouse may be at least partially formed from or may include thereon the solar energy system 200 including the reflectors 204. In this and other embodiments, the transmittance spectrum of the reflectors 204 may include blue and green wavelengths of light to foster growth of the plants in the greenhouse, while the reflectance spectrum of the reflectors 204 may include red and infrared wavelengths of light which are converted to electrical energy by the adjacent PV modules 202 which receive the reflected light rays having red or infrared wavelengths. While the patterning described with reference to FIGS. 12A-12C acts to scatter and more evenly distribute reflected light, the patterning may similarly scatter and more evenly distribute transmitted light. Thus, patterning of the reflectors 204 in the present embodiment may scatter and more evenly distribute the transmitted light within the greenhouse.

As illustrated in FIG. 13, each material stack 1301-1308 can include a spectroscopic film formed directly on a top surface of the glass substrate as in material stacks 1301, 1303, and 1304, or formed directly on a bottom surface of the glass superstrate as in material stacks 1306-1308. In some embodiments, the spectroscopic film is vacuum laminated to the glass substrate or the glass superstrate. Alternately or additionally, an adhesive layer may be provided to couple the spectroscopic film to the glass substrate or the glass superstrate; the adhesive layer includes acrylic, EVA, or silicone in some embodiments. Alternately or additionally, the material stacks 1301-1308 may be constructed by ambient temperature or elevated temperature roll laminating.

Optionally, a top and/or bottom surface of the glass substrate or superstrate in material stacks 1301-1308 may have a stipple pattern or other patterning formed thereon such that light reflected from the reflector 204, including the corresponding material stack 1301-1308, is scattered and, therefore, non-concentrating and diffuse. Alternately or additionally, the reflector 204 can include a black absorbing layer as in material stacks 1302-1305 and 1307-1308, and/or a diffuse reflecting layer as in material stacks 1304-1305 and 1308. The black absorbing layer and/or the diffuse reflecting layer are laminated or otherwise joined together with the glass substrate or the glass superstrate and the spectroscopic layer in some embodiments. The black absorbing layer may absorb some or all of the transmittance spectrum of the reflector 204 to prevent the transmittance spectrum from passing beneath the reflector 204 and heating a region near the backside of the reflector 204. The diffuse reflecting layer may act to re-reflect unusable wavelengths of light back into the sky.

Some aspects of stipple patterns, black absorbing layers, and diffuse reflecting layers are disclosed in U.S. patent application Ser. No. 12/711,040 already incorporated by reference herein. Those skilled in the art will recognize, with the benefit of the present disclosure, that the aspects disclosed therein can be analogously applied to the material stacks 1301-1308 of FIG. 13.

V. Additional Embodiments

Figure 14A:
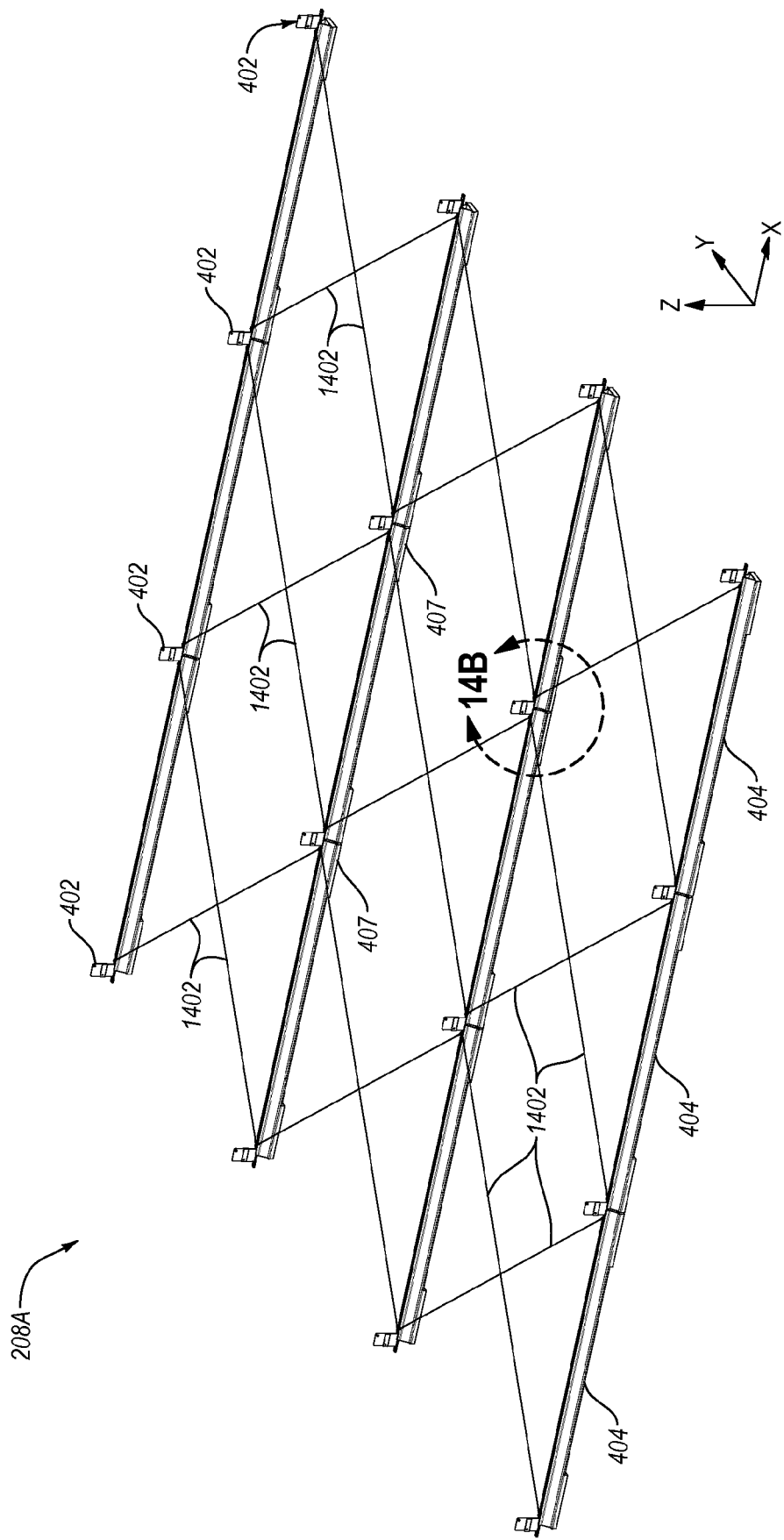
FIG. 14A illustrates a racking assembly including multiple tension stiffeners.

Modifications, additions, and/or omissions may be made to the embodiments of FIGS. 2A-13 without departing from the scope of the claimed invention. For example, FIG. 14A illustrates a racking assembly 208A including multiple tension stiffeners 1402 (only some are labeled for clarity), arranged in accordance with at least some embodiments described herein. The racking assembly 208A may be implemented in the solar energy system 200 instead of or in addition to the racking assembly 208 described herein. Alternately or additionally, the racking assembly 208A may be implemented to provide added stiffness beyond that provided by the racking assembly 208 for use under high wind conditions and/or other conditions.

The racking assembly 208A includes many of the same components as the racking assembly 208 described with respect to FIG. 4A, only some of which are labeled in FIG. 14A for clarity. For example, the racking assembly 208A includes fins 402, rails 404, struts 406 (not shown), and pads 407, configured and arranged as described in more detail above.

As illustrated, the rails 404 are arranged in rows, with the rails 404 in each row being aligned end-to-end. The tension stiffeners 1402 are configured to mechanically couple each row of rails 404 to one or more adjacent rows of rails 404. Moreover, the tension stiffeners 1402 may be coupled diagonally between the rows of rails 404, as illustrated in FIG. 14A. For example, each tension stiffener 1402 may be coupled diagonally between a fin 402 of one row of rails 404 and a corresponding fin in an adjacent row of rails 404. The tension stiffeners 1402 may be configured to prevent each rail 404 from shearing or translating in the X direction with respect to other rails 404.

Each of the tension stiffeners 1402 may include, but is not limited to, a cable, a rope, a strap, a chain, a wire, a dowel or rod of any suitable composition, or the like or any combination thereof.

In some embodiments, the tension stiffeners 1402 are coupled between each pair of diagonally-arranged fins 402 as illustrated, or in a different or more limited fashion. For instance, the tension stiffeners 1402 may be used at the four corners of the racking assembly 208A and/or elsewhere within the racking assembly 208A anytime additional shearing strength is desired. Alternately or additionally, tension stiffeners 1402 may be used at various locations along the north (negative X) side of the racking assembly 208A to ensure the ends of the rails 404 along the north side of the racking assembly 208A do not move relative to each other in the Y direction and allow a reflector 408 in a reflector row along the north side of the racking assembly 208A to drop out between struts.

Figure 14B:
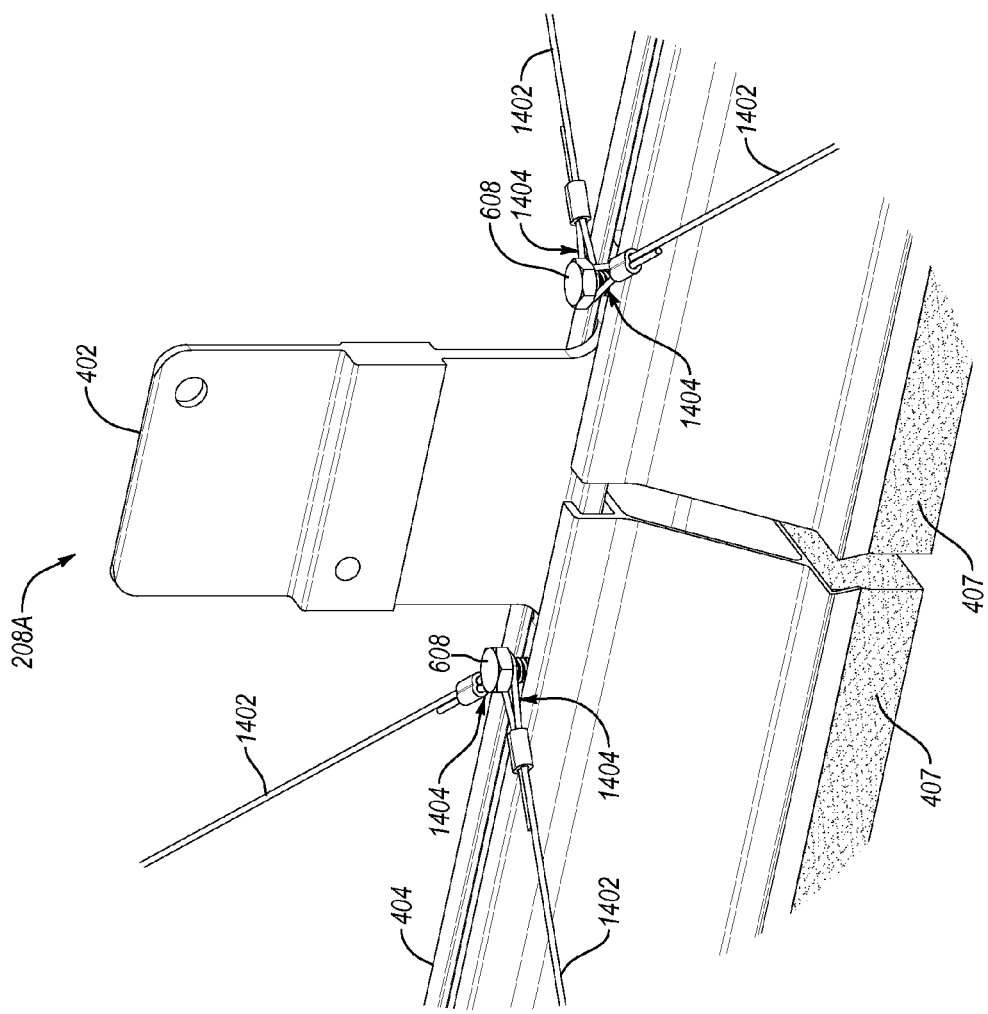
FIG. 14B illustrates a detail view of a portion of the racking assembly of FIG. 14A.

FIG. 14B illustrates a detail view of a portion of the racking assembly 208A of FIG. 14A generally denoted at 14B-14B in FIG. 14A, arranged in accordance with at least some embodiments described herein. In the embodiment of FIG. 14B, the tension stiffeners 1402 are cables, each having a loop 1404 formed in the end. The loops 1404 allow the tension stiffeners 1402 to be coupled to the rails 404 using the same bolts 608 that are used to couple the fins 402 to the rails 404. In other embodiments, other fasteners may be used to couple the ends of the tension stiffeners 1402 to the rails 404.

Figure 15A:
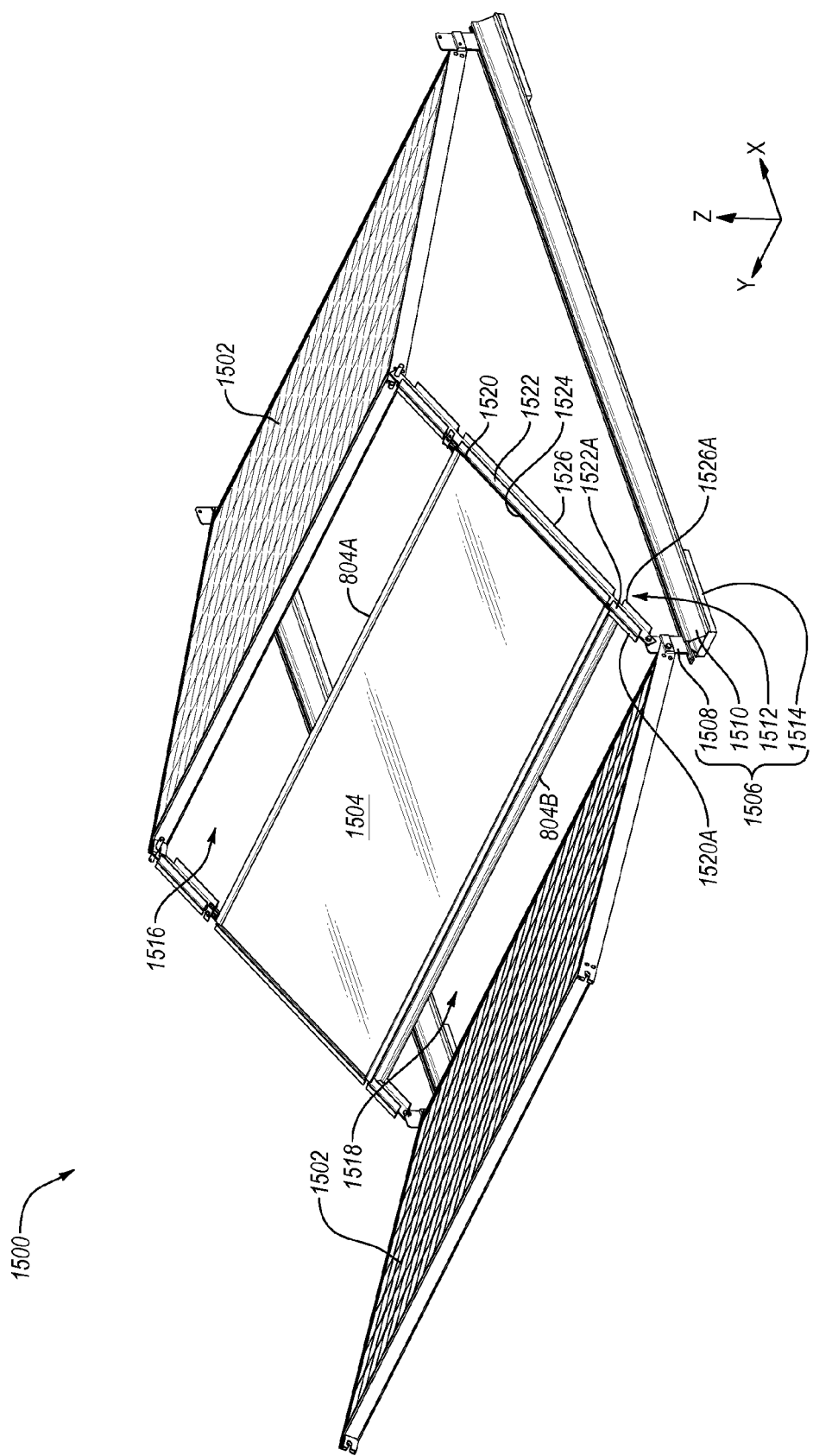
FIGS. 15A-15B illustrate a portion of another example solar energy system that may include multiple PV modules and reflectors.
Figure 15B:
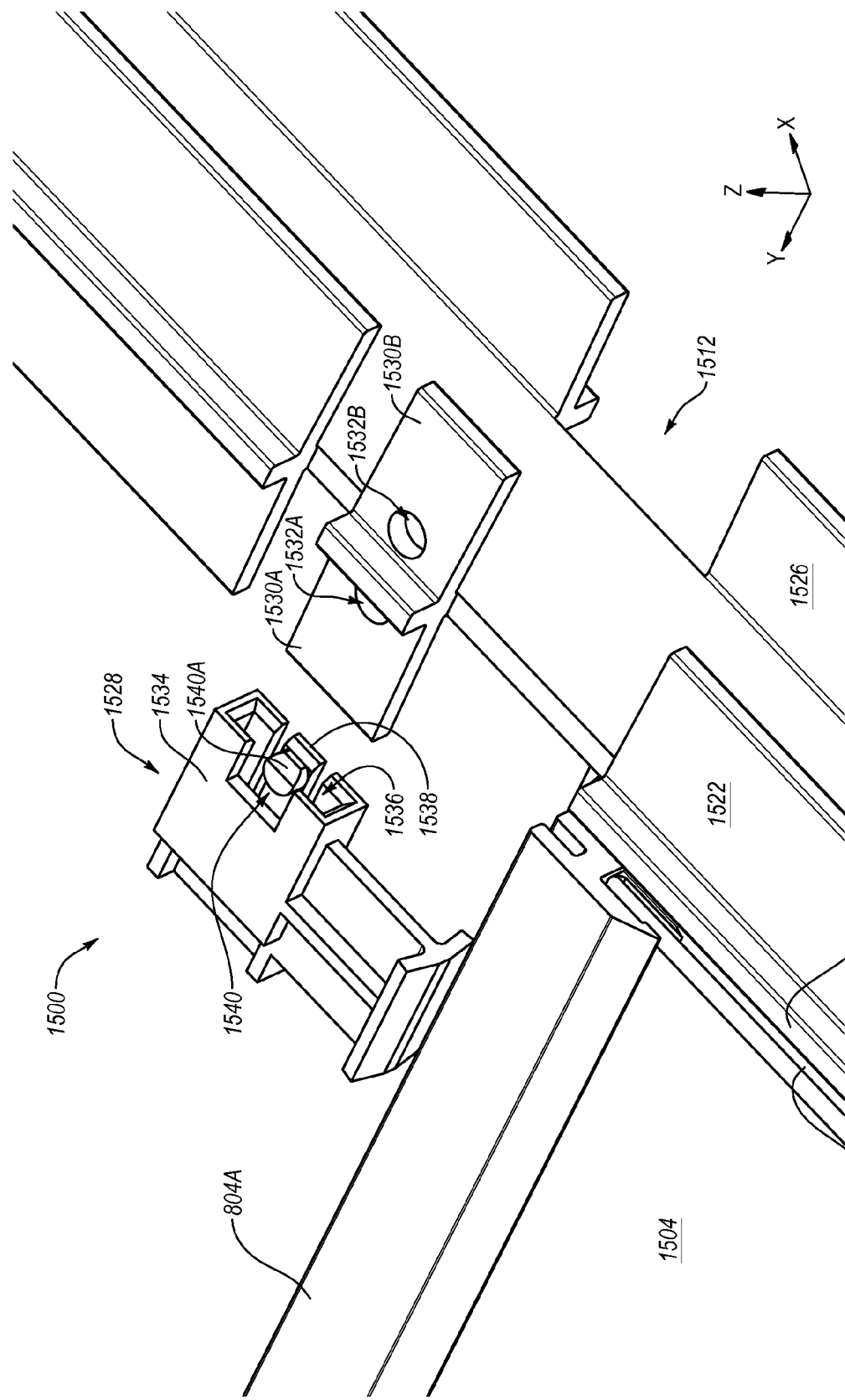

FIGS. 15A-15B illustrate a portion of another example solar energy system 150 that may include multiple PV modules 1502 and reflectors 1504 (only one is illustrated), arranged in accordance with at least some embodiments described herein. In general, the solar energy system 1500 may be similar to the solar energy system 200 described herein with the differences illustrated and described herein. The features of the solar energy system 200 and the solar energy system 1500 are not mutually exclusive unless context dictates otherwise.

Similar to the solar energy system 200, in the solar energy system 1500 of FIGS. 15A-15B, the PV modules 1502 and the reflectors 1504 may be arranged with rows of reflectors 1504 interposed between rows of PV modules 1502.

The solar energy system 1500 additionally includes a racking assembly 1506 with various components, only some of which are labeled in FIG. 15A for clarity. For example, the racking assembly 1506 includes fins 1508, rails 1510, struts 1512, and pads 1514, which are generally similar, at least in function, to the fins 402, the rails 404, the struts 406, and the pads 407 described herein. The PV modules 1502 and the reflectors 1504 may be coupled to the rails 1510 of the racking assembly 1506 through the fins 1508, similar to the PV modules 202 and the reflectors 204 already described herein.

In FIG. 15A, the struts 1512 may be relatively longer than the struts 406 and/or the reflectors 1504 may be relatively shorter than the reflectors 204 such that a gap 1516 is provided between each reflector 1504 and the PV module 1502 behind it, and/or such that a gap 1518 is provided between each reflector 1504 and the PV module 1502 in front of it.

Various features of one of the struts 1512 are illustrated in FIG. 15A and will now be described, with the understanding that other struts 1512 in the racking assembly 1506 may be similarly configured. As shown, the strut 1512 includes a first flange 1520, a second flange 1522, a ridge 1524, and a third flange 1526 that generally correspond to the first flange 410, the second flange 412, the ridge 414, and the third flange 416 already described herein. The third flange 1526 is paired with a fourth flange (not shown) along an edge of the strut 1502 opposite the edge on which the first flange 1520 and the second flange 1522 are provided.

The first flange 1520 may include a lower first flange 1520A separated from the rest of the first flange 1520 by a flange gap. The second flange 1522 may similarly include a lower second flange 1522A separated from the rest of the second flange 1522 by a flange gap. The third flange 1526 may similarly include a lower third flange 1526A separated from the rest of the third flange 1526 by a flange gap. The fourth flange (not shown) may similarly include a lower fourth flange (not shown) separated from the rest of the fourth flange by a flange gap.

The reflector 1504 may include or be supported by an upper stiffener 804A and a lower stiffener 804B, embodiments of which have already been described herein. The lower stiffener 804B may be configured to engage one or both of the lower first flange 1520A or the lower fourth flange of the strut 1512 at the negative Y side of the reflector 1504 and to engage one or both of the lower second flange 1522A or the lower third flange 1526A of the strut 1512 at the positive Y side of the reflector 1504 in a manner generally described above with respect to FIGS. 8A-9B.

The reflector 1504 may be locked in place on the struts 1512 using any of the lockers described above with respect to FIGS. 10A-10C. Alternately or additionally, the reflector 1504 may be locked in place using a different locker, such as a locker 1528 illustrated in FIG. 15B, which includes a detail view of a portion of the solar energy system 1500 of FIG. 15A. In FIG. 15B, the locker 1528 is illustrated prior to installation thereof.

As illustrated in FIG. 15B, the strut 1512 includes two tabs 1530A, 1530B (collectively "tabs 1530") extending from opposing sides of the strut 1512. Each of the tabs defines a through hole 1532A, 1532B (collectively (through holes 1532).

The locker 1528 includes a box 1534 defining a cavity 1536. On one side of the box, a flexible finger 1538 is provided that includes a dimple 1540 extending at least partially into the cavity 1536. The dimple 1540 includes a sloped surface or ramp 1540A on a leading edge of the dimple 1540. To install the locker 1528, the locker 1528 is aligned to receive the tab 1530A in the cavity 1536. The ramp 1540A of the dimple 1540 is brought into contact with the tab 1530A and, as sufficient force in the negative Y direction is applied to the locker 1528, the ramp 1540A causes the dimple 1540, and therefore the flexible finger 1538, to deflect or flex and allow the tab 1530A to enter the cavity 1536 until the dimple 1540 reaches the through hole 1532A. When the dimple 1540 is aligned to the through hole 1532A, the flexible finger 1538 unflexes, causing the dimple 1540 to enter the through hole 1532A and engage the tab 1530. The locker 1528 may be removed by using a tool to deflect the dimple 1540 and flexible finger 1538 downward to remove the dimple 1540 from the through hole 1532A and thereby disengage the locker 1528 from the tab 1530A, and then sliding the locker in the positive Y direction.

The location of the tab 1530A along the length of the strut 1512, the dimensions of the locker 1528, and/or other parameters may be selected such that, when the locker 1528 is attached to the tab 1530A after the reflector 1504 has been installed, the reflector 1504 is unable to move more than a first predetermined distance towards the tab 1530A, where a second predetermined distance towards the tab 1530A that is greater than the first predetermined distance may be the movement distance needed to remove the reflector 1504 from the solar energy system 1500. For example, the installed locker 1528 may prevent movement towards the tab 1530 of greater than 2 millimeters (mm), where 10 mm is needed to remove the reflector 1504.

The present invention may be embodied in other specific forms without departing from its spirit or essential characteristics. The described embodiments are to be considered in all respects only as illustrative and not restrictive. Unless context dictates otherwise, the various embodiments are not mutually exclusive with each other and may be combined in any desired combination. The scope of the invention is, therefore, indicated by the appended claims rather than by the foregoing description. All changes which come within the meaning and range of equivalency of the claims are to be embraced within their scope.

What is claimed is:

1. A solar energy system comprising:
   a plurality of photovoltaic modules, each oriented at a same angle relative to horizontal, wherein each of the photovoltaic modules comprises a frame having two upper extensions, including one upper extension extending from each of two upper corners of the photovoltaic module and having two lower extensions, including one lower extension extending from each of two lower corners of the photovoltaic module; and
   a racking assembly mechanically interconnecting the photovoltaic modules together, the racking assembly comprising:
       a plurality of rails arranged parallel to each other; and
       a plurality of fins coupled between the rails and the lower extensions of the photovoltaic modules; and
       a plurality of struts coupled between the fins and the upper extensions of the photovoltaic modules;
   wherein the system is devoid of structural support elements vertically between the plurality of rails and the photovoltaic modules except: 1 where the lower extensions of each of the photovoltaic modules are coupled to the plurality of rails through the plurality of fins, and 2 where the upper extensions of each of the photovoltaic modules are coupled to the plurality of rails through the plurality of struts;
   wherein the two upper extensions and the two lower extensions define a plane oriented at the angle relative to horizontal;
   wherein the frame along two edges has extensions in a direction normal to the plane defined by the two upper extensions and the two lower extensions; and
   wherein the extensions of the frame along the two edges have notches formed therein to receive a corresponding one of the two upper extensions or two lower extensions of another photovoltaic module when the photovoltaic modules are nestably stacked.

2. The solar energy system of claim 1, wherein each of the plurality of photovoltaic modules lacks any bypass diodes for photovoltaic cells within each of the plurality of photovoltaic modules.

3. The solar energy system of claim 1, wherein each of the photovoltaic modules has a linear power response with respect to illumination area of all photovoltaic cells of the corresponding photovoltaic module.

4. The solar energy system of claim 1, wherein the upper extensions define a slot within which is received a fastener that couples the upper extension to a the strut that supports the photovoltaic module at the angle.

5. The solar energy system of claim 4, wherein:
   each of the photovoltaic modules is substantially rectangular with two short edges and two long edges; and
   the extensions of the frame along the two edges are along the two long edges.

6. The solar energy system of claim 1, wherein the plurality of struts include a first strut paired with a second strut to support a first photovoltaic module, and the first strut paired with a third strut to support a second photovoltaic module adjacent to the first photovoltaic module.

7. The solar energy system of claim 6, wherein:
   the photovoltaic modules are arranged in module rows;
   the solar energy system further comprises a plurality of reflectors arranged in reflector rows interposed between the module rows;
   the reflectors are coupled to and supported by the struts such that each reflector is coupled to and supported by a different pair of struts;
   for each fin, two corresponding lower extensions, one from each of two adjacent photovoltaic modules, are coupled to the fin on opposing sides of a middle section of the fin and the corresponding strut is coupled to the fin on a side of an upper section of the fin, the upper section being vertically offset upwards from the middle section.

8. The solar energy system of claim 7, wherein each of the fins is thicker in the middle section than in the upper section, the racking assembly further comprising a pin mechanically coupling an upper end of each strut between two corresponding upper extensions, one from each of two adjacent photovoltaic modules.

9. The solar energy system of claim 8, wherein the solar energy system has a nonlinear resistive force versus displacement profile and tolerates surface unevenness of an installation surface up to a predetermined surface unevenness.

10. A solar energy system comprising:
   a plurality of photovoltaic modules arranged in module rows, each oriented substantially at a same angle relative to horizontal, wherein each of the photovoltaic modules comprises a frame having two upper extensions, including one upper extension extending from each of two upper corners of the photovoltaic module and having two lower extensions, including one lower extension extending from each of two lower corners of the photovoltaic module;
   a racking assembly mechanically interconnecting the photovoltaic modules together, the racking assembly comprising:
       a plurality of rails arranged parallel to each other;
       a plurality of fins coupled between the rails and the lower extensions of the photovoltaic modules; and
       a plurality of struts coupled between the fins and the upper extensions of the photovoltaic modules, the plurality of struts including a first strut paired with a second strut to support a first photovoltaic module, and the first strut paired with a third strut to support a second photovoltaic module adjacent to the first photovoltaic module; and
   a plurality of reflectors arranged in reflector rows interposed between the module rows, the reflectors coupled to and supported by the struts such that each reflector is coupled to and supported by a different pair of struts;

wherein:
for each fin, two corresponding lower extensions, one from each of two adjacent photovoltaic modules, are coupled to the fin on opposing sides of a middle section of the fin and the corresponding strut is coupled to the fin on a side of an upper section of the fin, the upper section being vertically offset upwards from the middle section;

each of the fins is thicker in the middle section than in the upper section, the racking assembly further comprising a pin mechanically coupling an upper end of each strut between two corresponding upper extensions, one from each of two adjacent photovoltaic modules; and for each fin, the side of the upper section is laterally offset from a reference plane centered between the opposing sides of the middle section such that a lower end of the corresponding strut coupled to the fin on the side of the upper section is nominally centered laterally between lower ends of the two corresponding adjacent photovoltaic modules having corresponding lower extensions coupled to the fin on the opposing sides of the middle section.

11. A solar energy system comprising:
a plurality of photovoltaic modules arranged in module rows, each oriented substantially at a same angle relative to horizontal, wherein each of the photovoltaic modules comprises a frame having two upper extensions, including one upper extension extending from each of two upper corners of the photovoltaic module and having two lower extensions, including one lower extension extending from each of two lower corners of the photovoltaic module;

a racking assembly mechanically interconnecting the photovoltaic modules together, the racking assembly comprising:
a plurality of rails arranged parallel to each other;
a plurality of fins coupled between the rails and the lower extensions of the photovoltaic modules; and
a plurality of struts coupled between the fins and the upper extensions of the photovoltaic modules, the plurality of struts including a first strut paired with a second strut to support a first photovoltaic module, and the first strut paired with a third strut to support a second photovoltaic module adjacent to the first photovoltaic module; and a plurality of reflectors arranged in reflector rows interposed between the module rows, the reflectors coupled to and supported by the struts such that each reflector is coupled to and supported by a different pair of struts;
wherein:
for each fin, two corresponding lower extensions, one from each of two adjacent photovoltaic modules, are coupled to the fin on opposing sides of a middle section of the fin and the corresponding strut is coupled to the fin on a side of an upper section of the fin, the upper section being vertically offset upwards from the middle section; and each strut comprises a first flange and a second flange on opposite sides and at least partially along a length of the strut, the first flange supporting an edge of one of the reflectors and the second flange supporting an edge of an adjacent reflector.

12. The solar energy system of claim 11, wherein each strut further comprises a ridge at least partially along a length of the strut, the first and second flange extending away from the strut on opposite sides of the ridge, the ridge preventing the corresponding edge of the corresponding reflector supported by the first flange from contacting the corresponding edge of the corresponding adjacent reflector supported by the second flange.

13. The solar energy system of claim 11, further comprising, for each strut, a first compliant material disposed between the first flange and a back surface of the corresponding edge of the corresponding reflector and a second compliant material disposed between the second flange and a back surface of the corresponding edge of the corresponding adjacent reflector.

14. The solar energy system of claim 11, wherein:
each of the rails comprises an upper surface and two lips along a length of the rail that extend upward from the upper surface and partially overhang the upper surface, the upper surface and the lips defining a channel;
each of the fins comprises a base having a shape that is complementary to a shape of the channel;
the solar energy system further comprises a plurality of bolts; and
when the base of a fin is inserted within the channel of a rail, a corresponding bolt is threadably engaged in a hole defined in the base to bias the base of the fin against the overhanging lips of the rail.

15. The solar energy system of claim 6, further comprising a plurality of pads disposed between the rails and an installation surface, each of the rails including one or more features that engage a corresponding pad and prevent translational movement of the rails with respect to the pads in a first dimension.

16. The solar energy system of claim 15, further comprising a plurality of detaining members disposed between the rails and the pads and configured to prevent translational movement of the rails with respect to the pads in a second dimension orthogonal to the first dimension.

17. The solar energy system of claim 6, wherein each of the rails has a substantially triangular cross-sectional shape, a substantially trapezoidal cross-sectional shape, or a substantially circular cross-sectional shape.

18. The solar energy system of claim 6, wherein the rails are arranged in parallel rows, each row of rails including two or more rails arranged end-to-end, the solar energy system further comprising a plurality of tension stiffeners mechanically coupling each row of rails to an adjacent row of rails, each of the tension stiffeners being arranged diagonally to the parallel rows of rails.

19. The solar energy system of claim 1, wherein:
the photovoltaic modules are arranged in module rows;
the solar energy system further comprises a plurality of reflectors arranged in reflector rows interposed between the module rows;
each of the photovoltaic modules generally faces south if installed in the Northern Hemisphere or generally faces north if installed in the Southern Hemisphere;
each of the reflectors generally faces north if installed in the Northern Hemisphere or generally faces south if installed in the Southern Hemisphere; and
each of the reflectors is oriented substantially at a same second angle relative to horizontal.

20. The solar energy system of claim 19, wherein each of the reflectors comprises:
a glass substrate or a glass superstrate;
a wavelength selective reflective layer; and
an adhesive layer between the wavelength selective reflective layer and the glass substrate or glass superstrate.

21. The solar energy system of claim 19, wherein each of the reflectors has patterning that affects a direction in which incident light is reflected from the corresponding reflector, wherein the patterning includes one of a one-dimensional vertical or horizontal pattern, or a two-dimensional pattern.

22. The solar energy system of claim 21, wherein each of the reflectors has a transmittance spectrum and a reflectance spectrum, the patterning being configured to evenly distribute transmitted light beneath the solar energy system.

23. The solar energy system of claim 19, wherein each of the reflectors has a vertical patterning such that each light ray reflected by a corresponding reflector has an eastward or westward velocity component after being reflected that is altered compared to before being reflected.

24. The solar energy system of claim 19, wherein the plurality of struts include a different pair of struts supporting each photovoltaic module at the angle, the solar energy system further comprising a plurality of stiffeners including, for each reflector:
an upper stiffener coupled between a corresponding pair of struts, the upper stiffener supporting an upper edge of the corresponding reflector; and
a lower stiffener coupled between the corresponding pair of struts, the lower stiffener supporting a lower edge of the corresponding reflector.

25. The solar energy system of claim 24, wherein:
each reflector includes a first side edge and an opposing second side edge, the upper edge, first side edge, lower edge, and second side edge defining a perimeter of the reflector; and
for each reflector, the upper stiffener and the lower stiffener each extend beyond the first side edge and the second side edge before being coupled to a corresponding strut in the corresponding pair of struts.

26. The solar energy system of claim 24, wherein:
each reflector and corresponding upper stiffener and lower stiffener forms an assembly such that the solar energy system has a plurality of assemblies;
each assembly has a substantially same thickness per assembly;
the assemblies have a nestable geometry such that the assemblies can be stacked in a stack occupying a first volume that is three to six times smaller than a second volume, the second volume being proportional to a number of assemblies times the thickness per assembly; and
in the stack, each assembly contacts an adjacent assembly only through corresponding upper stiffeners and lower stiffeners.

27. The solar energy system of claim 19, further comprising a plurality of lockers configured to lock the reflectors into the solar energy system.

28. The solar energy system of claim 19, further comprising one or more interconnection devices electrically coupled to the plurality of photovoltaic modules, the one or more interconnection devices being disposed substantially beneath one or more of the photovoltaic modules and/or one or more of the reflectors.

29. The solar energy system of claim 10, wherein the solar energy system defines a continuous area within a perimeter of the solar energy system, the solar energy system is configured to capture at the plurality of photovoltaic modules substantially all light incoming towards the continuous area over an entire season, and substantially all light incoming towards the continuous area over an entire season comprises 80%-95% of all light incoming towards the continuous area over the entire season.

* * * * *